United States Patent
Tanaka et al.

(10) Patent No.: US 6,674,093 B1
(45) Date of Patent: Jan. 6, 2004

(54) ACTIVE MATRIX SUBSTRATE AND MANUFACTURING METHOD THEREFOR

(75) Inventors: Hiroaki Tanaka, Tokyo (JP); Hirotaka Yamaguchi, Tokyo (JP); Wakahiko Kaneko, Tokyo (JP); Michiaki Sakamoto, Tokyo (JP); Satoshi Ihida, Tokyo (JP); Takasuke Hayase, Tokyo (JP); Tae Yoshikawa, Tokyo (JP); Hiroshi Kanou, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 437 days.

(21) Appl. No.: 09/695,321

(22) Filed: Oct. 25, 2000

(30) Foreign Application Priority Data

Oct. 26, 1999 (JP) .............................. 11-304683
Oct. 6, 2000 (JP) ...................... 2000-308262

(51) Int. Cl.⁷ ............................................. H01L 29/786
(52) U.S. Cl. ........................................... 257/72; 349/42
(58) Field of Search ............................. 257/72; 349/42

(56) References Cited

U.S. PATENT DOCUMENTS 5,926,235 A * 7/1999 Han et al. ...................... 349/43
5,926,242 A * 7/1999 Kataoka et al. ............. 349/117
6,088,072 A * 7/2000 Lee .............................. 349/39

FOREIGN PATENT DOCUMENTS

| JP | 5-203988 | 8/1993 |
|----|----------|--------|
| JP | 10-68971 | 3/1998 |
| KR | 94-7581 | 4/1994 |

\* cited by examiner

*Primary Examiner*—Jerome Jackson
(74) *Attorney, Agent, or Firm*—McGinn & Gibb, PLLC

(57) ABSTRACT

An active matrix substrate of a channel protection type having a gate electrode, a drain electrode and a pixel electrode isolated from one another from layer to layer by insulating films. The active matrix substrate is to be prepared by four masks. A gate electrode layer, a gate insulating film and an a-Si layer are processed to the same shape on a transparent insulating substrate to form a gate electrode layer (102 of FIG. 6) and a TFF area. A drain electrode layer (106 of FIG. 6) is formed by a first passivation film (105 of FIG. 6) via a first passivation film (105 of FIG. 6) formed as an upper layer. In a second passivation film (107 of FIG. 6) formed above it are bored an opening through the first and second passivation films and an opening through the second passivation film. A wiring connection layer is formed by ITO (108 of FIG. 6) provided as an uppermost layer. A storage capacitance unit, comprised of the first and second passivation films sandwiched between the gate electrode and an electrode layer formed as a co-layer with respect to the gate electrode, is provided in the pixel electrode.

20 Claims, 63 Drawing Sheets

US 6,674,093 B1

ACTIVE MATRIX SUBSTRATE AND MANUFACTURING METHOD THEREFOR

STATUS RELATING TO THE EARLIER APPLICATIONS

This application is based on the earlier Japanese patent applications No. 11-304683 (filed on Oct. 26, 1999) and No. 2000-308262 (filed on Oct. 6, 2000), the priority thereof under the Paris Convention is claimed. The entire disclosures thereof are incorporated herein by reference thereto.

FIELD OF THE INVENTION

This invention relates generally to an active matrix liquid crystal display device, particularly, to an active matrix substrate and a manufacturing method therefor. More particularly, it relates to a channel protection active matrix substrate in which a gate electrode, a drain electrode and a pixel electrode are isolated from layer to layer and the pixel electrode is formed as the topmost layer, and a manufacturing method therefor.

BACKGROUND OF THE INVENTION

An active matrix liquid crystal display device, employing an active element, such as a thin-film transistor, is thin in thickness and lightweight, and is utilized as a flat panel display of a high picture quality. For a liquid crystal display device, a vertical electrical field system (typically formed as a twisted nematic or TN system) in which a liquid crystal is sandwiched between two substrates carrying transparent electrodes and is driven by a voltage applied across these electrodes, and a lateral (in-plane) electrical field system in which a liquid crystal layer is sandwiched between and driven by comb-shaped pixel electrodes in which the voltage is applied generally along the plane of the electrodes. In both systems, researches are conducted towards simplifying the production process of an active matrix substrate for lowering the production cost. On the other hand, the opening ratio needs to be raised for achieving a high-grade picture. To this end, such a method is used in which a transparent electrode (indium tin oxide or ITO) layer and a drain layer are isolated on the layer basis and the transparent electrode layer is formed as a topmost layer.

In the TN system, a liquid crystal is sandwiched between two substrates each of which is provided with a transparent electrode. In the lateral electrical field system, also called the in-plane switching (IPS) system, a liquid crystal layer is sandwiched between two substrates, each of which is provided with the transparent electrode, with the liquid crystal being driven by a voltage applied generally in-plane across a comb-shaped pixel electrode and a common electrode formed on one of the substrates.

As a manufacturing method in which the transparent electrode layer is formed as the topmost layer to simplify and diminish the number of steps of the production process, a technique shown in JP Patent Kokai JP-A-10-68971 is explained with reference to FIG. 62, which is a cross-sectional view for schematically showing the processes of the manufacturing method for an active matrix substrate for use in a TN system liquid crystal display device.

In general, the active matrix substrate of the TN system is comprised of a gate wiring lines and a drain wiring lines extending in a direction perpendicular to each other, a pixel electrode defined in an area surrounded by these wiring lines, and a thin-film transistor (TFT) formed in the vicinity of the intersection of the two wiring lines. On the surface of the TFT is formed a channel protection film for assuring the performance. On the TFT and the pixel electrode on the active matrix substrate, there is formed an orientation film for orienting the liquid crystal in the pre-set direction. A liquid crystal is sealed between the active matrix substrate and a counter substrate carrying a color filter, a common electrode and an orientation film to complete the liquid crystal device.

In this active matrix substrate, a gate electrode metal film of, for example, Cr, is deposited on the transparent insulating substrate 101, a resist pattern is formed, using a first photomask, and the exposed portion of Cr is etched to form a gate wiring and a gate electrode layer 102 branched from the gate wiring, as shown in FIG. 62(a).

Then, a gate insulating film 103 of SiNx, an a-Si layer 104, a n+ type a-Si layer 109, as an ohmic contact layer, and a drain electrode layer 106 of e.g., Cr, are deposited in succession, after which an unneeded drain electrode layer 106 is selectively etched, in order to form an opening in the channel area of the a-Si layer 104 and a preset wiring pattern, as shown in FIG. 62(b). Then, using the drain electrode layer 106 as an etching mask, the n+type a-Si layer 109 is etched to form an ohmic contact layer.

Then, a second passivation film 107, such as SiNx, is deposited on the entire substrate surface, and the preset areas of the second passivation film 107, a-Si layer 104 and the gate insulating film 103 are collectively etched using a third photomask, to separate the thin-film transistor area, as shown in FIG. 62(c).

Then, a contact hole for exposing a source/drain electrode areas is formed, using a fourth photomask, ITO film 108 is deposited on the entire surface of the substrate 101, and the ITO film 108 in the preset area is removed, using a fifth photomask, to form a pixel electrode connected to the source electrode, to complete the production of the active matrix substrate, as shown in FIG. 62(d).

It is noted that a contact hole exposing the source/drain electrode areas is formed in the second passivation film 107.

In this conventional active matrix substrate, the ITO film 108 is not provided on the same layer as the source/drain electrode layer 106, and is insulated and separated by the second passivation film 107. So, for insulation and isolation of the ITO film 108 from the drain electrode layer 106, these are not in need of being separated from each other laterally relative to a normal line drawn to the active matrix substrate, and hence these can be made to approach extremely closely to or even overlap with each other. Thus, the black matrix for shielding the uncontrolled back light straying from a gap produced when the ITO film 108 and the source/drain electrode layer 106 are separated from each other can be diminished to elevate the opening ratio. This accounts for insulation and separation of the ITO film 108 and the drain electrode layer 106 from each other by the second passivation film 107.

It is noted that the ITO film 108 is insulated and separated from each other by the passivation film 107. In this conventional method for preparing the active matrix substrate, the active matrix substrate can be produced by five masks as the transparent electrode layer is formed as the uppermost layer.

SUMMARY OF THE DISCLOSURE

Various problems have been encountered in the course of investigations toward the present invention.

In the method, shown in the above-mentioned Publication, the gate electrode, drain electrode and the pixel electrode of ITO film are isolated on the layer basis by five masks to produce an active matrix substrate carrying a topmost ITO film. There is, however, presented a problem that, since the second passivation film 107, a-Si layer 104 and the gate insulating film 103 are etched in a lump at the process step of FIG. 62(c), the lateral surface of the a-Si layer 104 is exposed without being covered by the second passivation film 107.

If the lateral surface of the a-Si layer 104 is exposed, it is caused to contact the ITO film 108 formed subsequently. Moreover, if the active matrix substrate is configured as a liquid crystal device, the liquid crystal material directly contacts the a-Si layer 104.

If the ITO film 108 contacts the lateral surface of the a-Si layer 104, not covered by the pass i vat ion film, the metal as a constituting component of the ITO film 108 is diffused as impurity into the inside of the a-Si layer 104, thereby appreciably deteriorating the performance of the thin-film transistor. For evading this problem, the passivation film can again be deposited after the step of FIG. 62(c) and before the step of FIG. 62(d) to protect the lateral side of the a-Si layer 104 with the passivation film. There is, however, raised a problem that deposition of the passivation film a second time increases the number of process steps.

On the other hand, if the ITO film 108 contacts the sidewall section of the a-Si layer 104 not covered by the passivation film, impurities in the liquid crystal material is similarly diffused into the a-Si layer 104 to produce a similar phenomenon.

In general there is much to be desired in the conventional art and it is desired to provide a novel device and method.

In view of the above-mentioned problem, in an aspect of the present invention, it is an object thereof to provide an active matrix substrate in which an active matrix substrate of the channel protection type having a gate electrode, a drain electrode and a pixel electrode isolated from one another on the layer basis by insulating films can be formed by four masks, and a manufacturing method for the active matrix substrate.

In another aspect of the present invention, it is another object thereof to provide a channel protection type active matrix substrate in which a gate electrode, a drain electrode and a pixel electrode are separated from one another on the layer basis by insulating films to assure superior long-term reliability, and a manufacturing method therefor.

Other aspects and objects will become apparent by the entire disclosure.

According to the present invention, there is provided in its first aspect, an active matrix substrate wherein a gate electrode layer, a gate insulating layer and an amorphous silicon semiconductor layer are deposited in a substantially stacked (or laminate) fashion on a transparent insulating substrate, viewed from a direction normal to the transparent insulating substrate, to form a layered (stacked laminate) structure, including a gate electrode, a gate wiring (generally in the form of lines) and a thin-film transistor area. The active matrix substrate includes: a drain wiring formed on a first passivation film disposed on the substrate so as to cover the layered (stacked laminate) structure. There is a second passivation film formed as an overlying layer above the drain wiring and the first passivation film. There is also formed source/drain openings passing through the first passivation film and the second passivation film to reach a amorphous silicon semiconductor layer. There is also an opening passing through the second passivation film to reach the drain wiring connection. Further, a wiring (connection) layer extending through the aforementioned opening and/or openings is formed, for establishing connection, by a pixel electrode film disposed on the second passivation film.

The present invention also provides, in its second aspect, a vertical electrical field type active matrix substrate wherein a gate electrode layer, a gate insulating layer and an amorphous silicon semiconductor layer are deposited in a substantially stacked fashion on a transparent insulating substrate, viewed from the direction normal to the transparent insulating substrate, to form a layered structure, including a gate electrode, a gate wiring (generally of lines) and a thin-film transistor area. The substrate includes a drain wiring (generally of lines) formed on a first passivation film (disposed on the substrate and) covering the layered structure. There is a second passivation film formed as an overlying layer above the drain wiring and the first passivation film. There are also formed source/drain openings passing through the first passivation film and the second passivation film to reach the amorphous silicon semiconductor layer. There is also an opening passing through the second passivation film to reach the drain wiring. Further, a wiring layer (connection) connecting (extending) through the drain opening to the drain wiring and a pixel electrode connected (extending) to the source opening are formed by a pixel electrode film disposed on the second passivation film. The pixel electrode is provided with a storage capacitance unit, comprised of the first and second passivation films sandwiched between the pixel electrode and an electrode layer formed as a co-layer as the gate electrode.

Generally, the substrates of the present invention are used installed and assembled in an active matrix liquid crystal display device.

The present invention also provides, in its third aspect, a novel method for producing an active matrix substrate. The method comprises the steps of:

(a) layering a gate electrode layer, a gate insulating film and an a-Si layer in this order on a transparent insulating substrate and forming a gate electrode, a gate wiring and a thin-film transistor area, using a first mask, (b) depositing a first passivation film and a drain electrode layer on the gate electrode, and removing the drain electrode layer lying in a pre-set area, using a second mask, to form a drain wiring, (c) depositing a second passivation film above (as an overlying layer of) the drain wiring, forming openings at preset positions in the amorphous silicon semiconductor layer passing through the first and second passivation films for connection to the source/drain electrodes (i.e. source electrode/drain electrode), an opening, above the drain wiring, passing through the second passivation film, and (d) depositing a transparent electrode layer as an overlying layer on the second passivation film and on (and within) the opening(s), to form a drain wiring connection connecting to an amorphous Silicon layer exposed in the opening for the drain electrode, using a fourth mask, and connecting the amorphous silicon layer exposed in the opening for the source electrode to a pixel electrode comprised of the transparent electrode layer.

Other aspects and features of the present invention are disclosed in the appended claims, the entire disclosure thereof being incorporated herein by explicit reference thereto.

BRIEF DESCRIPTION OF THE INVENTION

FIGS. 6(a)–6(d) are cross-sectional views showing the manufacturing process for an active matrix substrate according to the first embodiment of the present invention.

FIGS. 7(a)–7(d) are cross-sectional views showing the structure of a gate terminal unit according to the first embodiment of the present invention.

FIGS. 8(a)–8(d) are cross-sectional views showing the structure of a drain terminal unit according to the first embodiment of the present invention.

FIGS. 9(a)–9(d) are cross-sectional views showing the structure of a storage capacitor unit according to the first embodiment of the present invention.

FIGS 10(a)–10(d) are cross-sectional views showing the manufacturing process for an active matrix substrate according to a second embodiment of the present invention.

Figure 11:
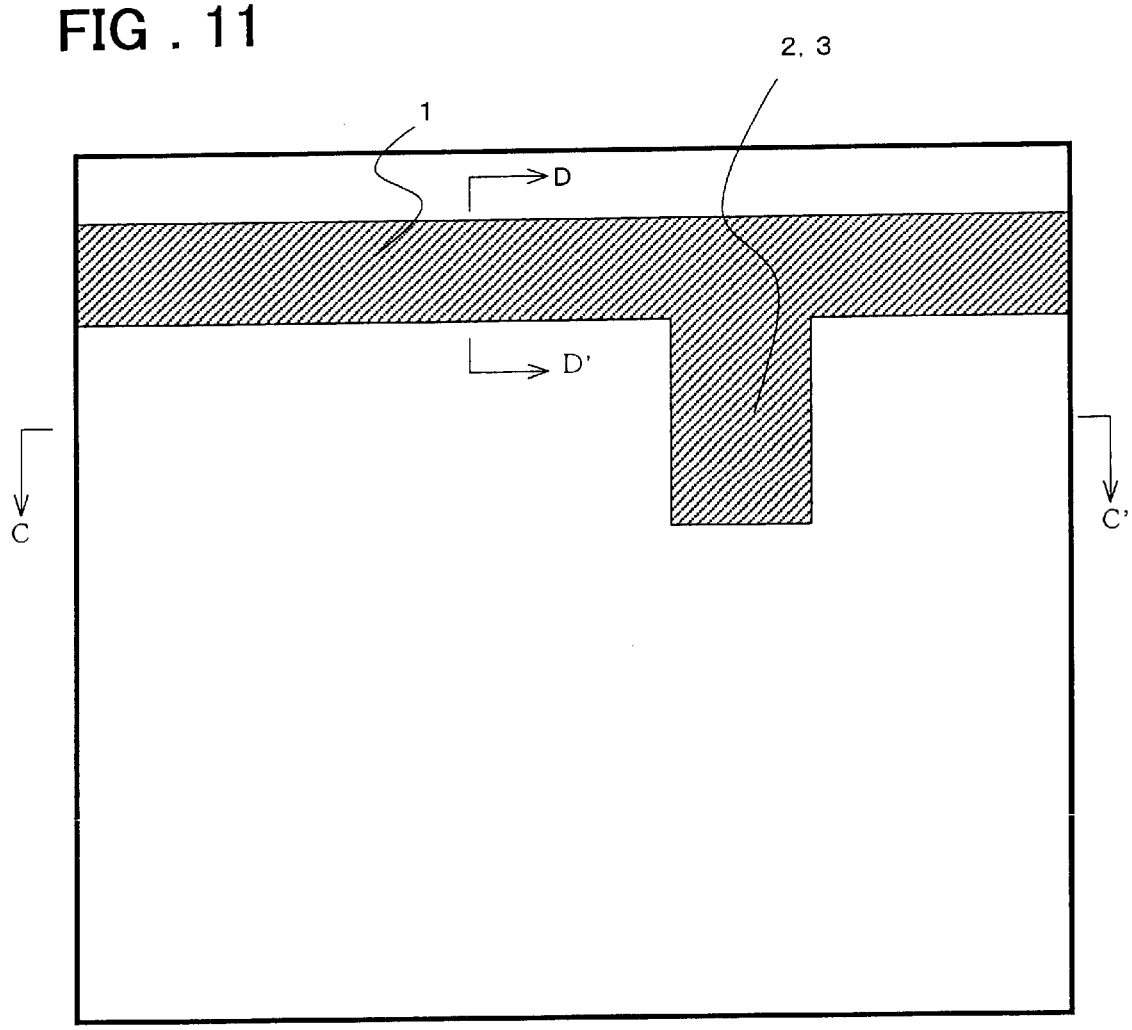

FIG. 11 is a first top plan view schematically showing the manufacturing process of an active matrix substrate according to a third embodiment of the present invention.

Figure 12:
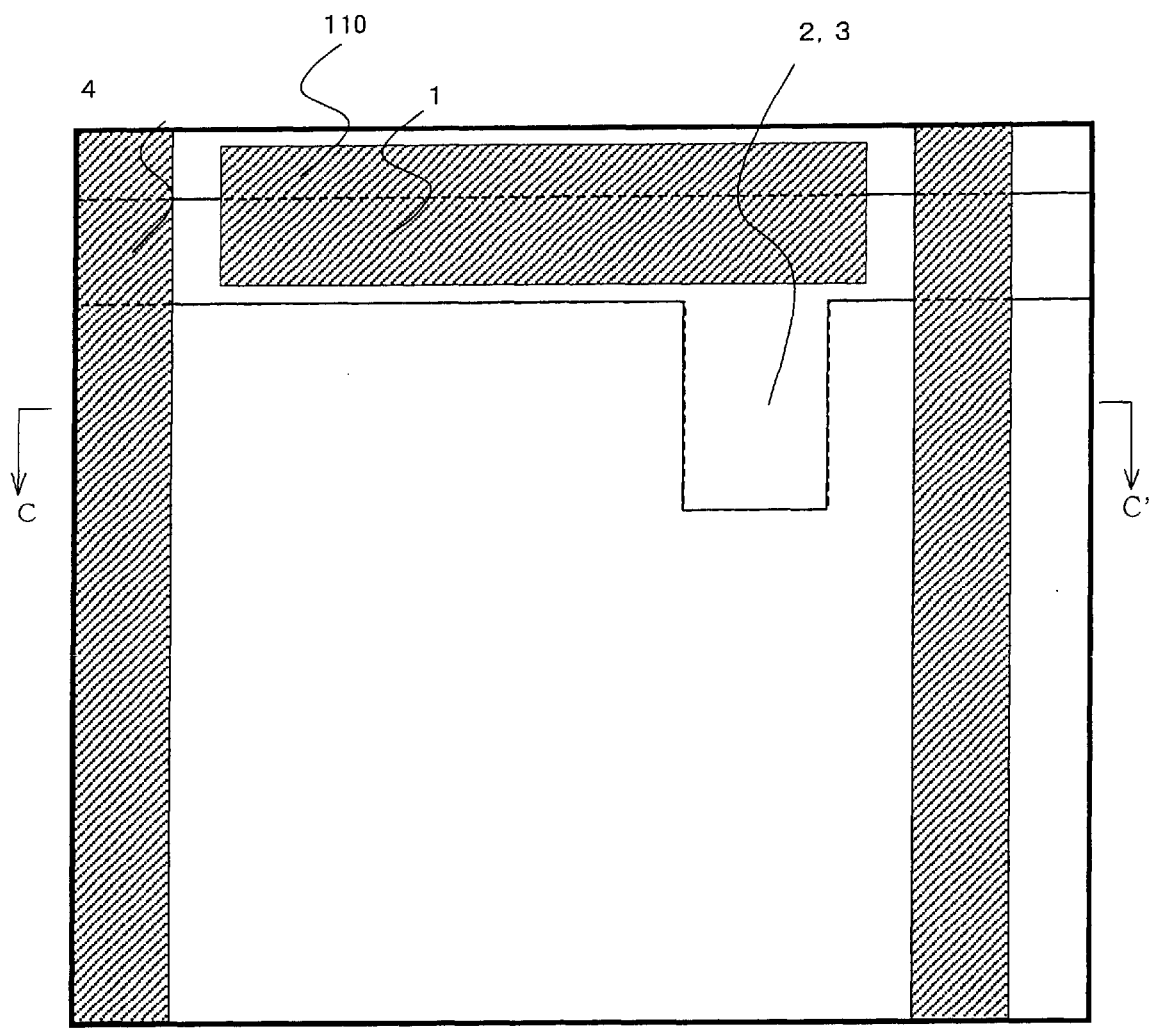

FIG. 12 is a second top plan view schematically showing the manufacturing process of the active matrix substrate according to the third embodiment of the present invention.

Figure 13:
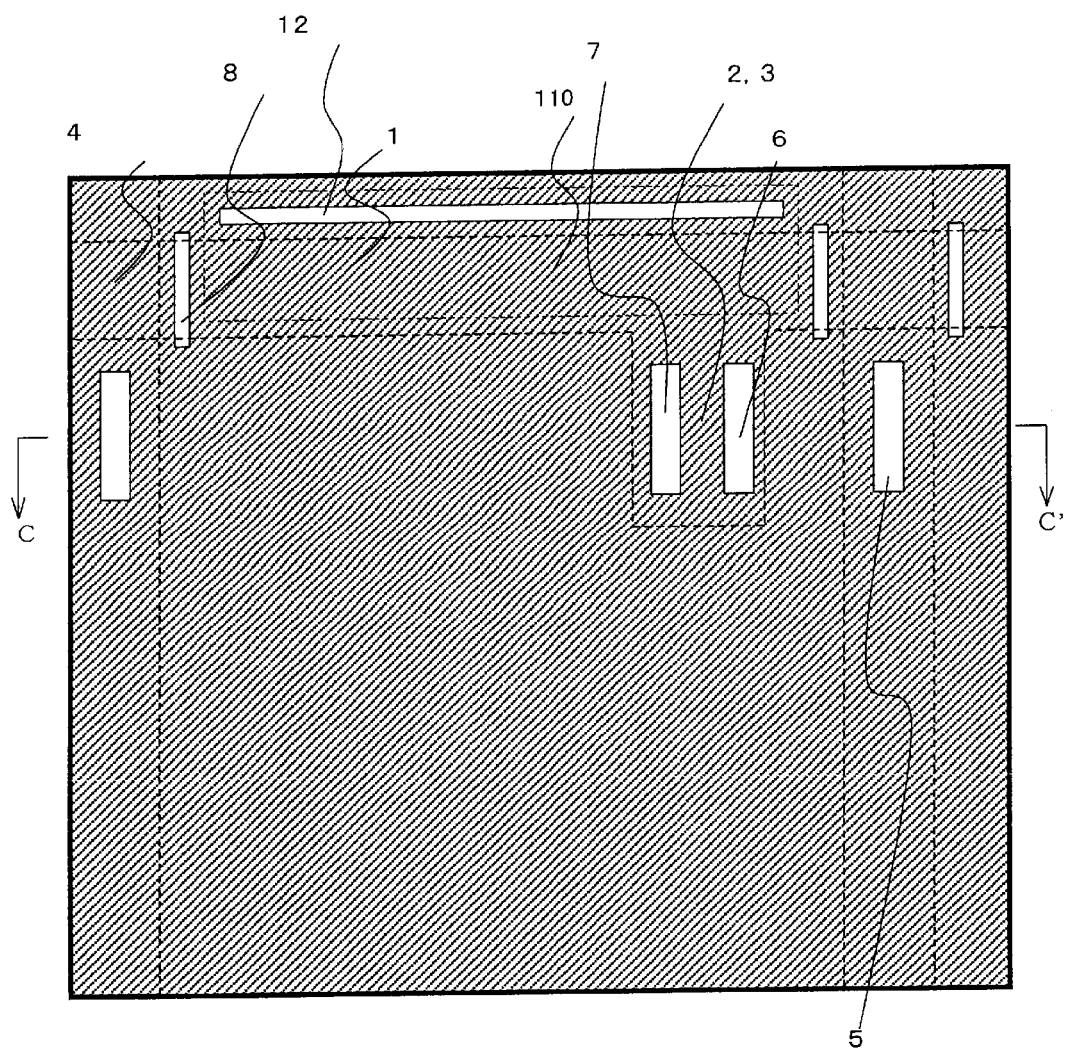

FIG. 13 is a third top plan view schematically showing the manufacturing process of the active matrix substrate according to the third embodiment of the present invention.

Figure 14:
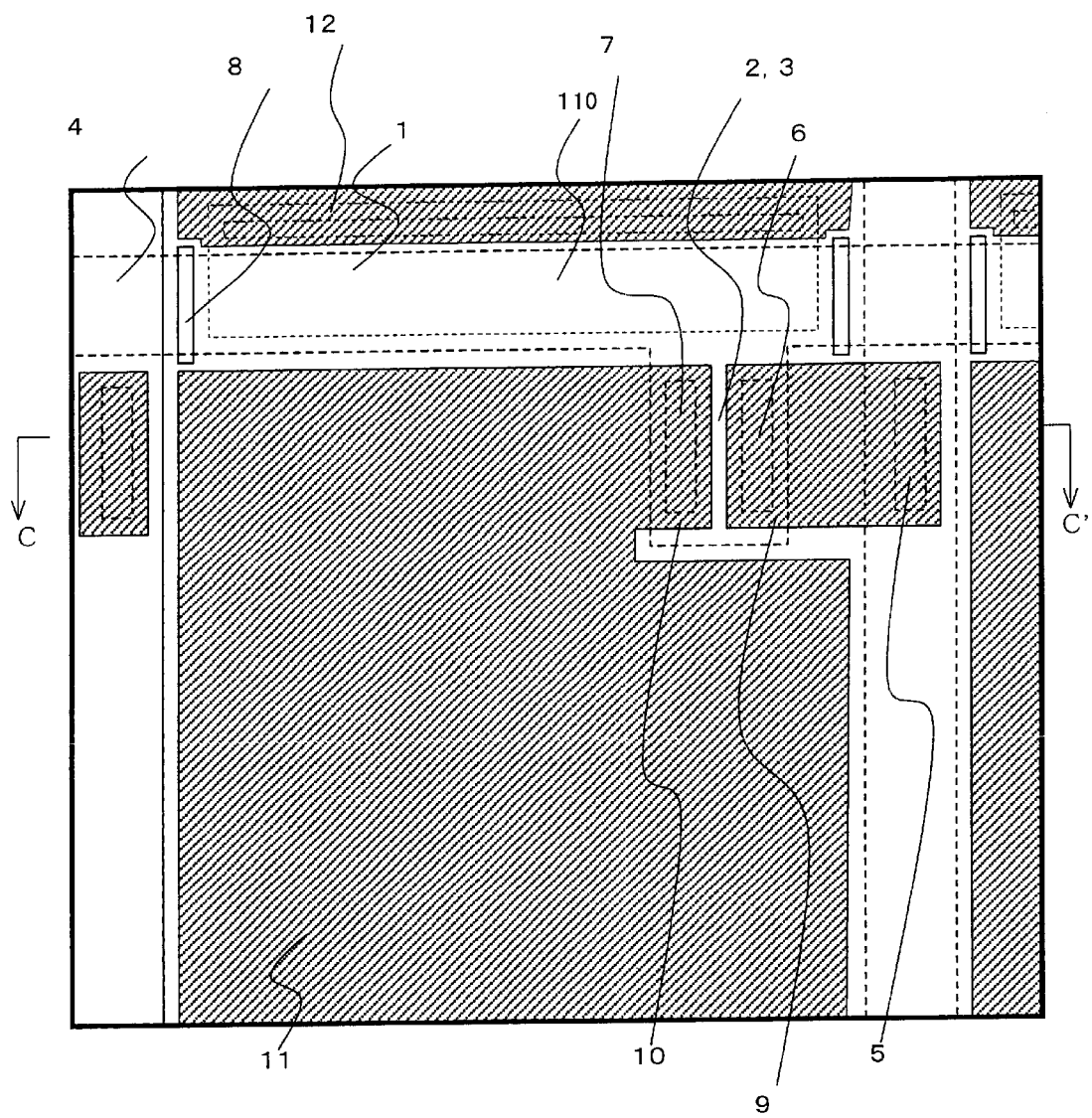

FIG. 14 is a fourth top plan view schematically showing the manufacturing process of the active matrix substrate according to the third embodiment of the present invention.

FIGS. 15(a)–15(d) are process diagrams schematically showing the manufacturing process for the active matrix substrate of the third embodiment of the present invention, shown in a cross-section taken along line C–C'.

FIGS. 16(a)–16(d) are process diagrams schematically showing the manufacturing process for a storage capacitor of the active matrix substrate of the third embodiment of the present invention, shown in a cross-section taken along line D–D'.

Figure 17:
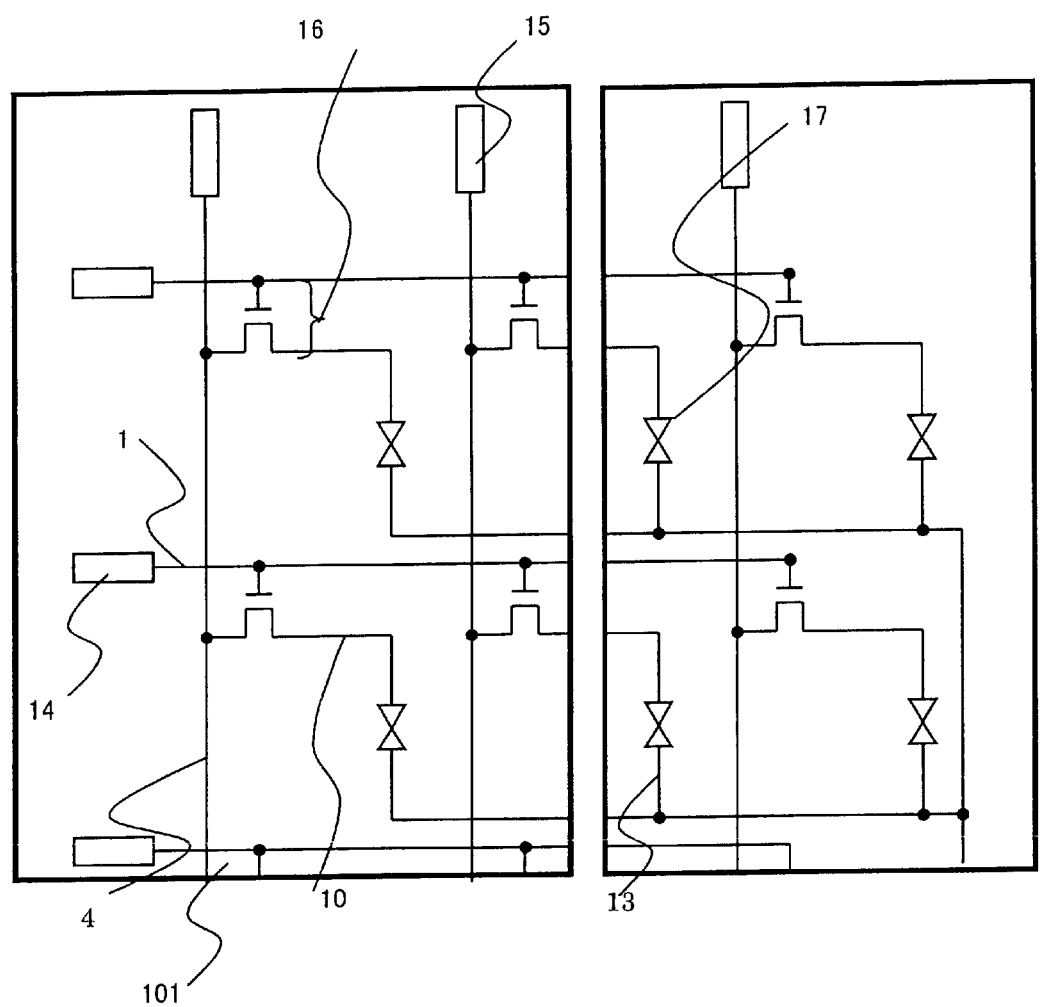

FIG. 17 is a circuit diagram of an active matrix substrate for a liquid crystal display device of the IP system according to a fourth embodiment of the present invention.

Figure 18:
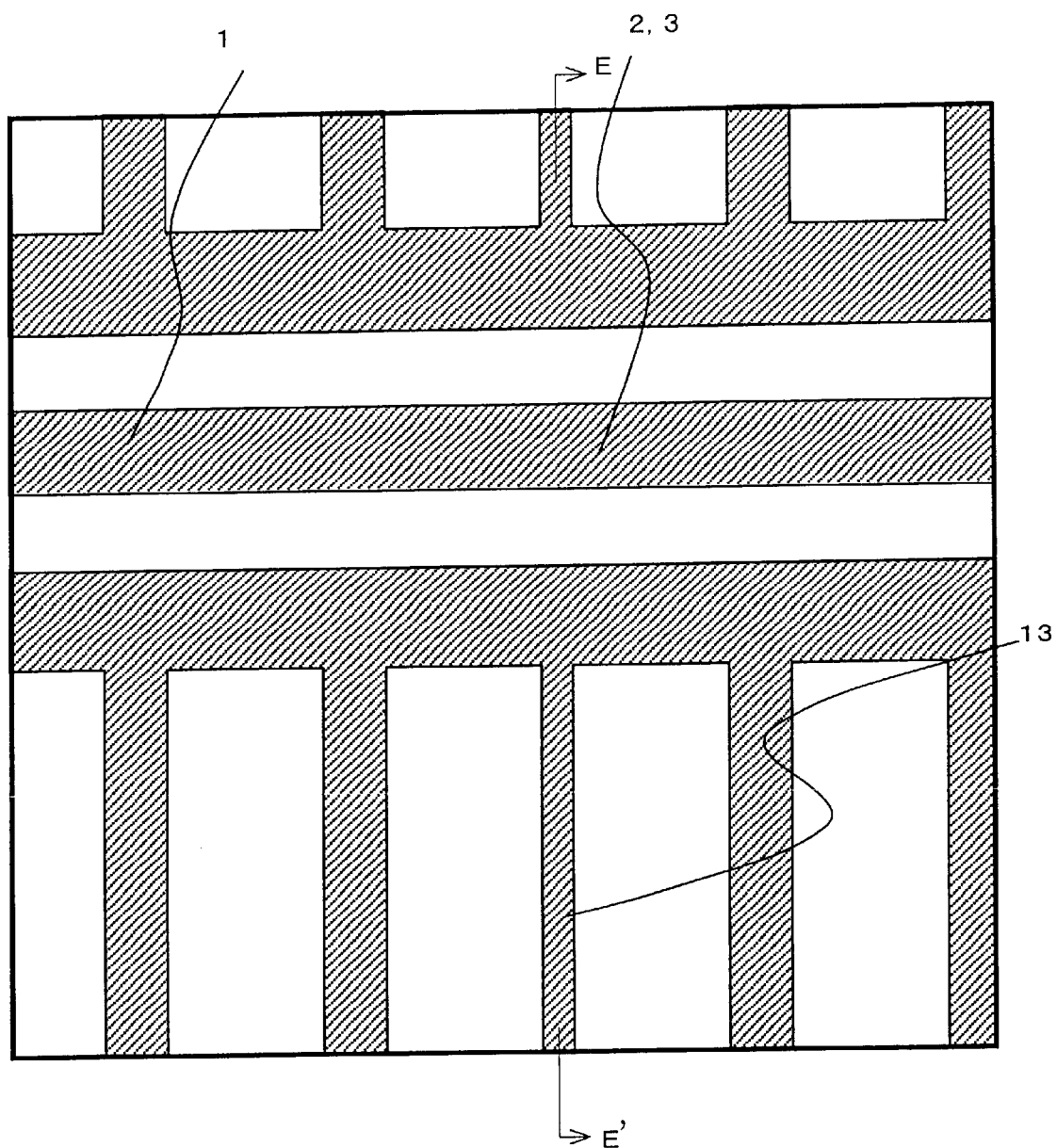

FIG. 18 is a first top plan view schematically showing the manufacturing process for an active matrix substrate according to the fourth embodiment of the present invention.

Figure 19:
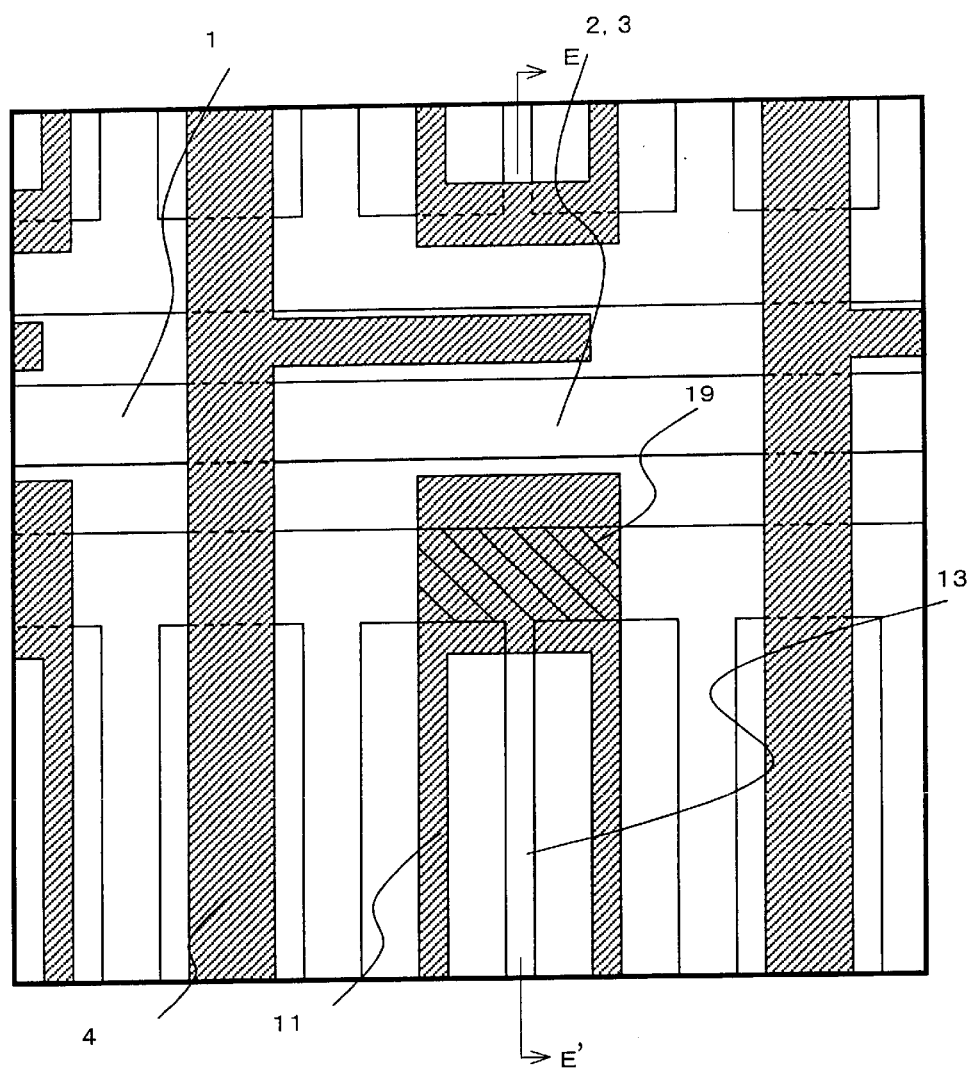

FIG. 19 is a second top plan view schematically showing the manufacturing process for an active matrix substrate according to the fourth embodiment of the present invention.

Figure 20:
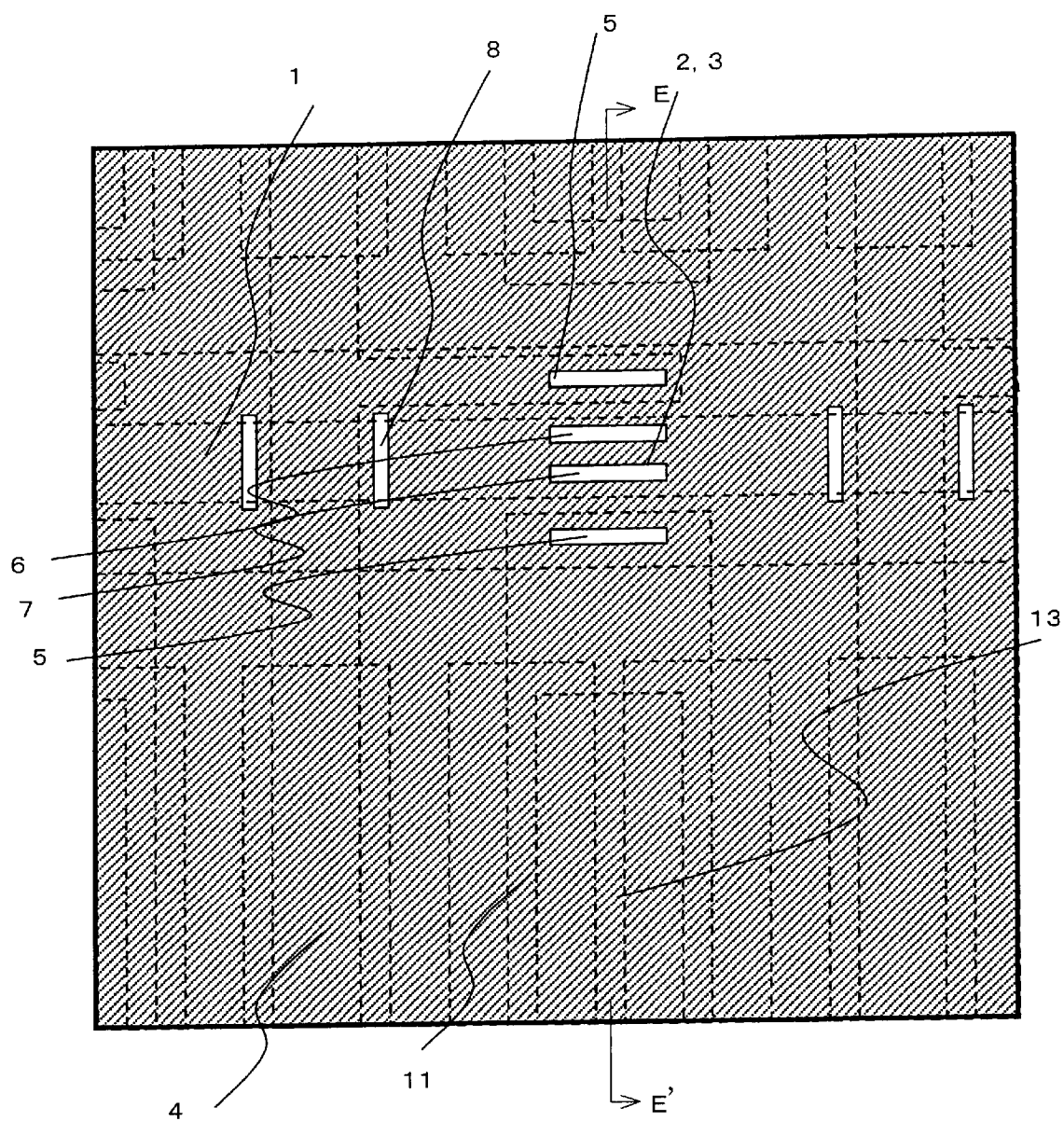

FIG. 20 is a third top plan view schematically showing the manufacturing process for an active matrix substrate according to the fourth embodiment of the present invention.

Figure 21:
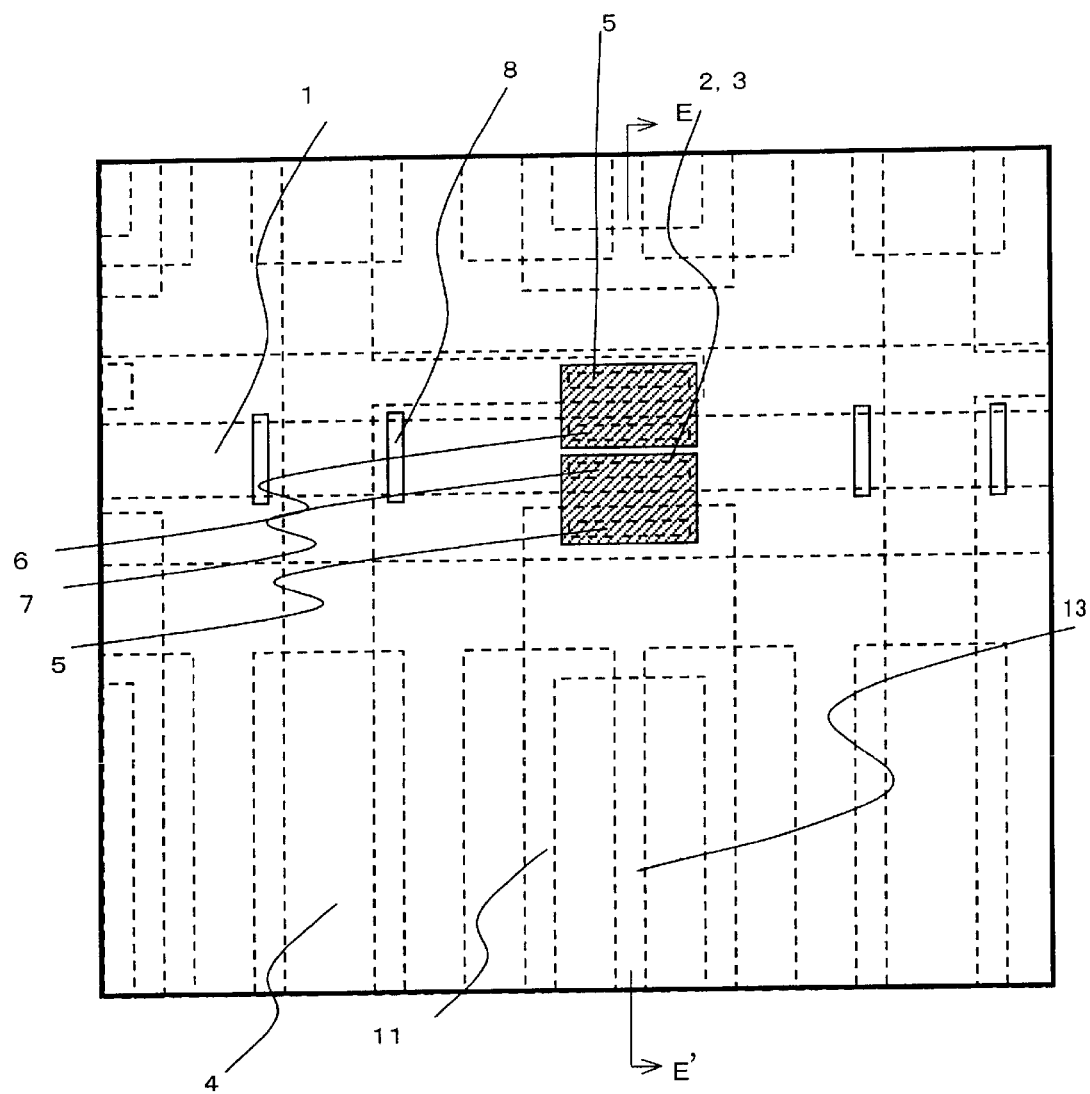

FIG. 21 is a fourth top plan view schematically showing the manufacturing process for an active matrix substrate according to the fourth embodiment of the present invention.

FIGS. 22(a)–22(d) are process diagrams schematically showing the manufacturing process for an active matrix substrate according to the fourth embodiment of the present invention, in a cross-section taken along line E–E'.

Figure 23:
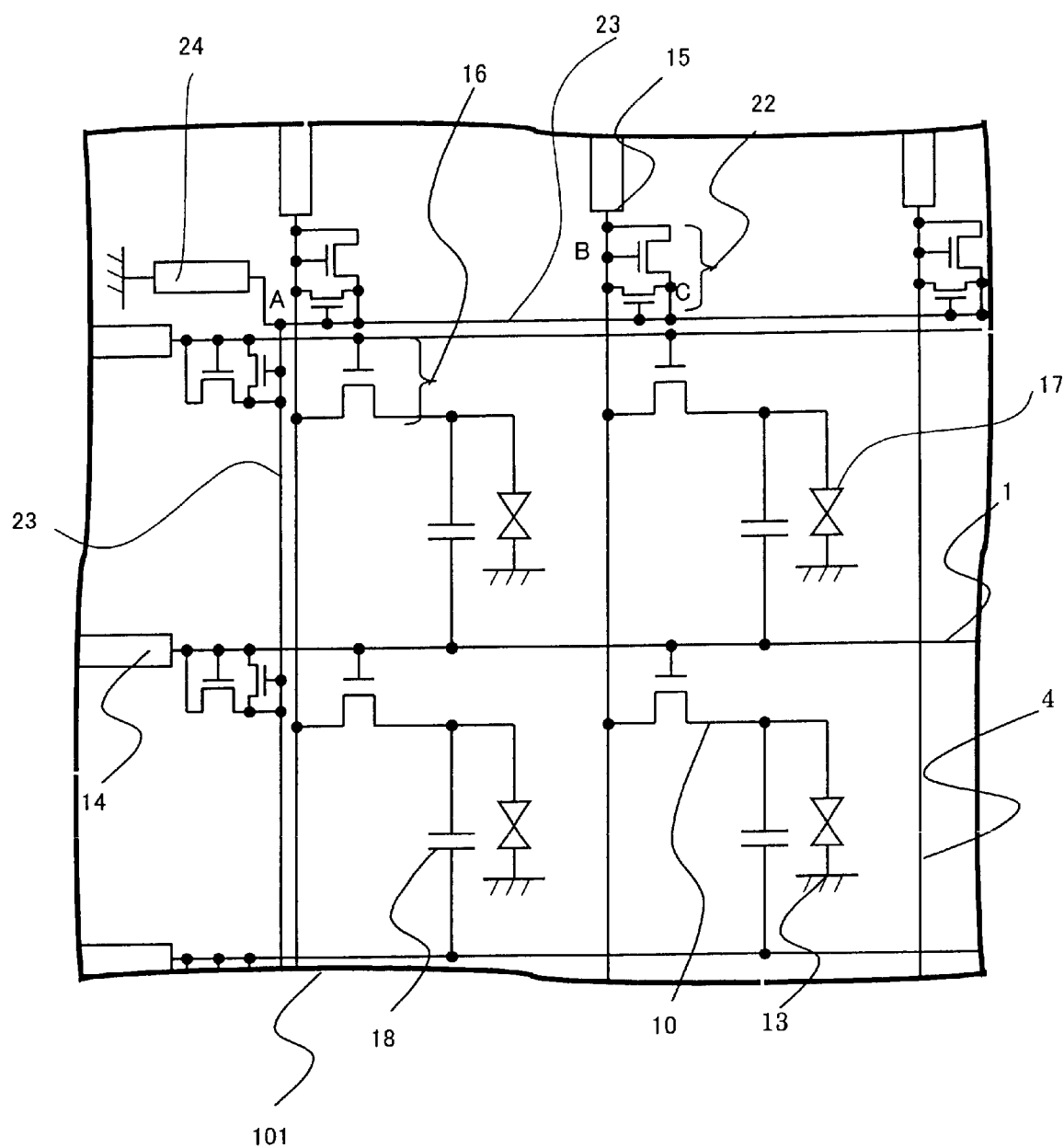

FIG. 23 is a circuit diagram of an active matrix substrate for a liquid crystal display device of the TN system according to a fifth embodiment of the present invention.

Figure 24:
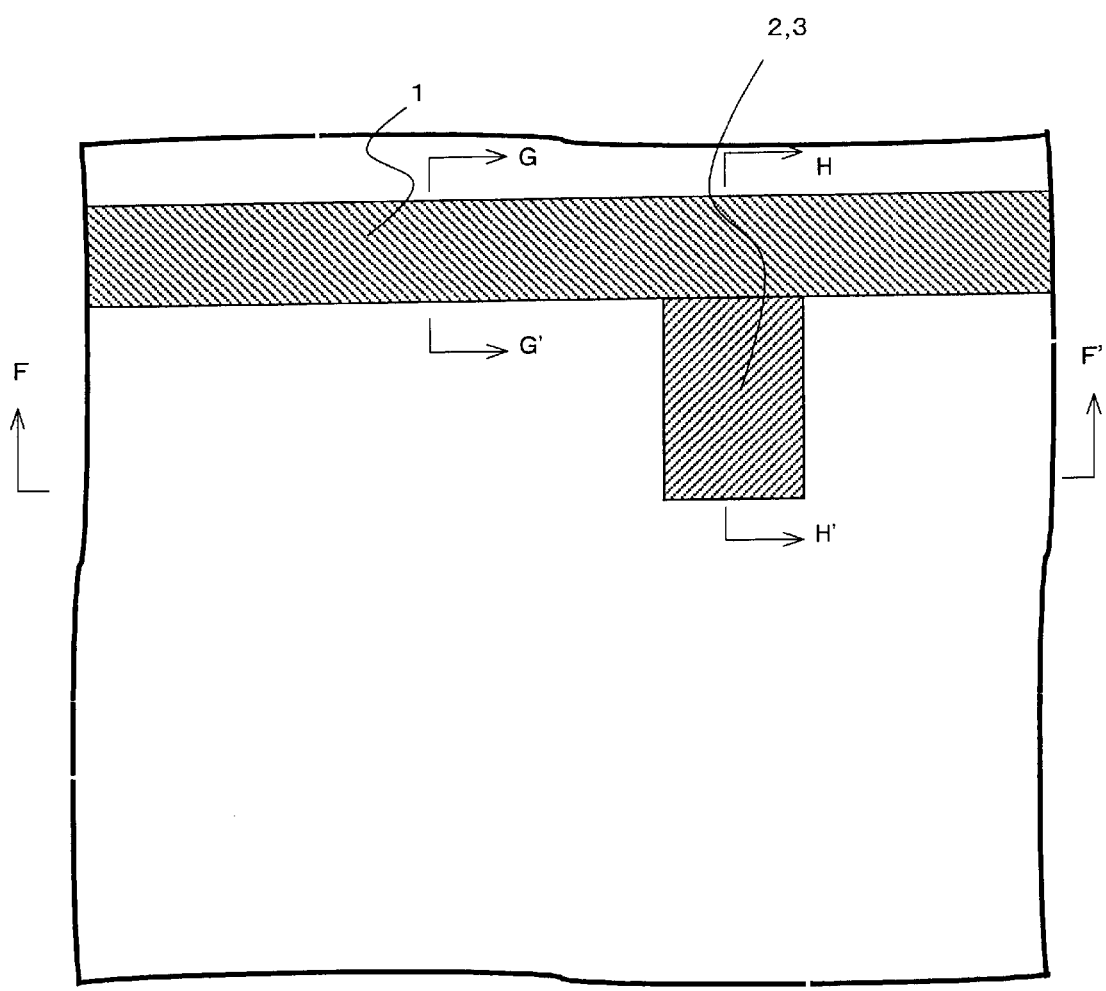

FIG. 24 is a first top plan view schematically showing the manufacturing process for an active matrix substrate according to a fifth embodiment of the present invention.

Figure 25:
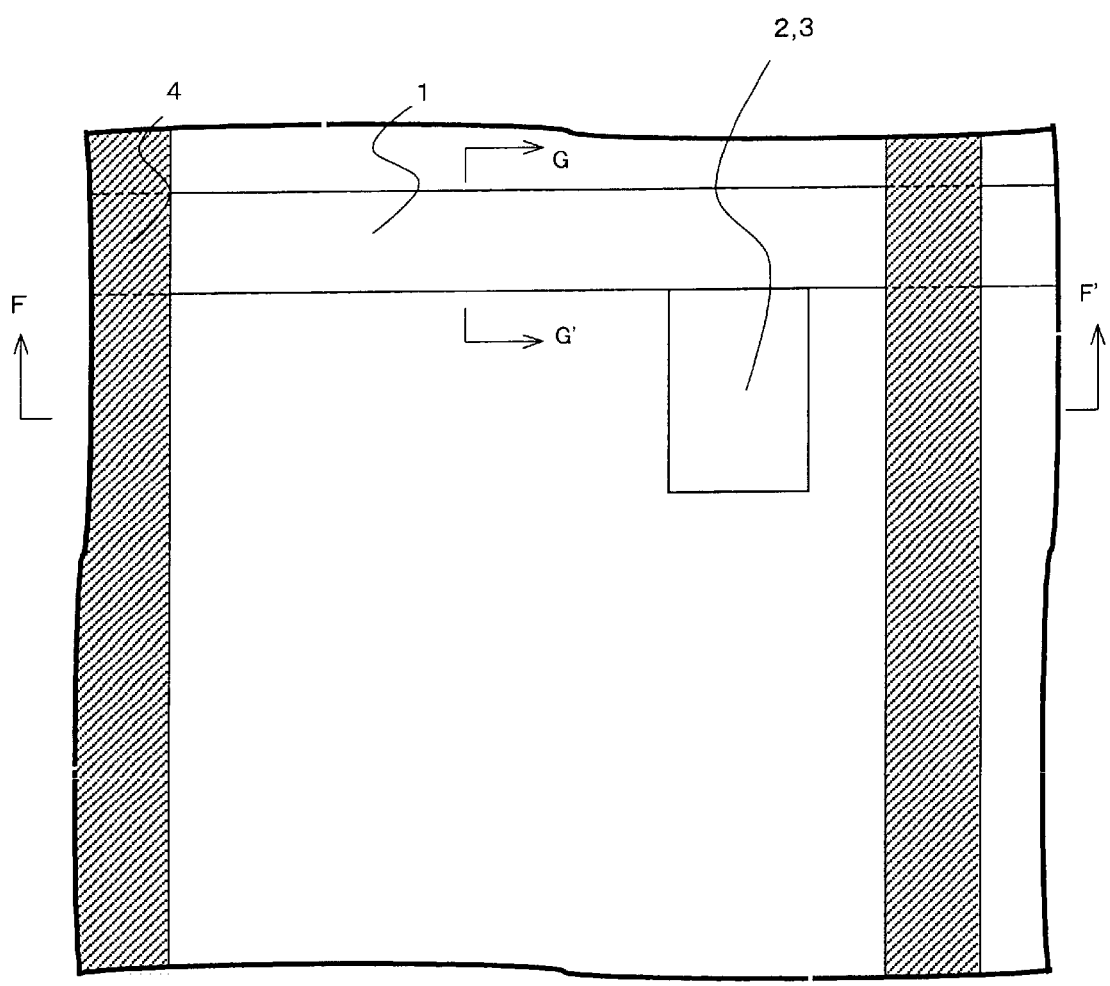

FIG. 25 is a second top plan view schematically showing the manufacturing process for the active matrix substrate according to the fifth embodiment of the present invention.

Figure 26:
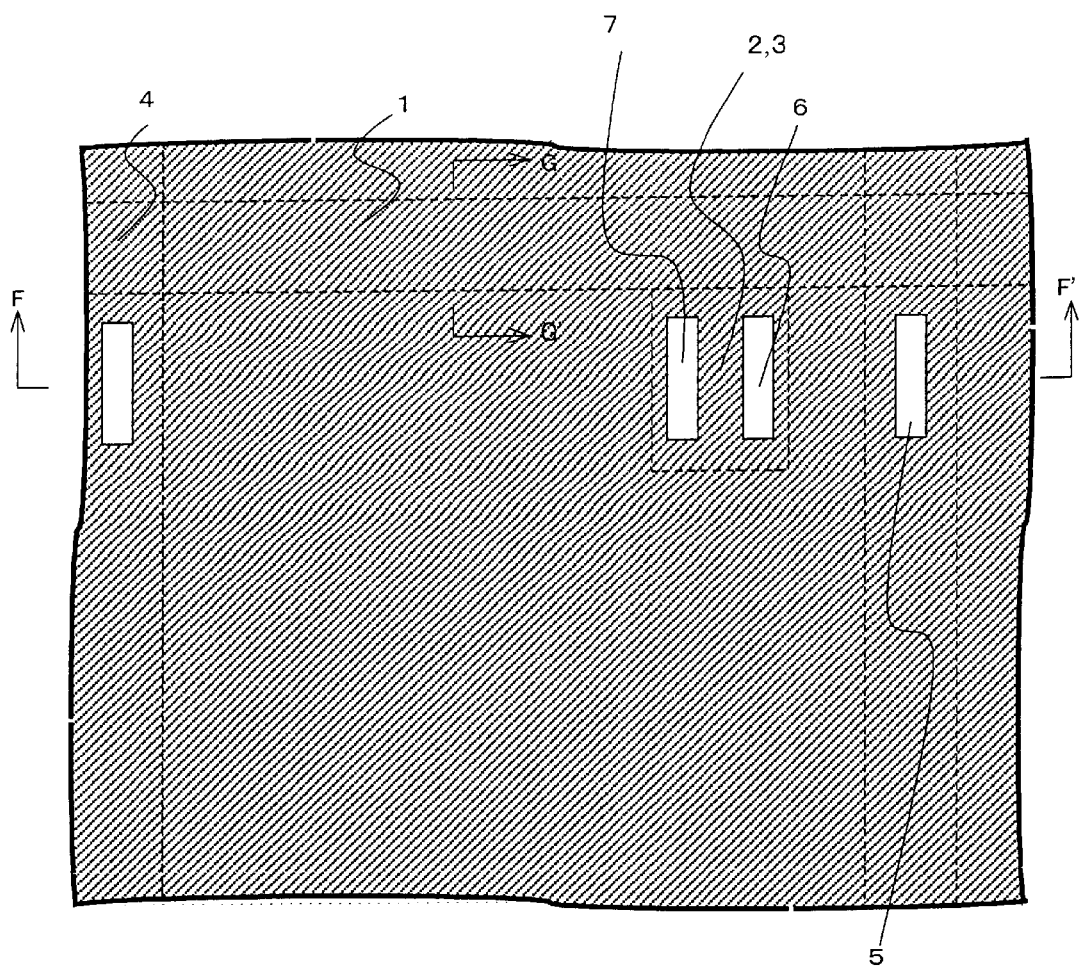

FIG. 26 is a third top plan view schematically showing the manufacturing process for the active matrix substrate according to the fifth embodiment of the present invention.

Figure 27:
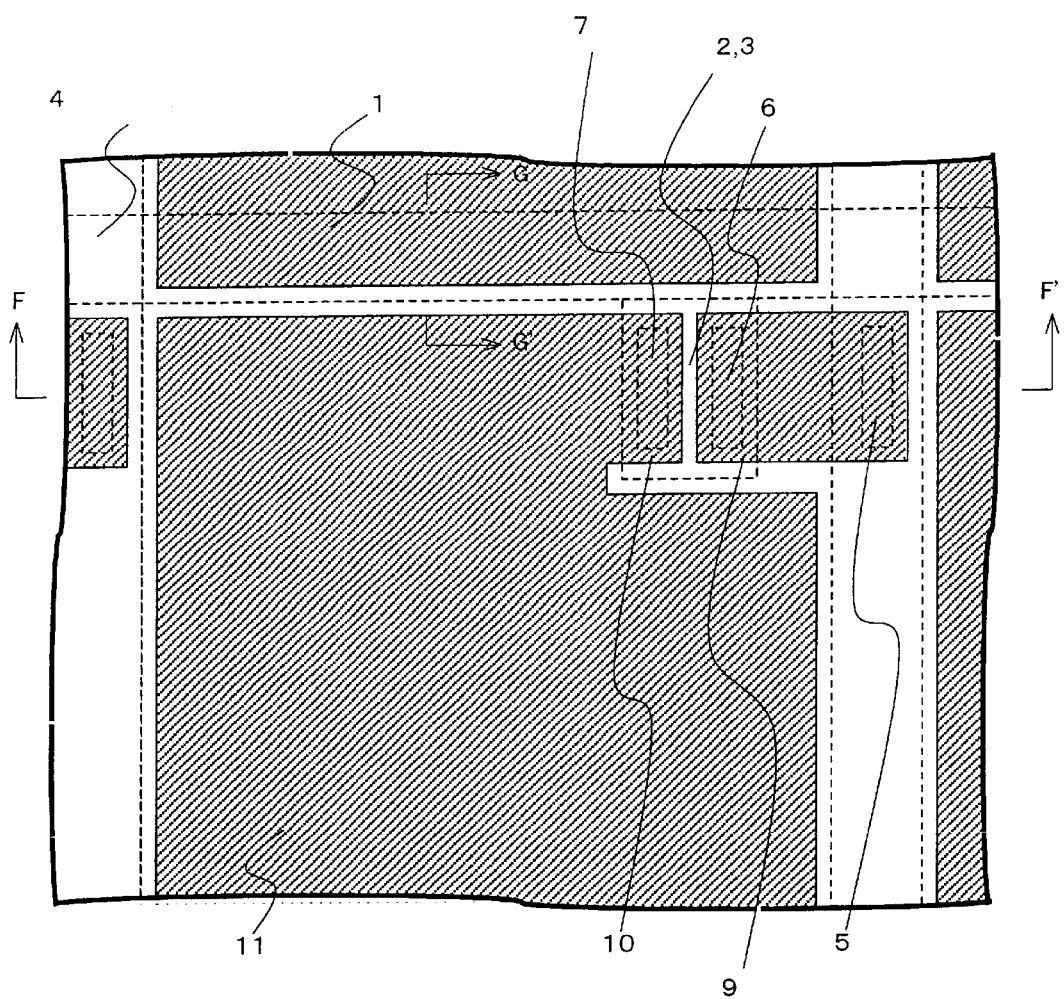

FIG. 27 is a fourth top plan view schematically showing the manufacturing process for the active matrix substrate according to the fifth embodiment of the present invention.

Figure 28A:
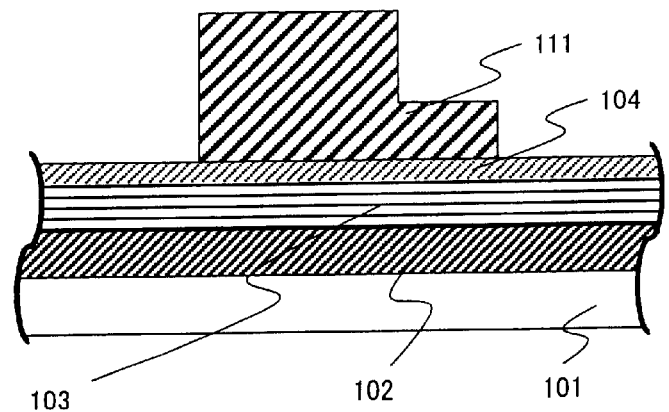
Figure 28B:
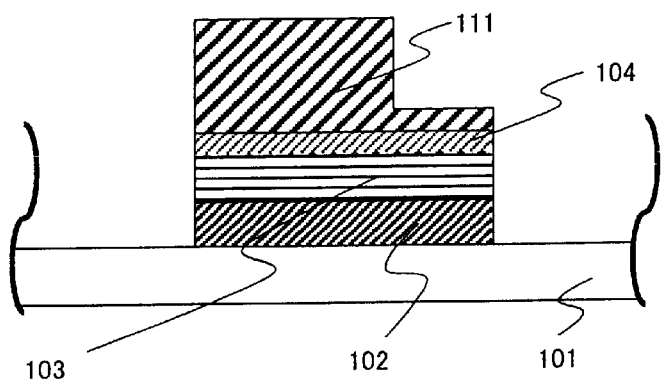
Figure 28C:
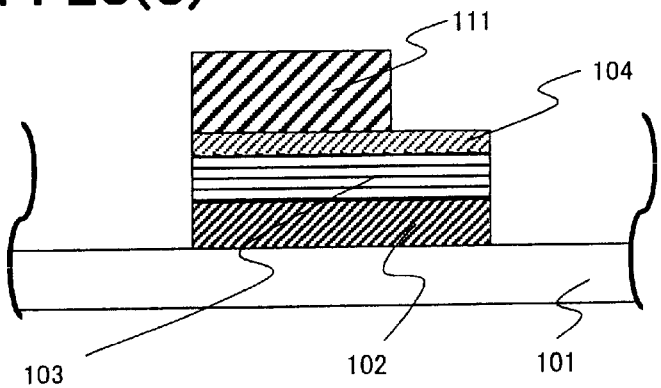

FIGS. 28(a)–28(c) are process diagrams schematically showing the former half of the manufacturing process for a gate bus line and a gate electrode of the active matrix substrate according to the fifth embodiment of the present invention, shown in a cross-section taken along line H–H'.

Figure 29A:
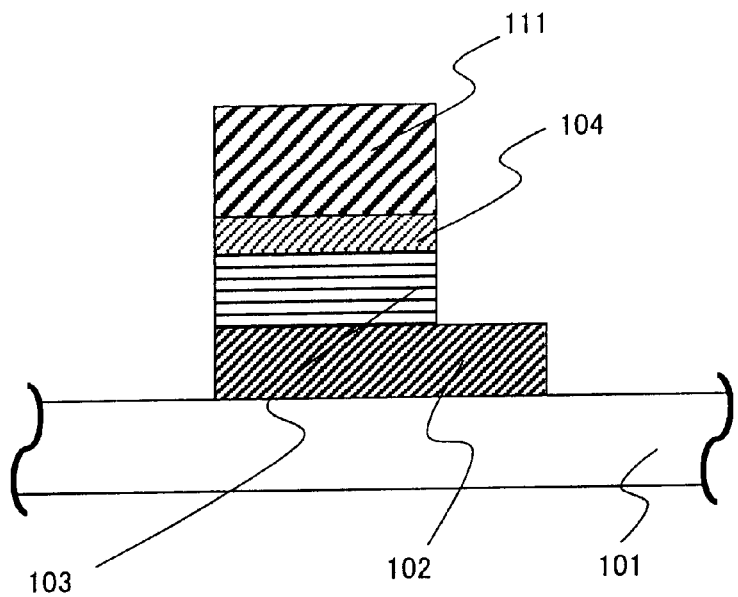
Figure 29B:
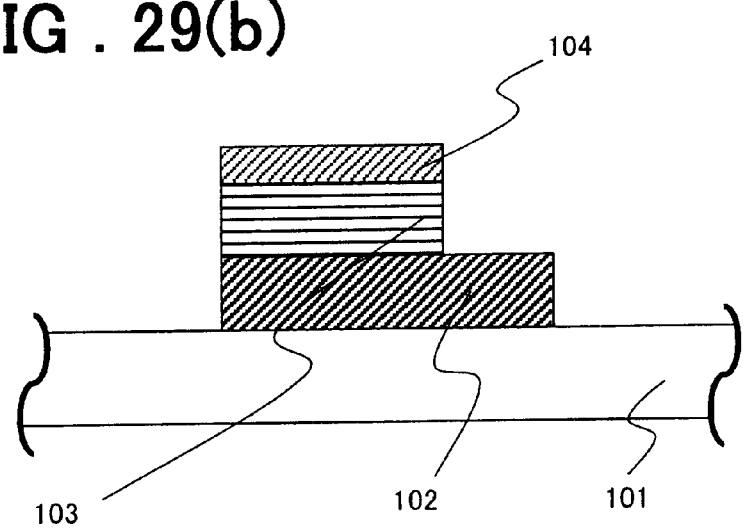

FIGS. 29(a)–29(b) are process diagrams schematically showing the latter half of the manufacturing process for a gate bus line and a gate electrode of the active matrix substrate according to the fifth embodiment of the present invention, shown in a cross-section taken along line H–H'.

FIGS. 30(a)–30(d) are process diagrams schematically showing the manufacturing process for the active matrix substrate of the fifth embodiment of the present invention, shown in a cross-section taken along line F–F'.

FIGS. 31(a)–31(d) are process diagrams schematically showing the manufacturing process for the gate terminal of the active matrix substrate of the fifth embodiment of the present invention.

FIGS. 32(a)–32(d) are process diagrams schematically showing the manufacturing process for the drain terminal of the active matrix substrate of the fifth embodiment of the present invention.

FIGS. 33(a)–33(d) are process diagrams schematically showing the manufacturing process for the storage capacitor of the active matrix substrate of the fifth embodiment of the present invention, shown in a cross-section taken along line G–G.

Figure 34:
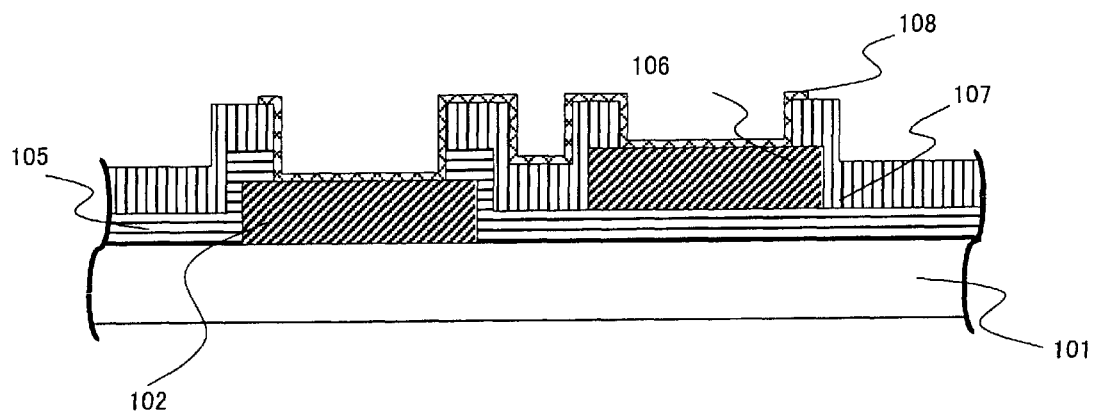

FIG. 34 is a cross-sectional view schematically showing the structure of a gate drain connection of the active matrix substrate of the fifth embodiment of the present invention.

Figure 35:
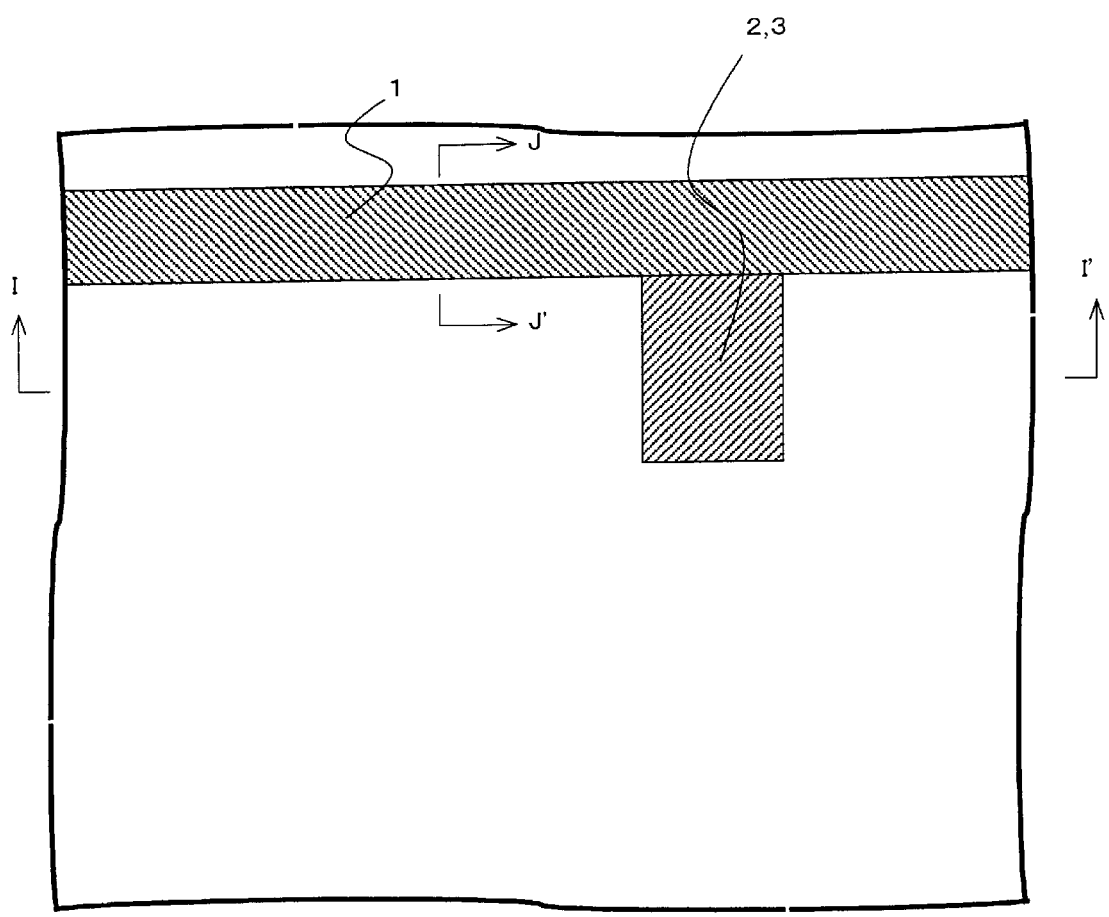

FIG. 35 is a first top plan view showing the manufacturing process for an active matrix substrate according to a sixth embodiment of the present invention.

Figure 36:
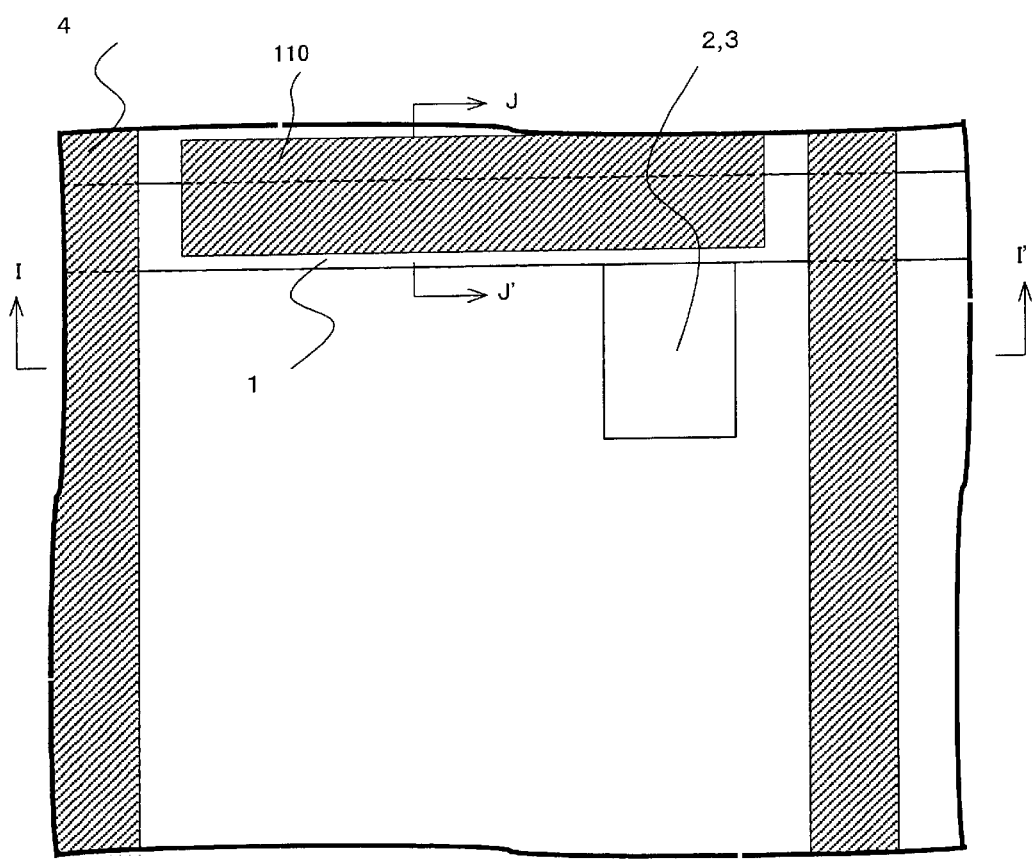

FIG. 36 is a second top plan view showing the manufacturing process for the active matrix substrate according to the sixth embodiment of the present invention.

Figure 37:
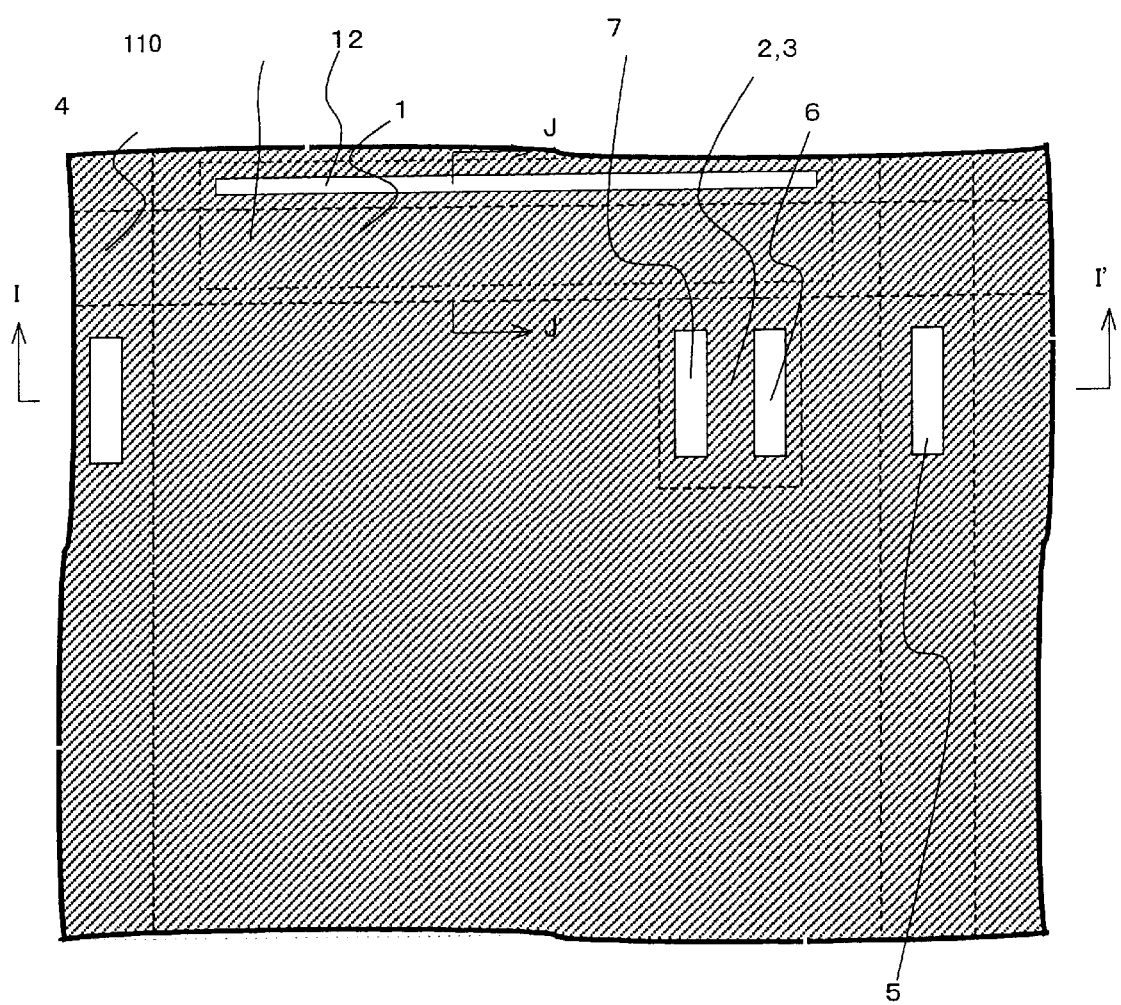

FIG. 37 is a third top plan view showing the manufacturing process for the active matrix substrate according to the sixth embodiment of the present invention.

Figure 38:
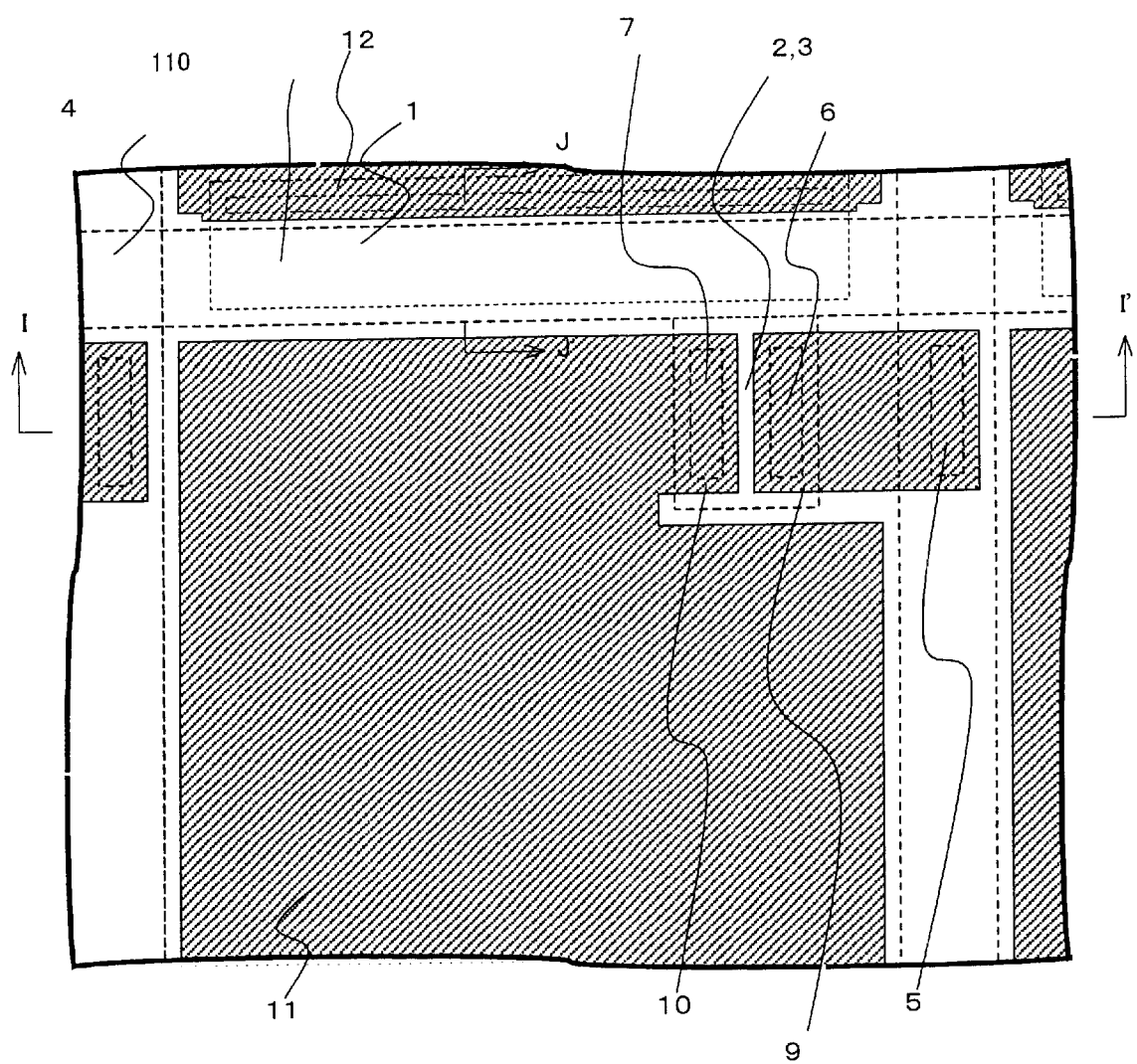

FIG. 38 is a fourth top plan view showing the manufacturing process for the active matrix substrate according to the sixth embodiment of the present invention.

FIGS. 39(a)–39(d) are process diagrams schematically showing the manufacturing process for the active matrix substrate according to the sixth embodiment of the present invention, shown in a cross-section along line I–I'.

FIGS. 40(a)–40(d) are process diagrams schematically showing the manufacturing process for the storage capacitor of the active matrix substrate according to the sixth embodiment of the present invention, shown in a cross-section along line J–J'.

Figure 41:
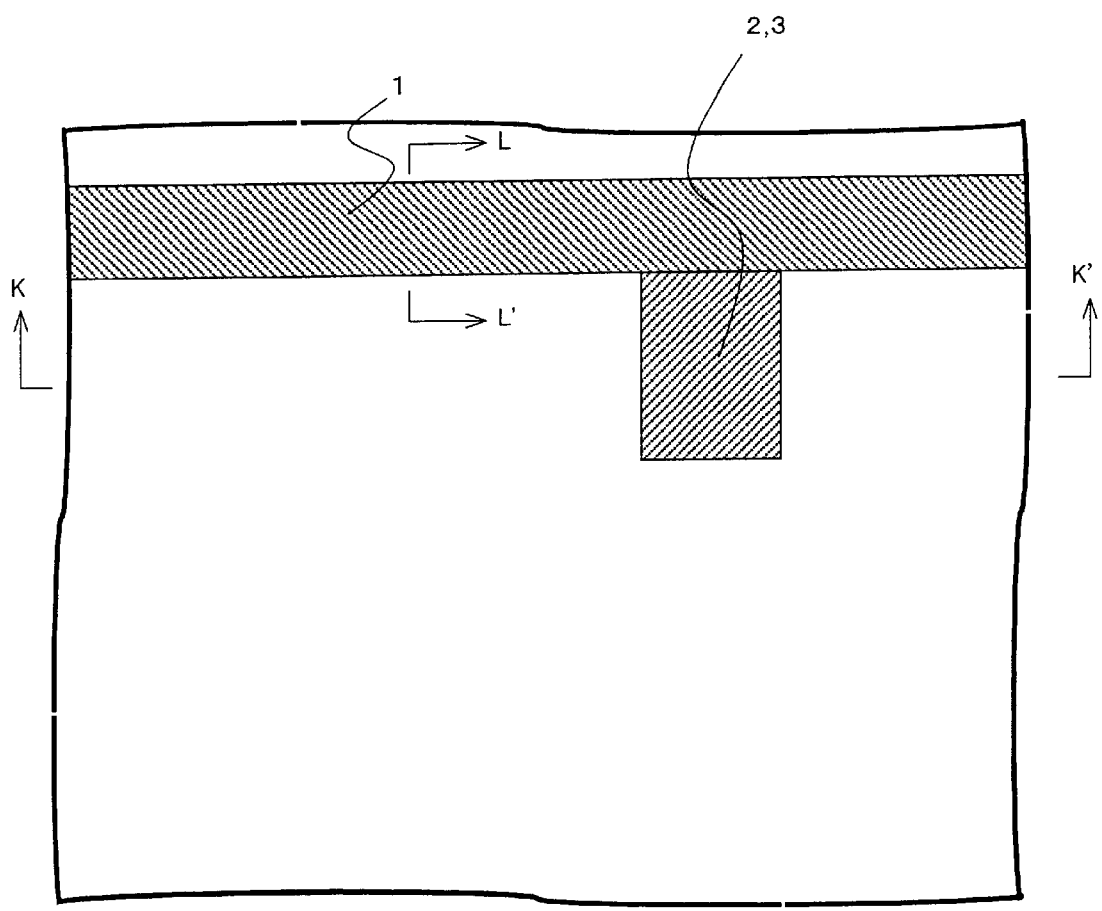

FIG. 41 is a first top plan view showing the manufacturing process for an active matrix substrate according to a seventh embodiment of the present invention.

Figure 42:
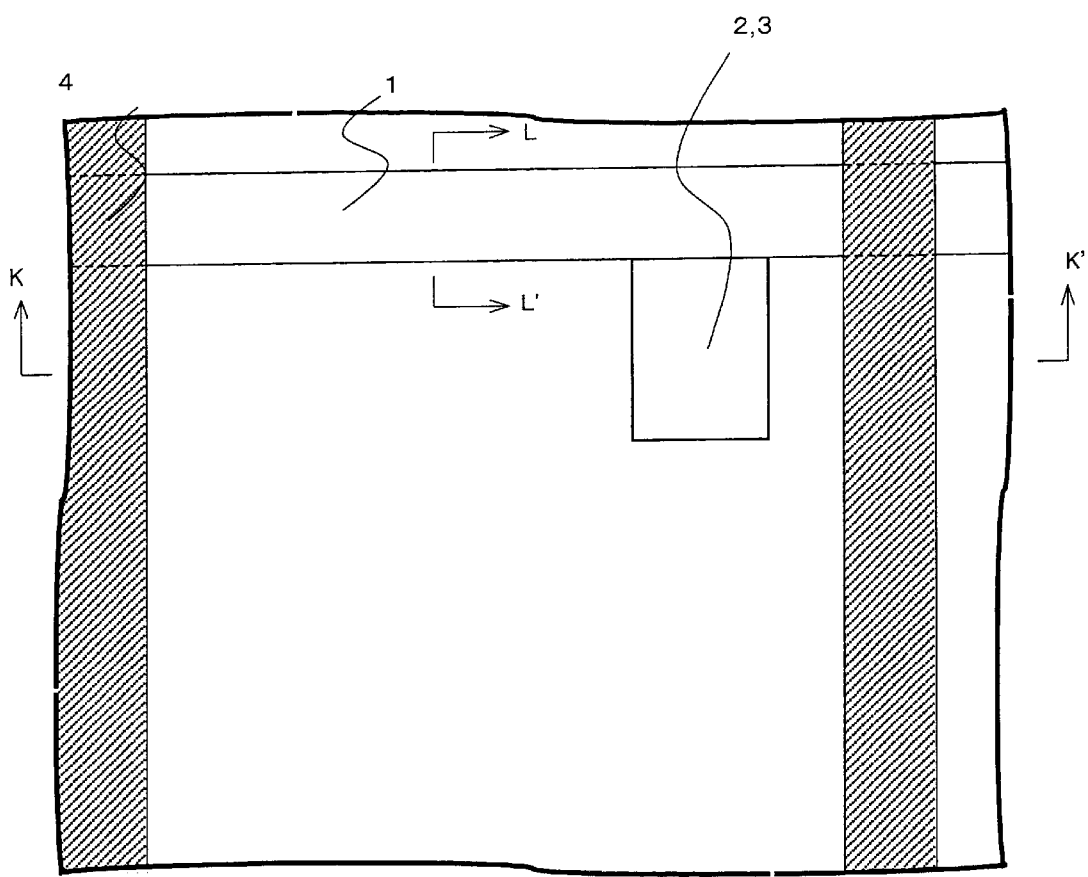

FIG. 42 is a second top plan view showing the manufacturing process for the active matrix substrate according to the seventh embodiment of the present invention.

Figure 43:
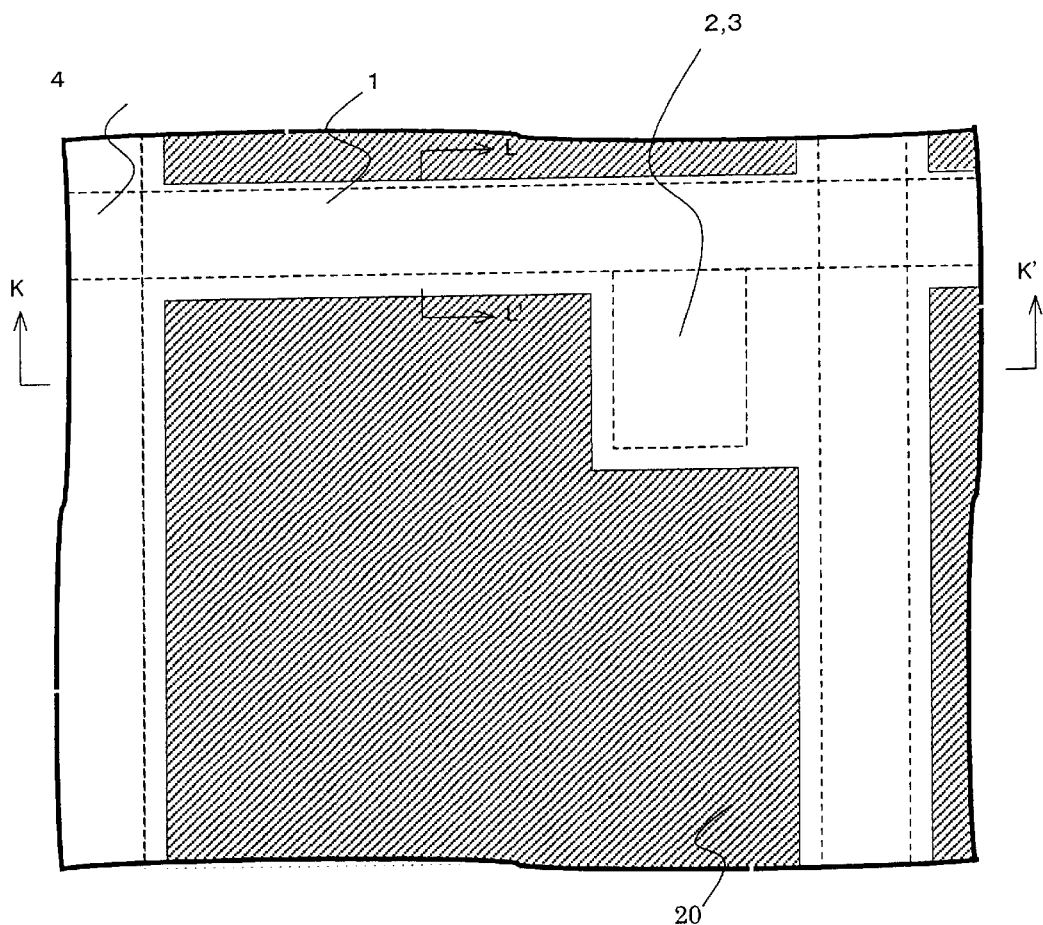

FIG. 43 is a third top planview showing the manufacturing process for the active matrix substrate according to the seventh embodiment of the present invention.

Figure 44:
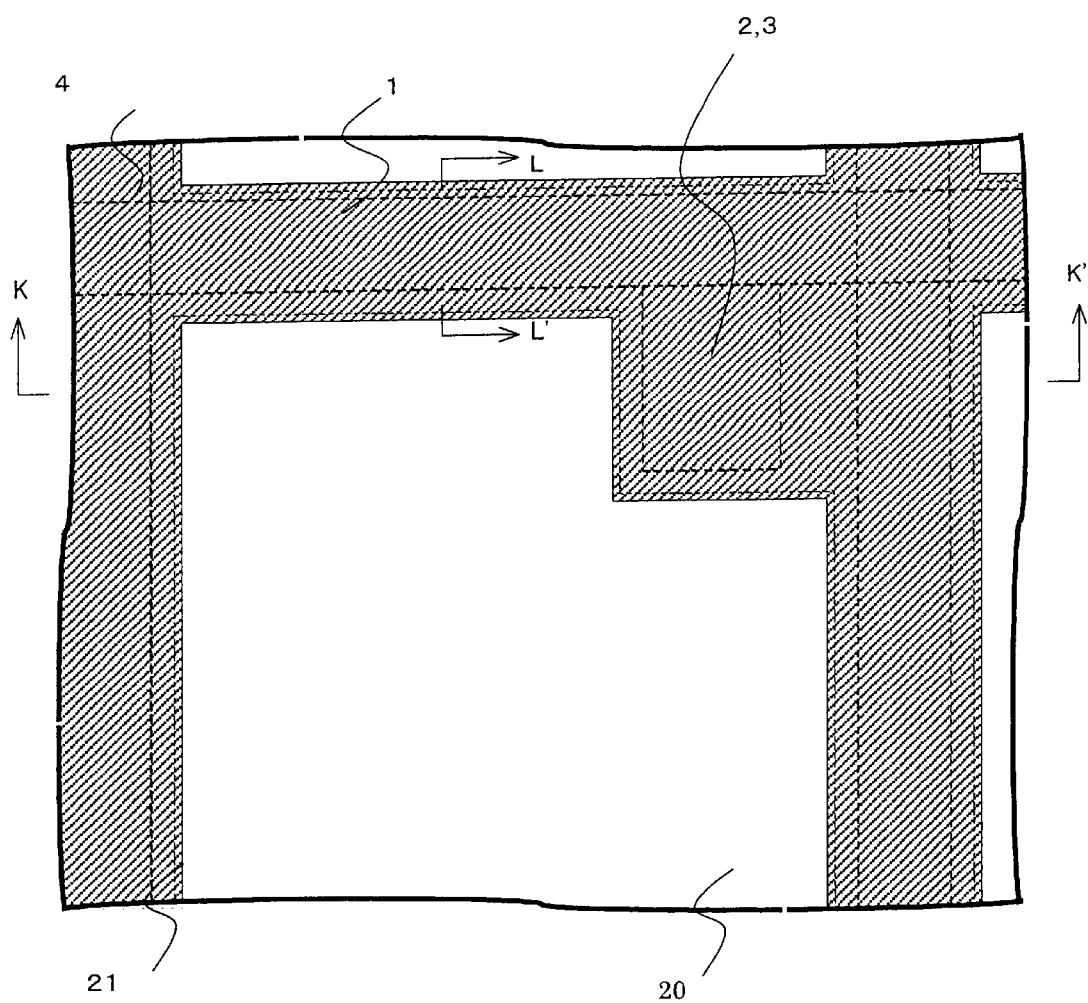

FIG. 44 is a fourth top planview showing the manufacturing process for the active matrix substrate according to the seventh embodiment of the present invention.

Figure 45:
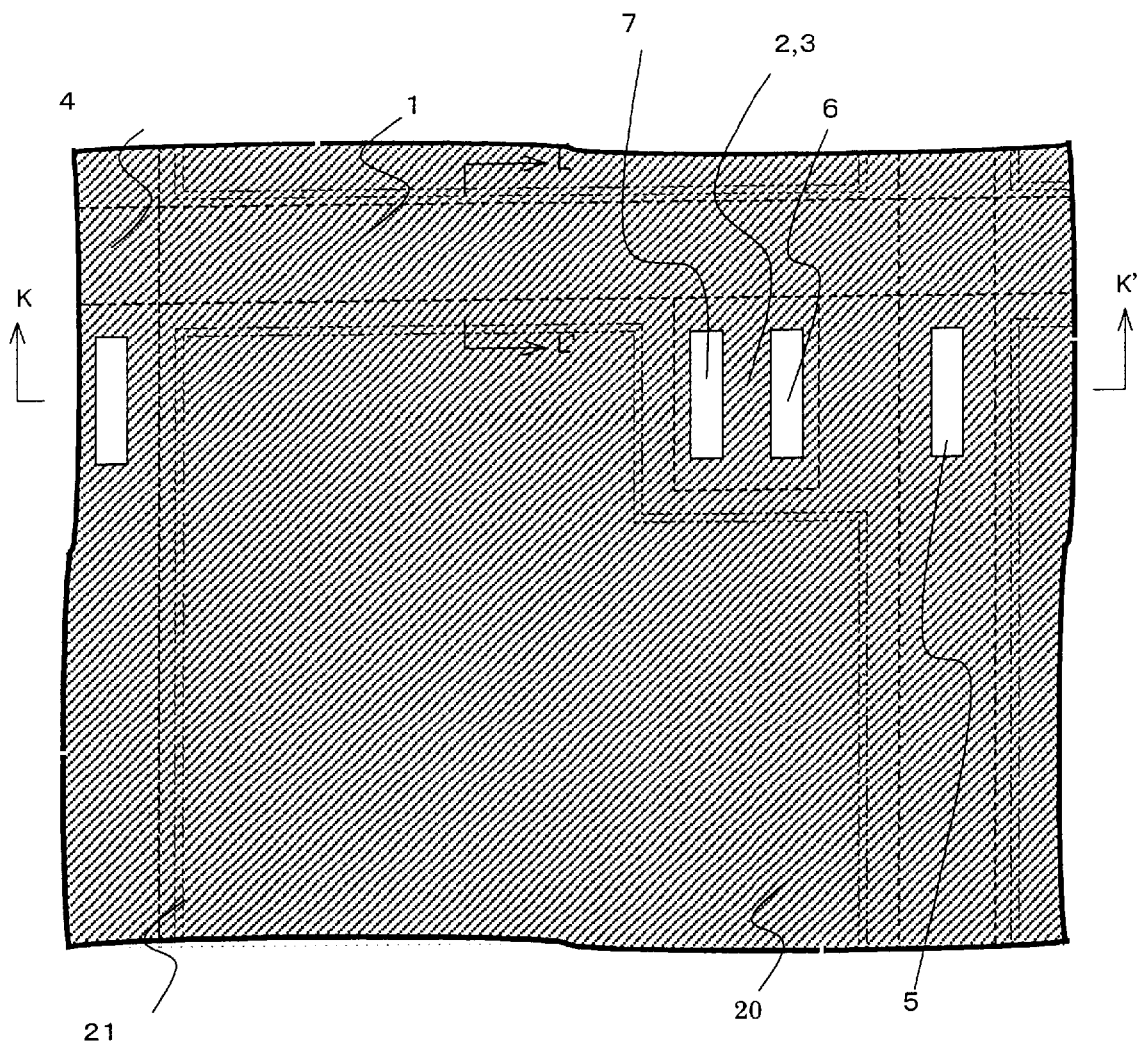

FIG. 45 is a fifth to planview showing the manufacturing process for the active matrix substrate according to the seventh embodiment of the present invention.

Figure 46:
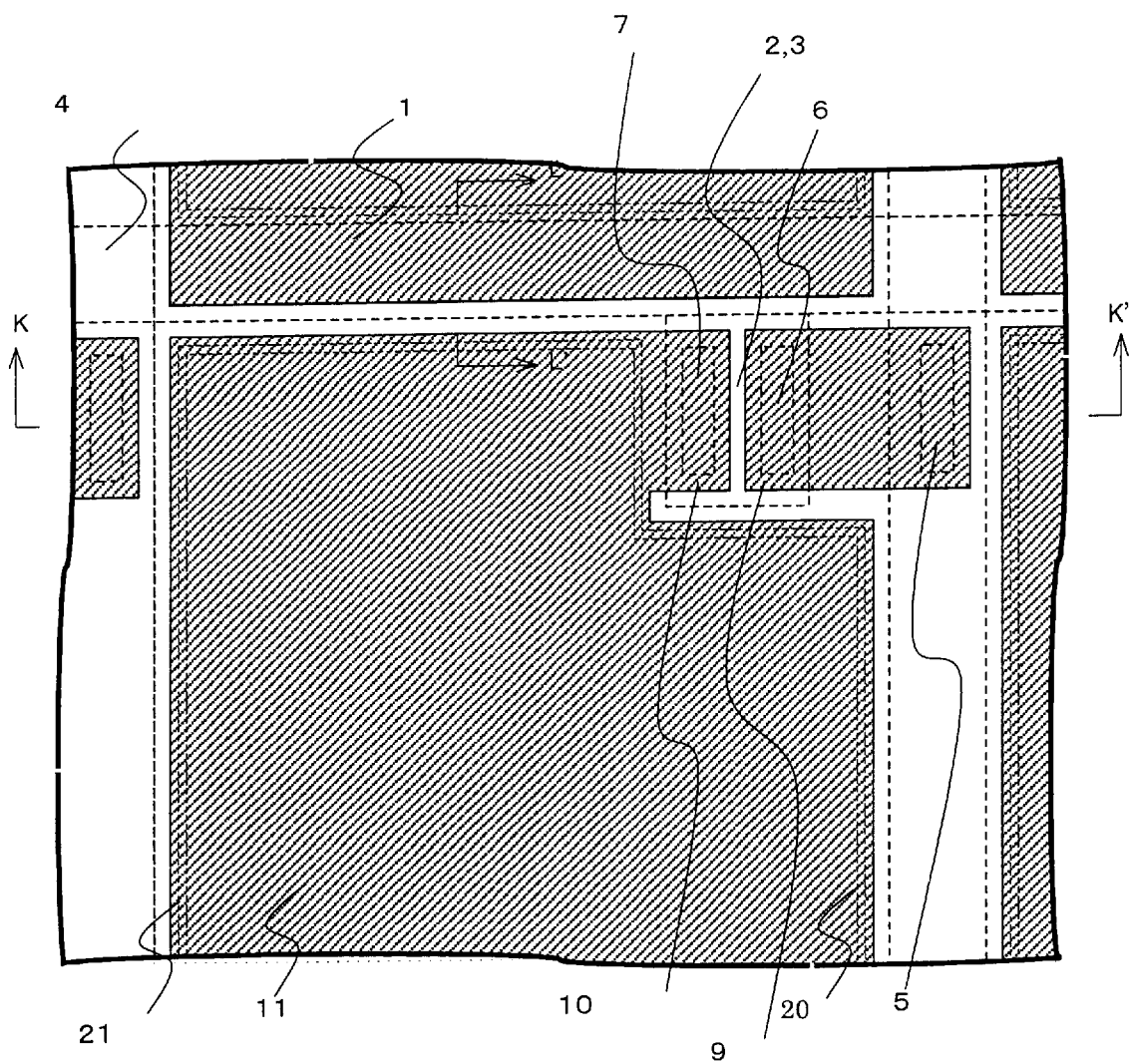

FIG. 46 is a sixth to planview showing the manufacturing process for the active matrix substrate according to the seventh embodiment of the present invention.

FIGS. 47(a)–47(d) are process diagrams schematicaly showing the former half of the manufacturing process for the active matrix substrate according to the seventh embodiment of the present invention, shown in cross-section along line K–K'.

Figure 48A:
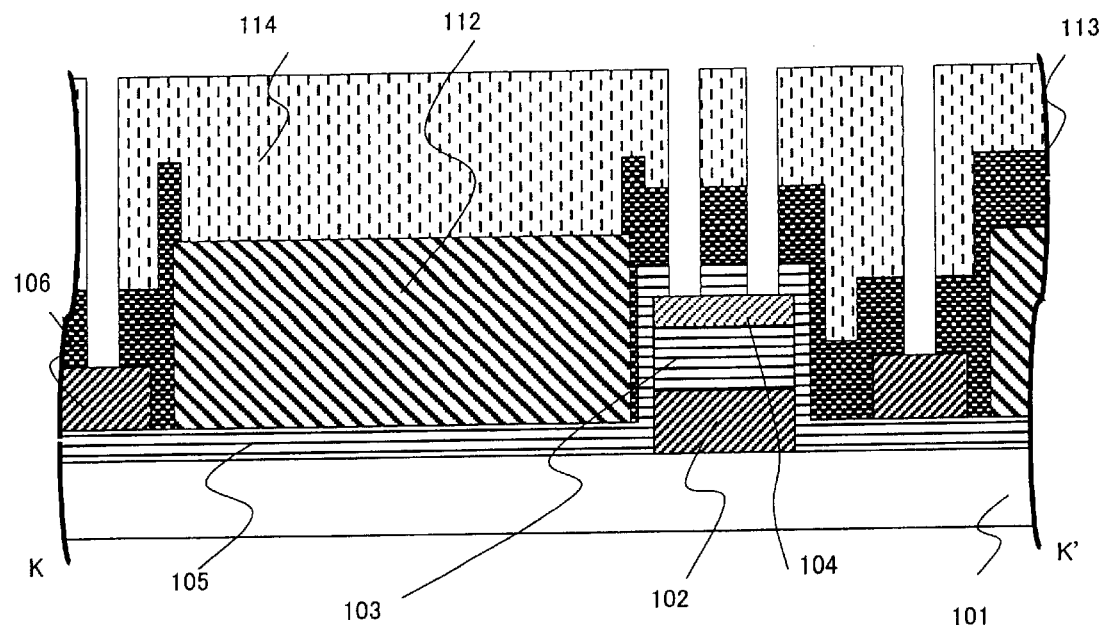
Figure 48B:
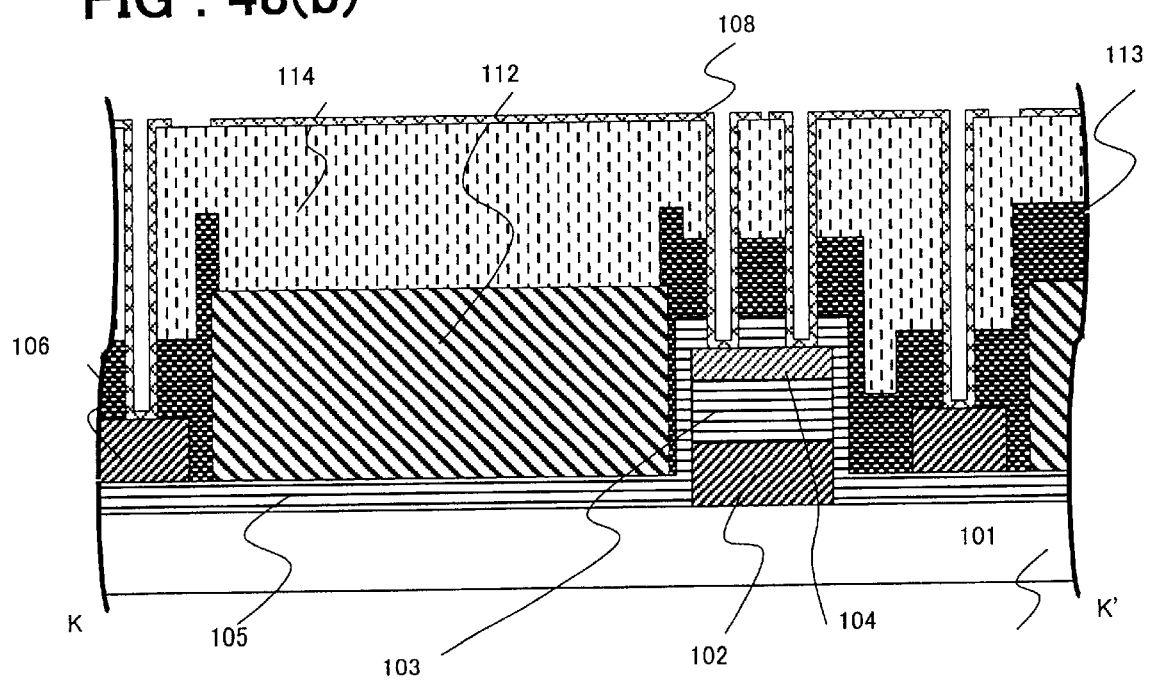
Figure 49A:
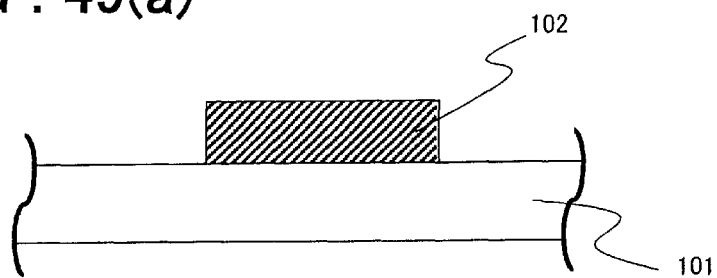
Figure 49B:
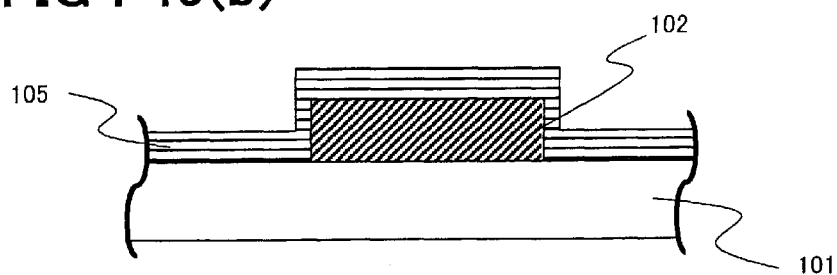
Figure 49C:
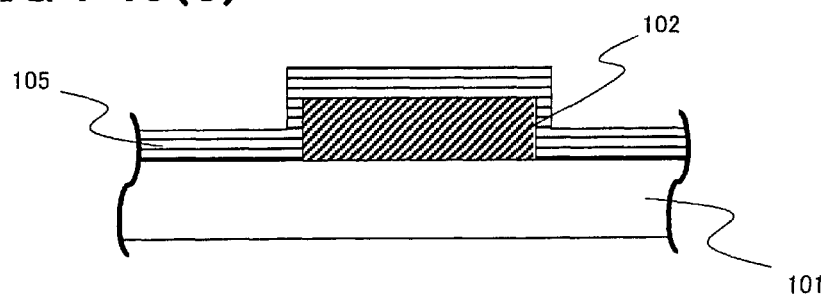
Figure 49D:
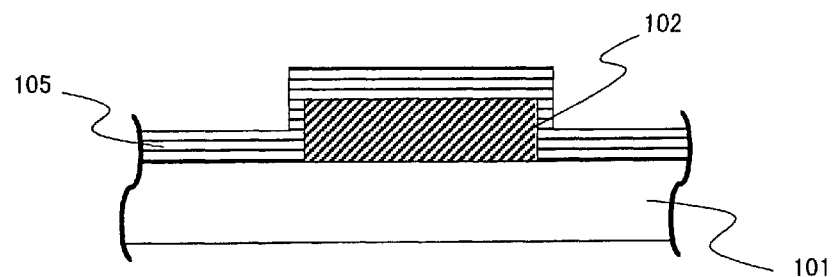

FIGS. 48(a)–48(b) are process diagrams schematically showing the latter half of the manufacturing process for the active matrix substrate according to the seventh embodiment of the present invention, shown in cross-section along line K–K'.

FIGS. 49(a)–49(d) are process diagrams schematically showing the former half of the manufacturing process for the gate terminals of the active matrix substrate according to the seventh embodiment of the present invention.

Figure 50A:
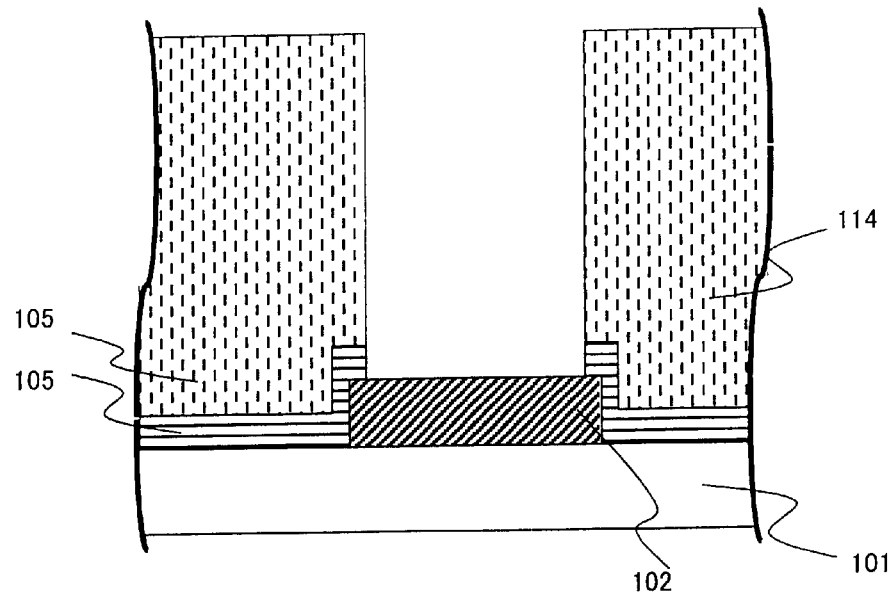
Figure 50B:
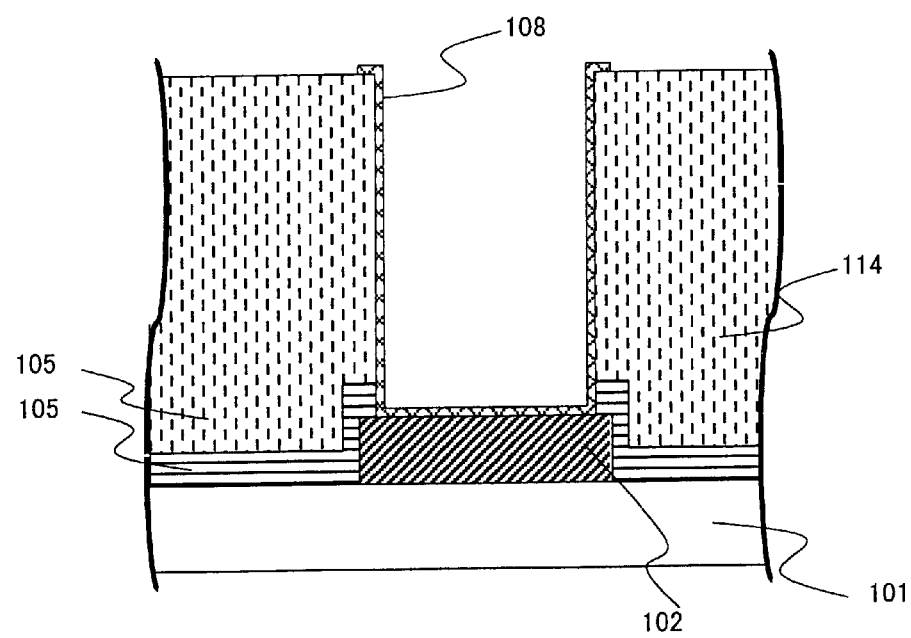
Figure 51A:
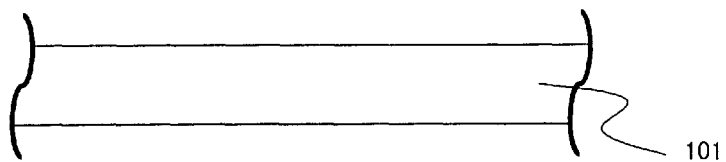
Figure 51B:
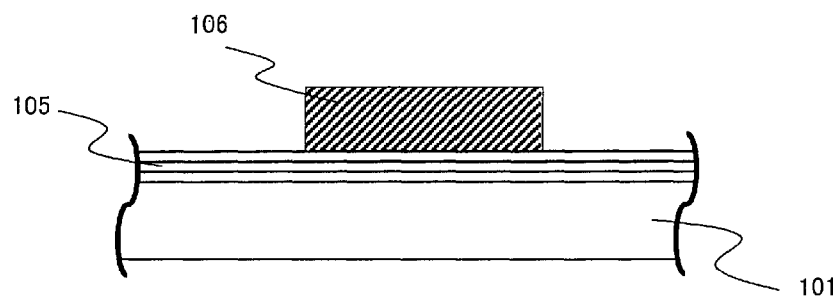
Figure 51C:
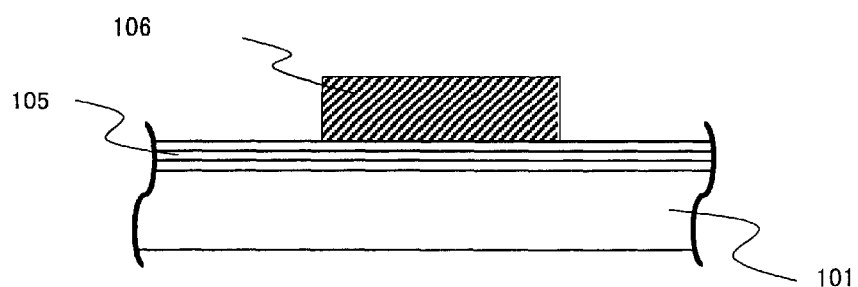
Figure 51D:
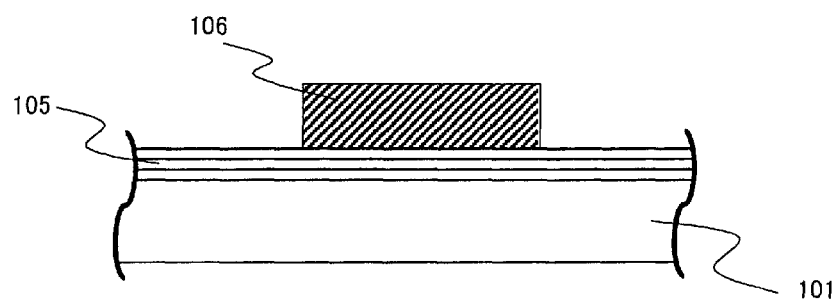

FIGS. 50(a)–50(b) are is a process diagrams schematically showing the latter half of the manufacturing process for the gate terminals of the active matrix substrate according to the seventh embodiment of the present invention.

FIGS. 51(a)–51(d) are process diagrams schematically showing the former half of the manufacturing process for the drain terminals 15 of the active matrix substrate according to the seventh embodiment of the present invention.

Figure 52A:
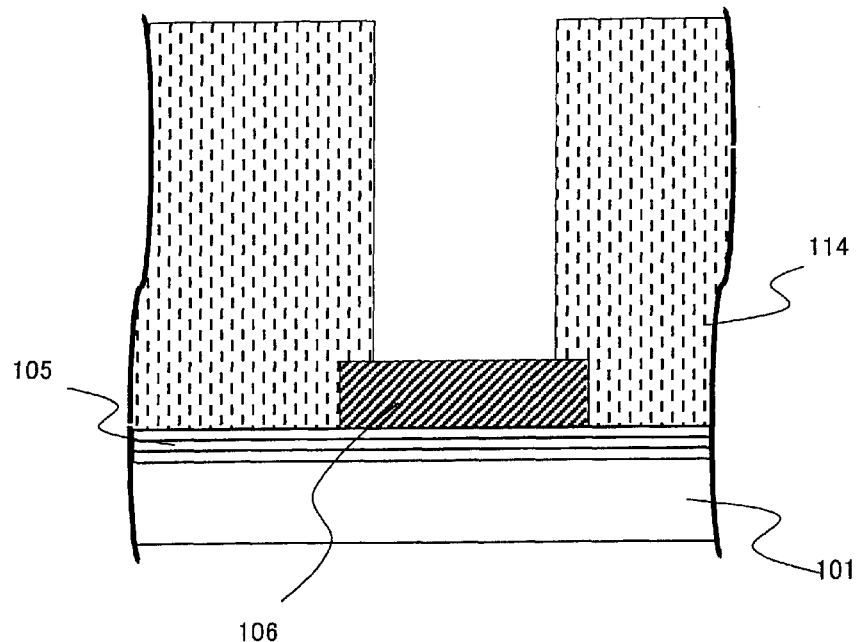
Figure 52B:
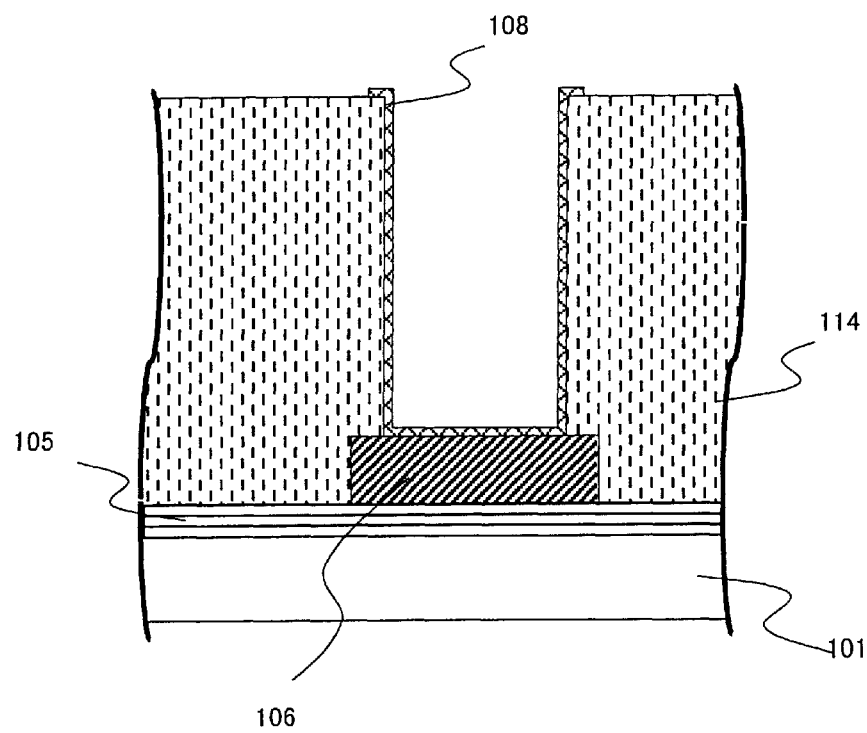
Figure 53A:
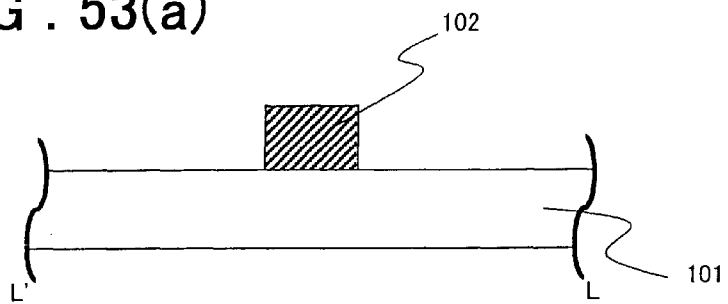
Figure 53B:
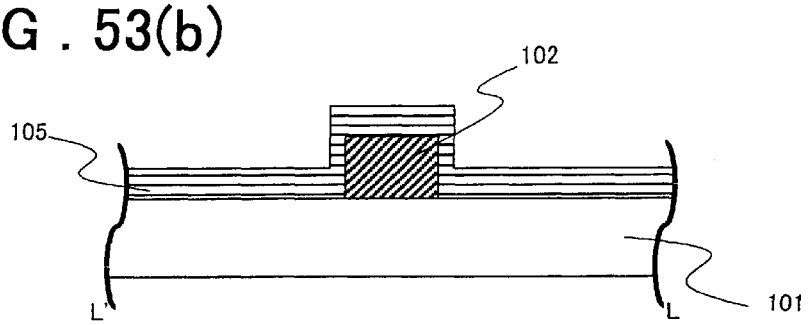
Figure 53C:
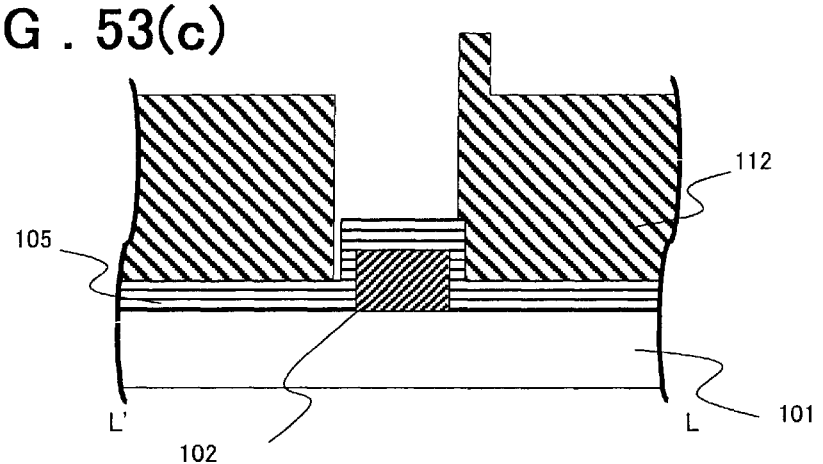
Figure 53D:
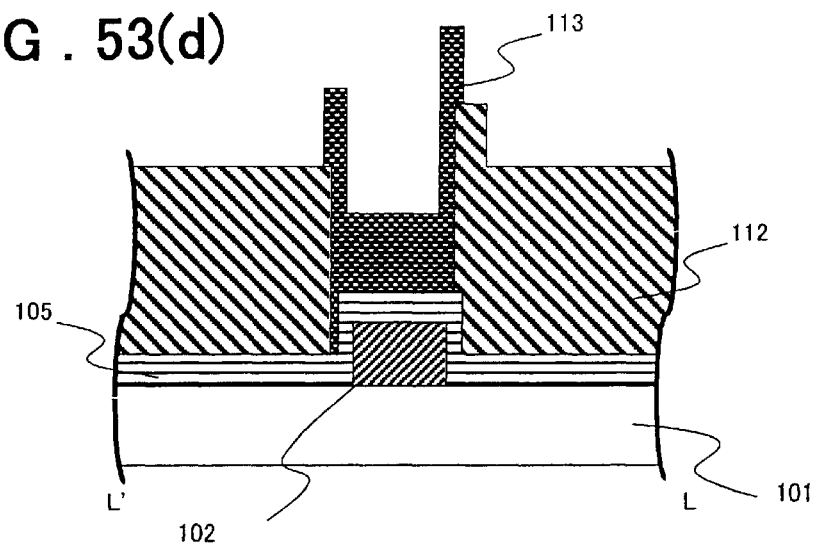

FIGS. 52(a)–52(b) are process diagrams schematically showing the latter half of the manufacturing process for the drain terminals 15 of the active matrix substrate according to the seventh embodiment of the present invention.

FIGS. 53(a)–53(d) are process diagrams schematically showing the former half of the manufacturing process for the storage capacitor of the active matrix substrate according to the seventh embodiment of the present invention, shown in cross-section along line L–L'.

Figure 54A:
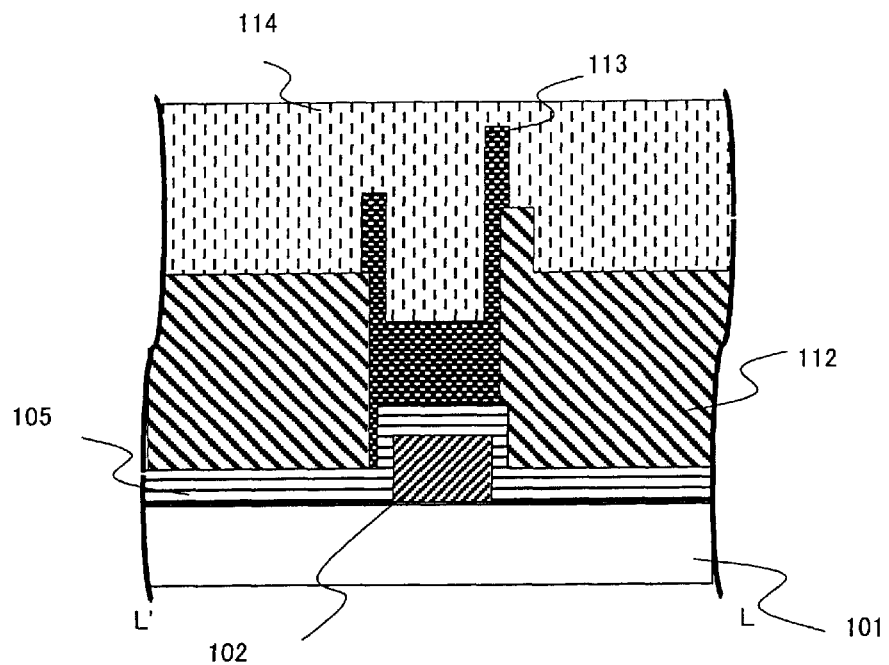
Figure 54B:
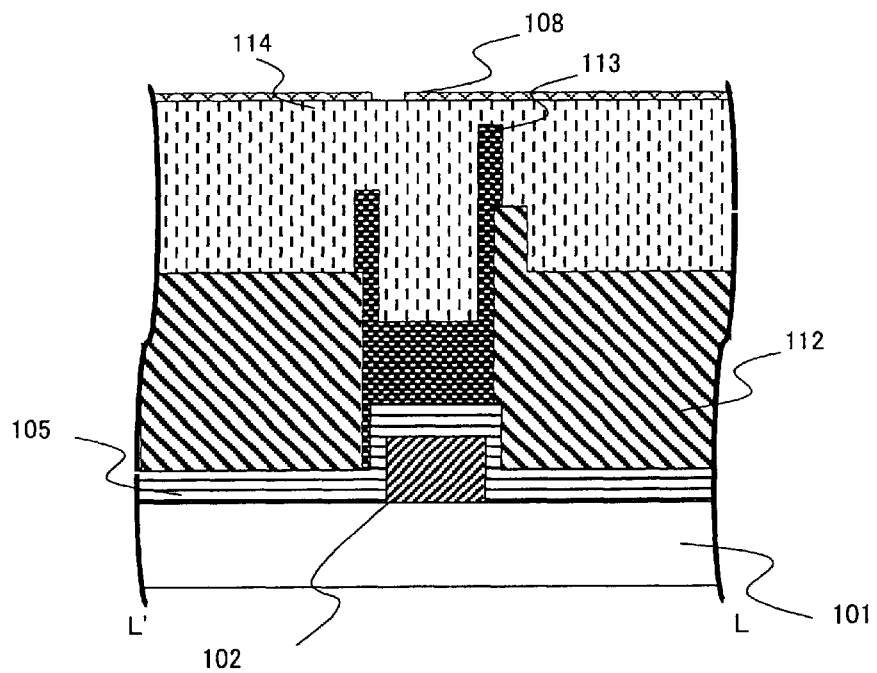

FIGS. 54(a)–54(b) are is a process diagrams schematically showing the latter half of the manufacturing process for the storage capacitor of the active matrix substrate according to the seventh embodiment of the present invention, shown in cross-section along line L–L'.

Figure 55:
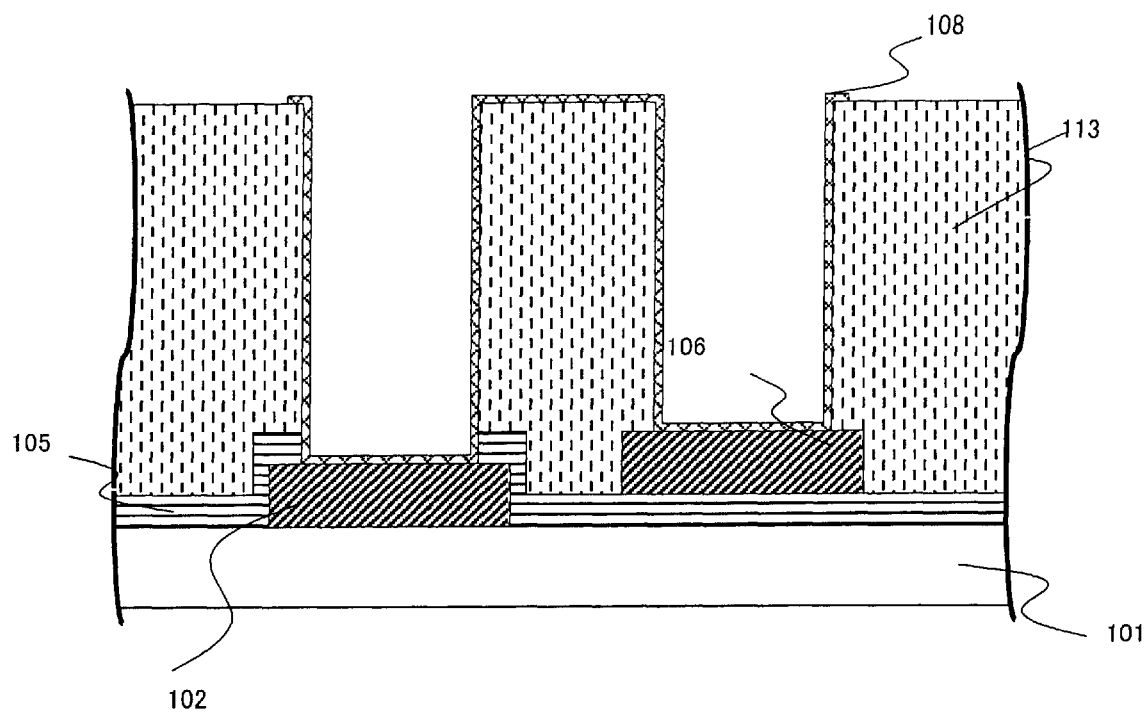

FIG. 55 is a schematic cross-sectional view showing the structure of a gate-drain connection of the active matrix substrate according to the seventh embodiment of the present invention.

Figure 56:
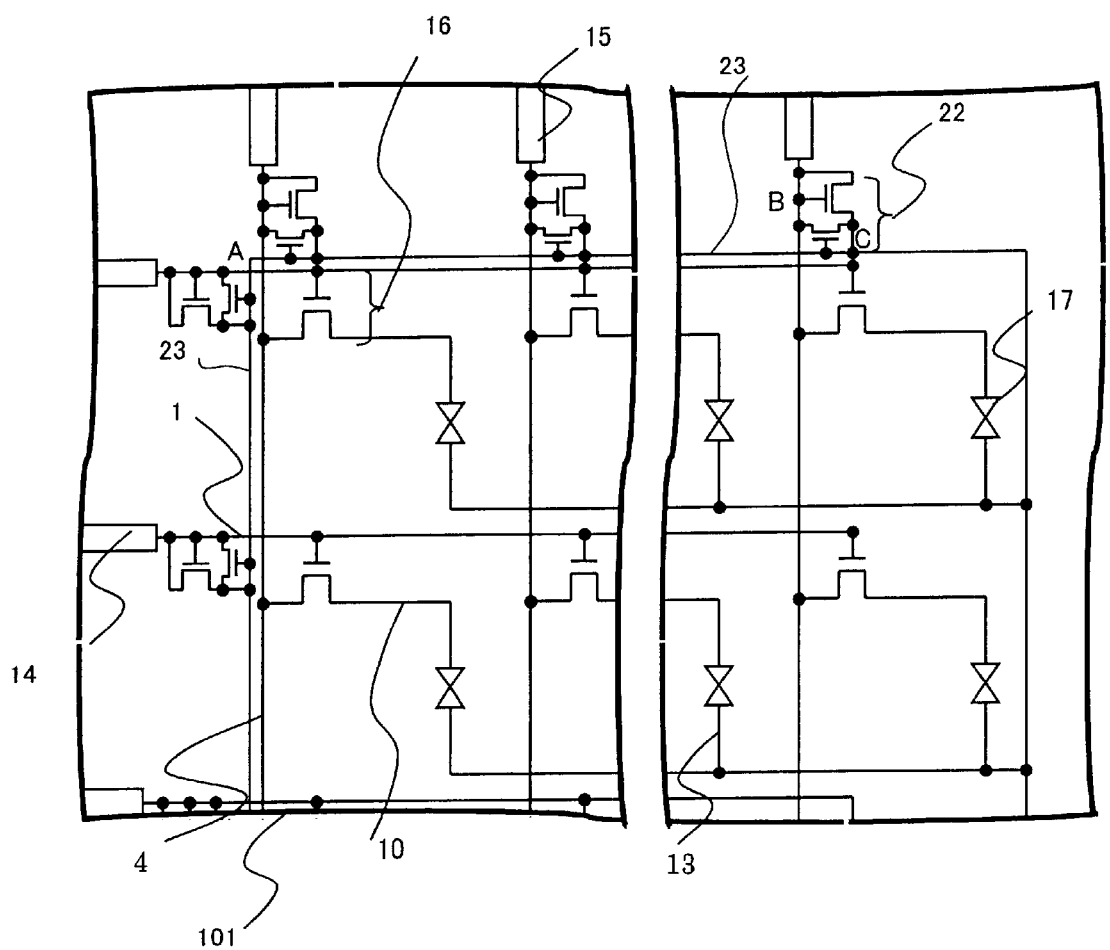

FIG. 56 is a circuit diagram of an active matrix substrate for a liquid crystal display device according to a ninth embodiment of the present invention.

Figure 57:
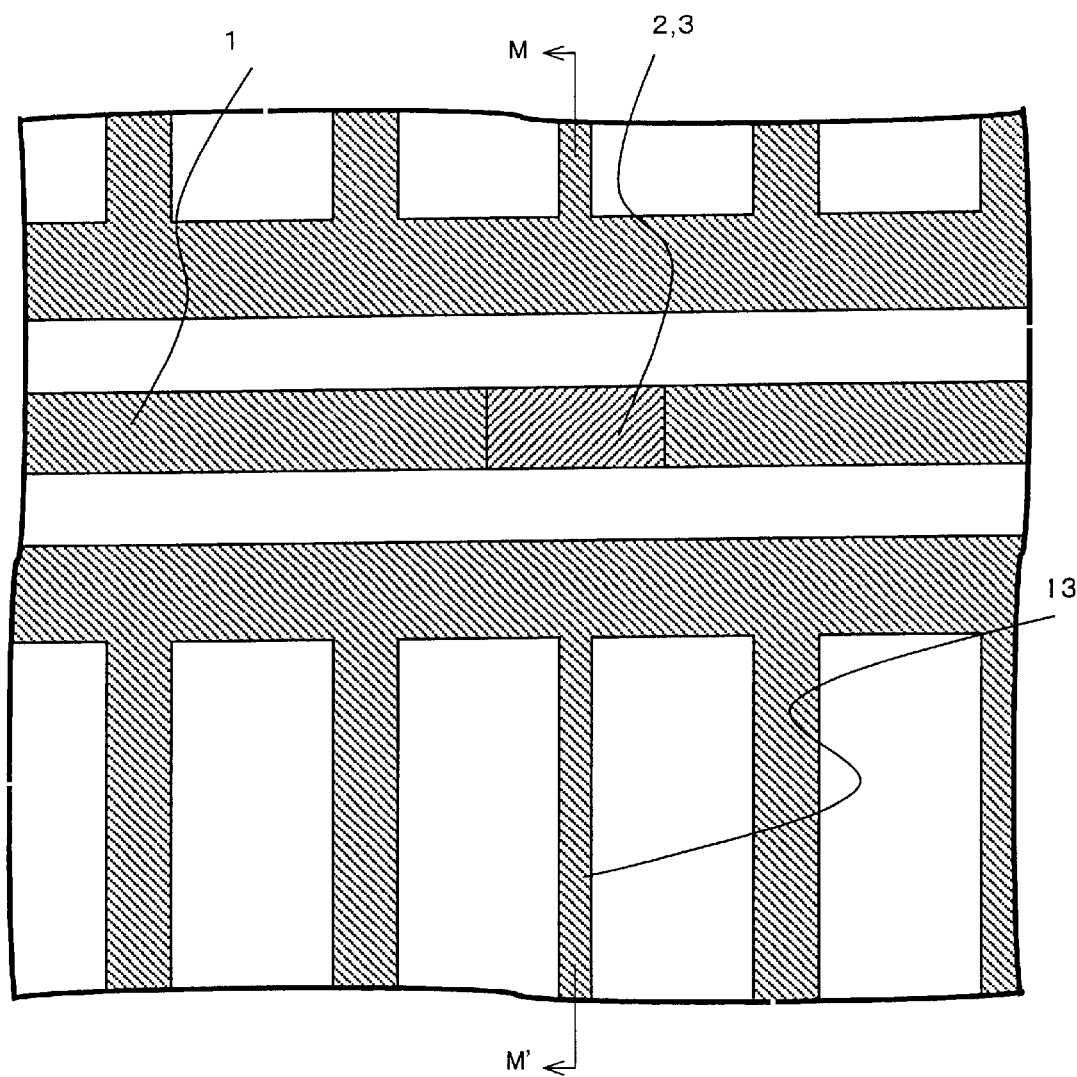

FIG. 57 is a first top plan view schematically showing the manufacturing process for the active matrix substrate according to the ninth embodiment of the present invention.

Figure 58:
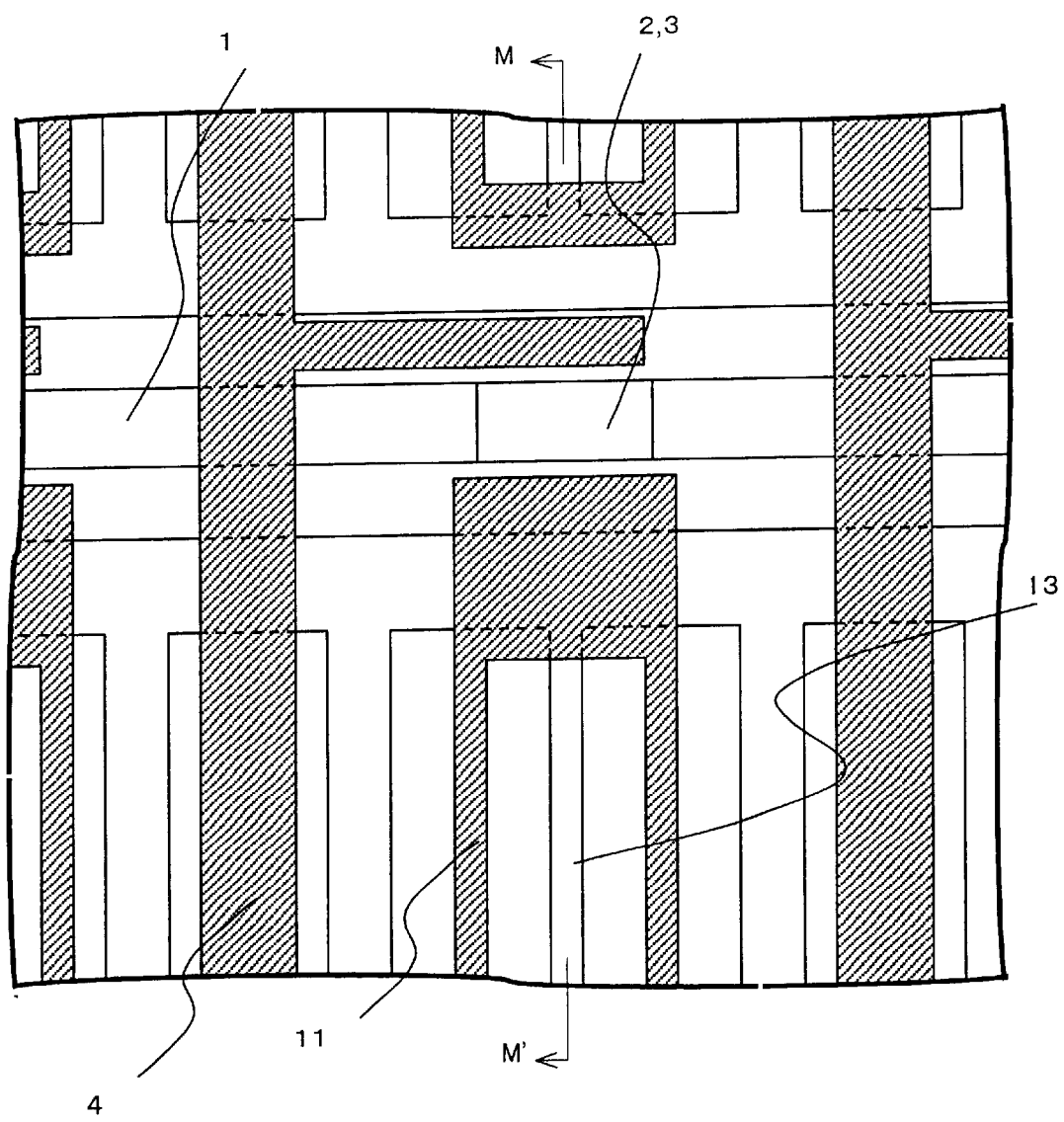

FIG. 58 is a second top plan view schematically showing the manufacturing process for the active matrix substrate according the ninth embodiment of the present invention.

Figure 59:
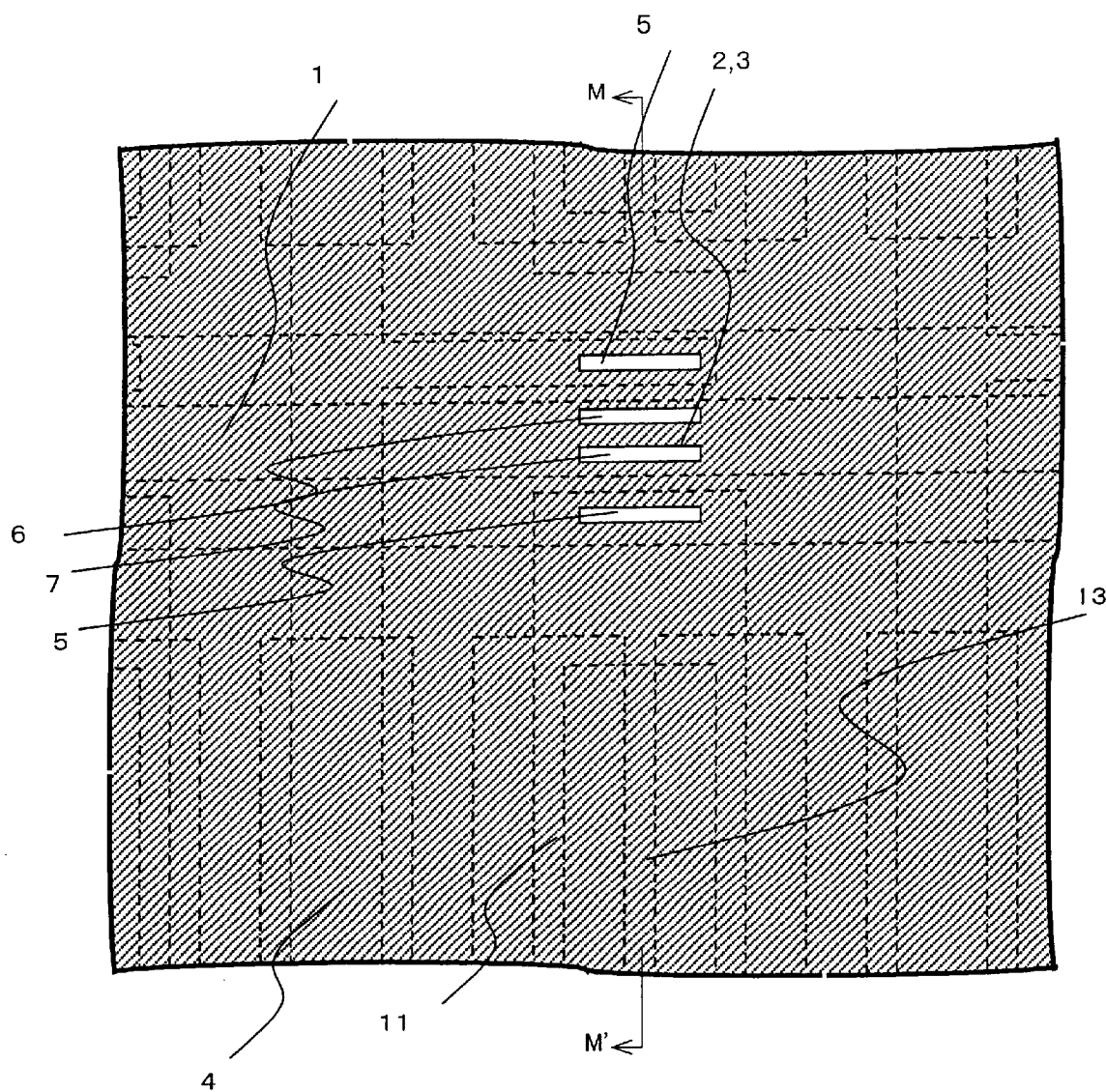

FIG. 59 is a third top plan view schematically showing the manufacturing process for the active matrix substrate according to the ninth embodiment of the present invention.

Figure 60:
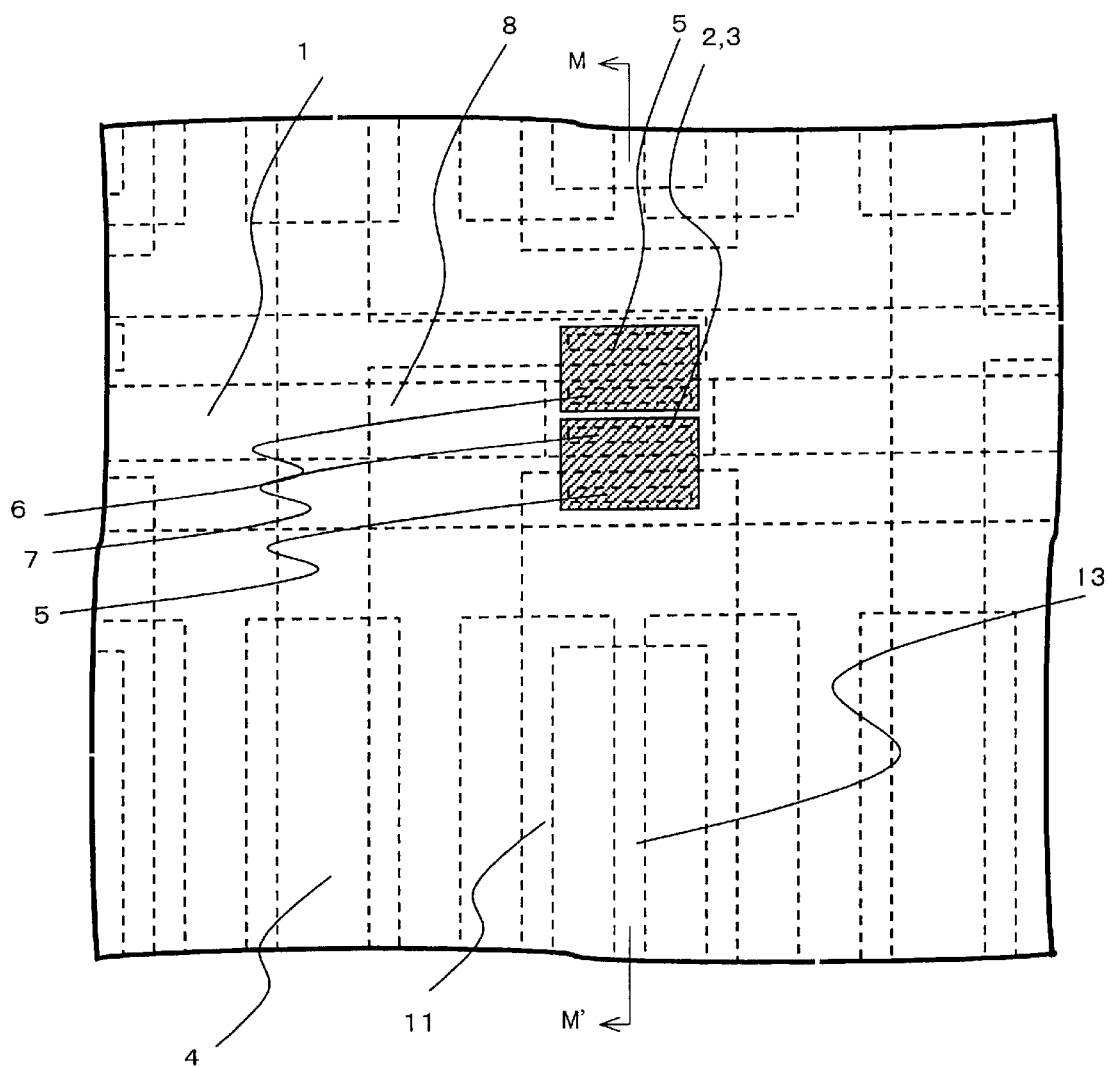

FIG. 60 is a fourth ton plan view schematically showing the manufacturing process for the active matrix substrate according to the ninth embodiment of the present invention.

FIGS. 61(a)–61(d) are process diagrams schematically showing the manufacturing process of the active matrix substrate according to the ninth embodiment of the present invention, shown in a cross-section along line M–M'.

FIGS. 62(a)–62(d) are cross-sectional process diagrams schematically showing the manufacturing process for a conventional active matrix substrate.

Figure 63:
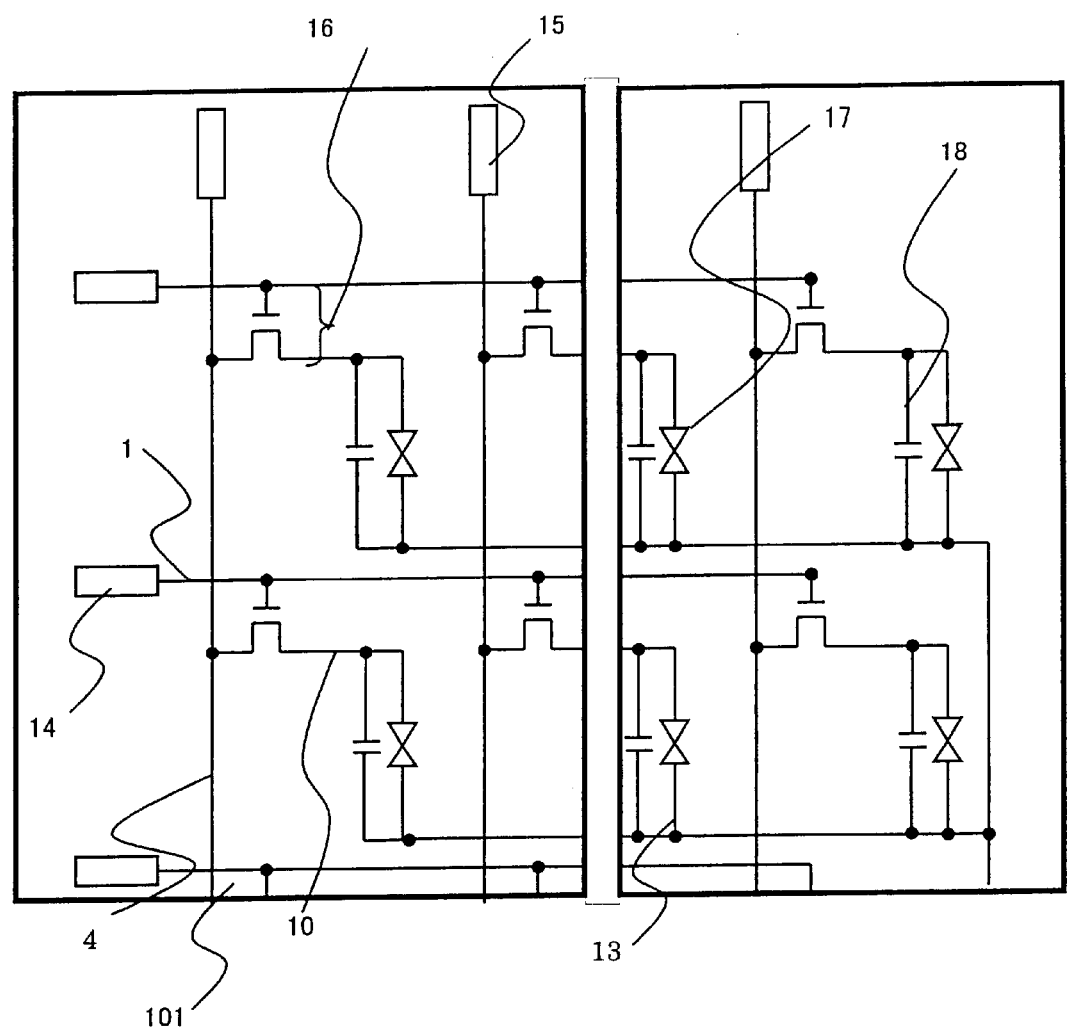

FIG. 63 is a detailed circuit diagram for an active matrix substrate for an IP system according a further embodiment of the present invention.

EXPLANATION OF NUMERALS 1, gate bus line
2, gate electrode
3, island
4, drain bus line
5, contact hole,
6, drain opening
7, source opening
8, slit
9, drain electrode
10, source electrode
11, pixel electrode
12, opening for storage capacitor
13, common electrode
14, gate terminal
15, drain terminal
16, transistor unit
17, liquid crystal
18, storage capacitor
19, common potential furnishing terminal
20, color filter layer (color layer)
21, black matrix;
22, protective element;
23, protective bus line (common bus line);
24, protective terminal (common potential supply terminal);
101, transparent insulating substrate
102, gate electrode layer
103, gate insulating film
104, a-Si layer
105, first passivation film
106, drain electrode layer
107, second passivation film
107a, organic inter-layer film
108, ITO
109, $n^+$ type a-Si layer.
110, capacitance electrode layer (storage capacitance electrode);
111, photoresist film;
112, color filter layer (color layer);
113, black matrix;
114, planarizing layer.

PREFERRED EMBODIMENTS OF THE INVENTION

In an active matrix substrate according to a preferred embodiment of the present invention, the gate electrode layer, gate insulating film and the a-Si layer are processed to the same shape to form a gate electrode layer (102 of FIG. 6) and a TFT area, and a drain electrode layer (106 of FIG. 6) is formed on a first passivation film (105 of FIG. 6) as an overlying layer. In a second passivation film (107 of FIG. 6) formed as an overlying layer of the drain electrode layer 106, there are provided with a first opening (through-hole) passing through the first and second passivation films and with a second opening passing through the second passivation film, and a connection wiring layer is formed by ITO of the uppermost layer (108 of FIG. 6), whilst a storage capacitance unit is provided in a pixel electrode for sandwiching the first and second passivation films in cooperation with an electrode layer formed as a co-layer as the gate electrode.

An embodiment of the present invention will be explained for further illustrating the present invention in detail.

Embodiment 1

Figure 1:
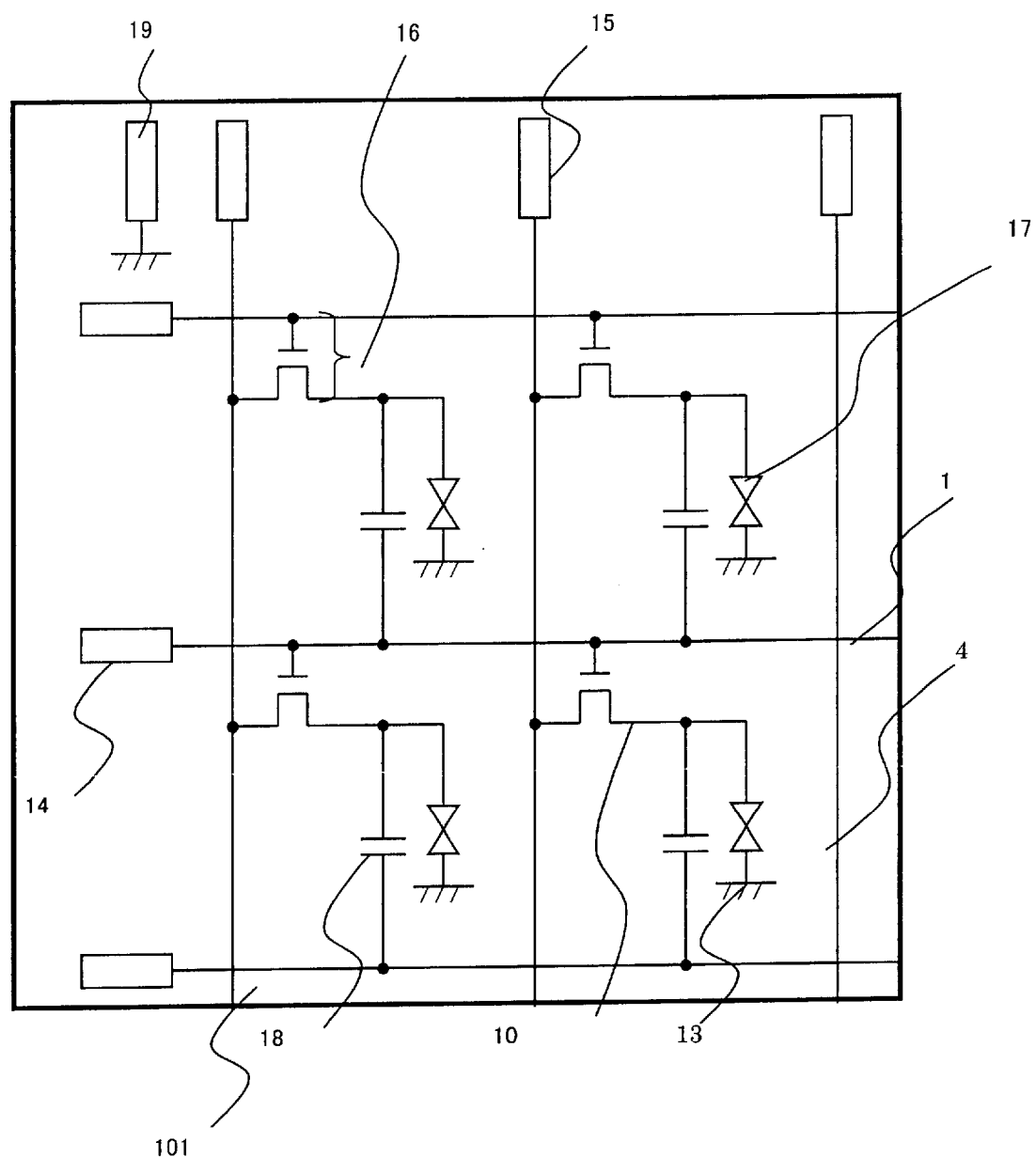
FIG. 1 is a circuit diagram for an active matrix substrate for a liquid crystal display apparatus of the TN system according to a first embodiment of the present invention.
Figure 2:
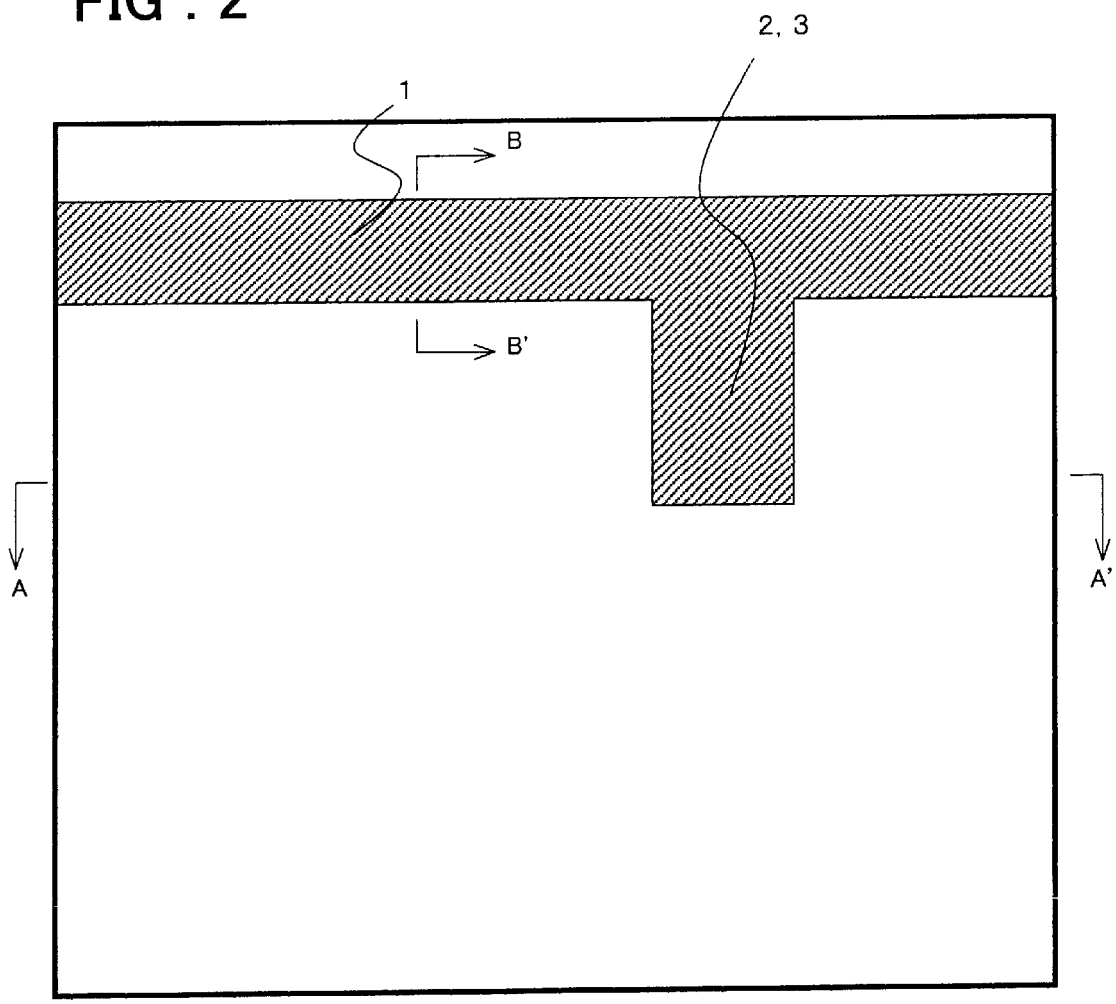
FIG. 2 is a schematic top plan view showing the manufacturing process for an active matrix substrate according to the first embodiment of the present invention.

Referring to FIGS. 1 to 9, a channel protection type active matrix substrate of the twist nematic (TN) system according to a first embodiment of the present invention, and a method for producing the substrate, are explained. FIG. 1 shows a circuit diagram of an active matrix substrate of the first embodiment of the present invention and FIGS. 2 to 5 are plan views showing the active matrix substrate and particularly an extracted pixel. FIG. 6 is a cross-sectional view showing a map for an active matrix substrate and particularly showing the cross-section along fine A–A' in FIGS. 2 to 5. FIGS. 7 to 9 are cross-sectional views, taken along line B–B" in FIG. 2, showing the cross-section of a gate terminal, a drain terminal and a gate storage unit.

The active matrix substrate of the first embodiment is a substrate for a liquid crystal display device of the twist nematic (TN) system configured for driving the liquid crystal by an orientation film provided on the active matrix substrate and another orientation film provided on a counter substrate. The active matrix substrate is such an active matrix substrate in which a gate electrode 2, a drain electrode 9 and a pixel electrode 11 are separated from one another on the layer basis by insulating films (see FIG. 5). An upper surface and a lateral surface of an a-Si layer constituting a thin film transistor are completely coated by first and second passivation films 105, 107 operating as channel protection films (see FIG. 6(d)).

The liquid crystal is sandwiched between an oriented film provided on the active matrix substrate and another oriented film provided on the opposite side substrate.

Referring to a circuit diagram of FIG. 1, the active matrix substrate includes plural gate bus lines 1 and plural drain bus lines 4, intersecting another on a transparent insulating substrate 101, and plural transistors 16 and pixel electrodes 11, arranged in the intersecting points. The terminal ends of the plural gate bus lines 1 and the drain bus lines 4 are arranged in a peripheral portion of the transparent insulating substrate 101 to form gate terminals 14 and drain terminals 15 fed with driving signals from outside the substrate. At a corner of the transparent insulating substrate 101 is formed a common potential supplying terminal 19. This common potential supplying terminal 19 performs the role of supplying a potential to a common electrode 13 provided on the opposite side substrate facing an active matrix substrate disposed to clamp the liquid crystal 17. Between each of transistors 16 and respective one of the neighboring gate bus lines 1 is formed a storage capacitor 18.

Figure 5:
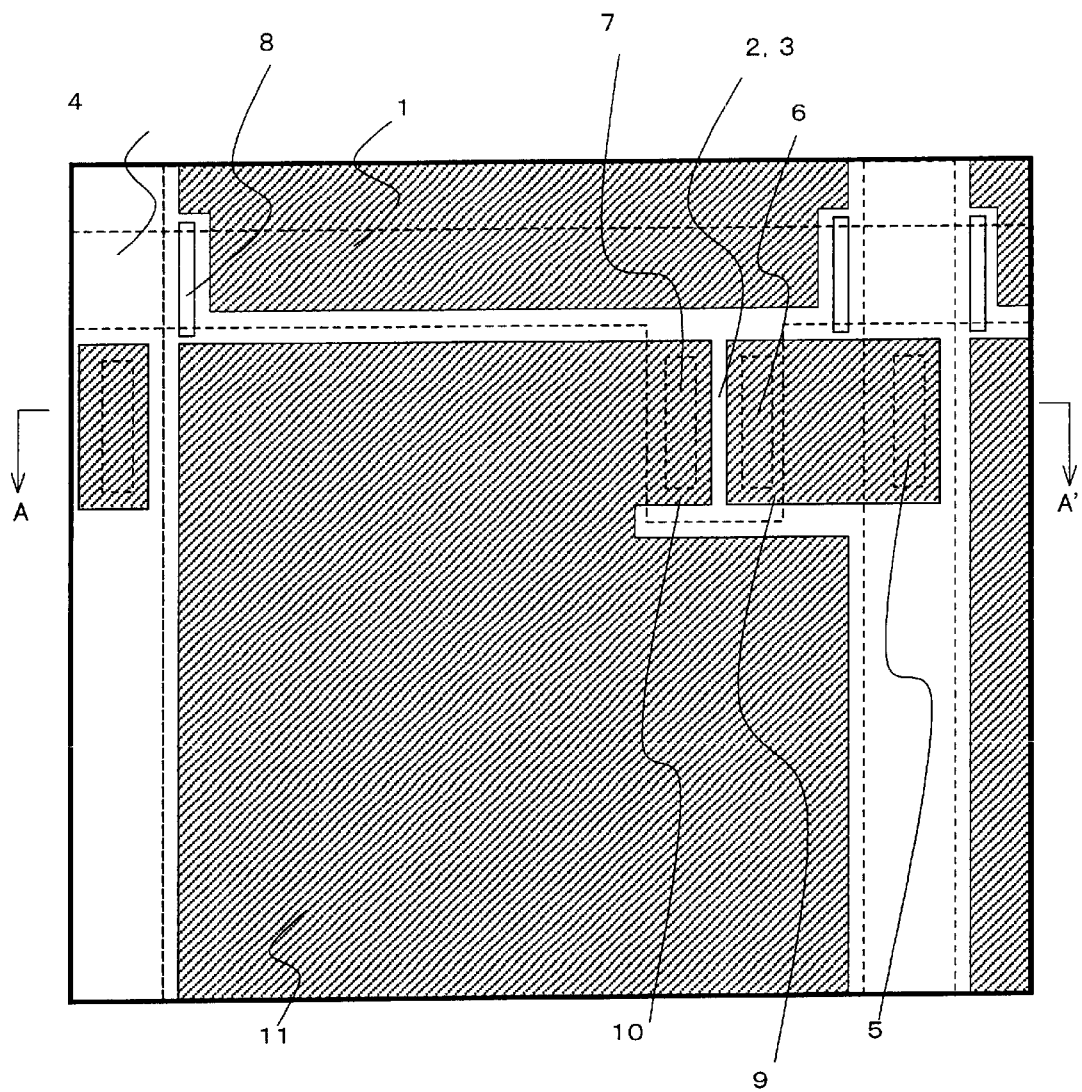
FIG. 5 is a schematic too plan view showing the manufacturing process for an active matrix substrate according to the first embodiment of the present invention.
Figure 6A:
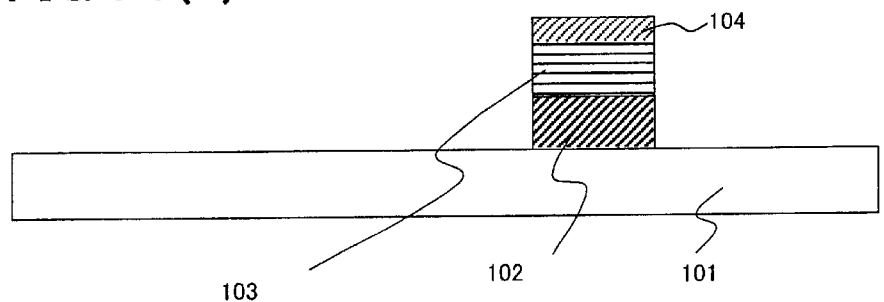
Figure 6B:
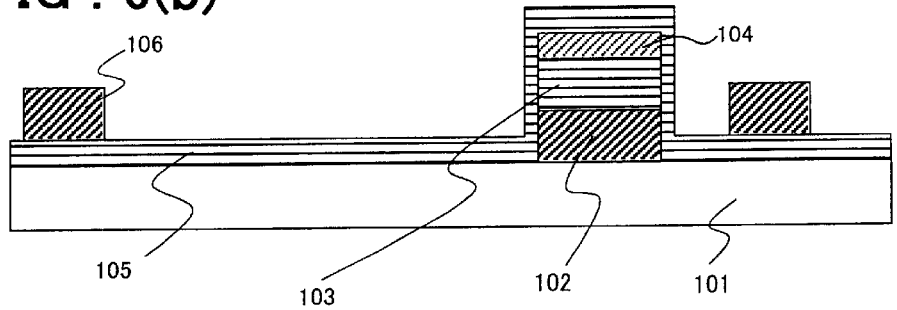
Figure 6C:
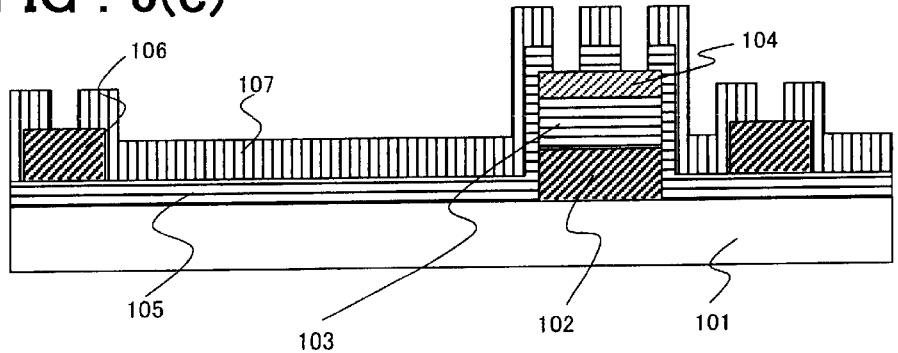
Figure 6D:
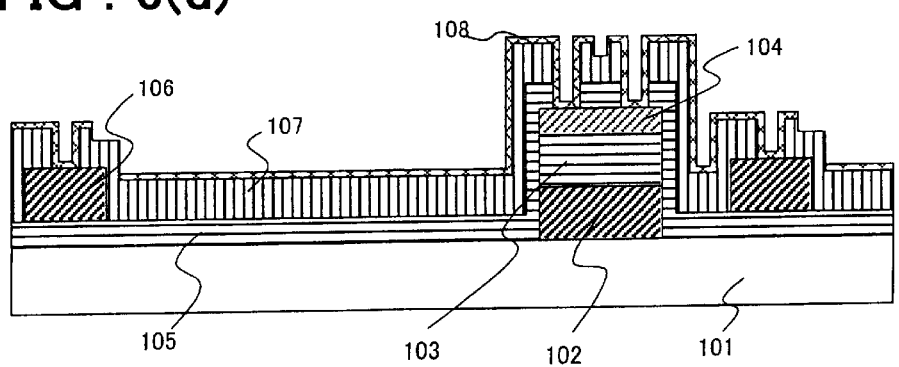

That is, Referring to FIGS. 5 and 6(d), the active matrix substrate of the present embodiment is comprised of a layered structure (i.e., laminate or stacked structure), made up of a gate electrode layer 102, a gate insulating film 103 and an a-Si layer 104, formed in a substantially overlapping or stacked fashion on a transparent insulating substrate 101, a first passivation film 105, formed generally over on the transparent insulating substrate 101 for overlying the layered product, a drain electrode layer 106, formed on the transparent insulating substrate 101 in a direction intersecting the layered structure, a second passivation film 107 formed on the first passivation film 105 for overlying the drain electrode layer 106, a source opening 7 and a drain opening 6, formed in the first and second passivation films 105, 107 for exposing the a-Si layer 104, a contact hole 5 formed in the second passivation film 107 for exposing the drain electrode layer 106, a drain electrode 9, formed by a transparent electrode, deposited on the second passivation film 107 for electrically connecting one end of the a-Si layer 104 to the drain electrode layer 106 through drain opening 6 and the contact hole 5, a source electrode 10 formed by a transparent electrode formed on the second passivation film 107 for electrically connecting the other end of the a-Si layer 104 through the source opening 7 and a pixel electrode 11 formed by a transparent electrode formed on the second passivation film 107, having its one end connected to the source electrode 10 and its other end extending to a gate of the neighboring pixel.

The layered structure, made up of a gate electrode layer 102, a gate insulating film 103 and an a-Si layer 104, formed in a substantially overlapping fashion, correspond to the gate bus lines 1 and to the gate electrode 2. The drain electrode layer 106 corresponds to the drain bus lines 4.

Moreover, the active matrix substrate of the present embodiment includes plural slits 8, as shown in FIG. 5. the slits 8 are provided in pairs above the gate bus lines 1 on both sides of the drain bus lines 4 at a location where the drain bus lines 4 intersects the gate bus lines 1. Stated differently, the slits 8 are formed above the gate bus lines 1 intermediate between one end of the pixel electrode 11, extending to above the gate electrode layer 102 for defining the storage capacitor 108 between it and the gate electrode layer 102, and the drain bus lines 4. These slits 8 are openings formed in the first and second passivation films 105, 107. The gate insulating film 103 and the a-Si layer 104 are removed in a location of the layered product where these slits 8 are formed. The gate bus lines 1 is of a three-layered structure comprised of the gate electrode layer 102, gate insulating film 103 and the a-Si layer 104 where the gate bus lines 1 intersect the drain bus lines 4. The paired slits 8, formed on both outer sides of the drain bus lines 4, serve to remove the gate insulating film 103 and the a-Si layer 104 so as to fractionate the a-Si layer 104 into plural shorter domains isolated from one another. In the absence of the slits 8, there are produced parasitic transistors to cause malfunction. By providing the slits 8, no parasitic transistors are produced to prevent the malfunction.

The manufacturing method for the active matrix substrate of the present embodiment is explained with reference to FIGS. 2 to 6. First, a gate electrode layer 102 comprised of an underlying layer (conductive layer) of e.g., Cr, Ti or Mo and Al, a gate insulating film 103 of, for example, SiNx (silicon nitride film) and an a-Si layer 104 which later becomes a semiconductor layer, are sequentially deposited on the transparent insulating substrate 101. In producing these films, the gate electrode layer 102 is formed by sputtering so that the underlying metal such as Cr is of a thickness of approximately 50 nm and Al is of a thickness of 0.2 $\mu$m, whilst the gate insulating film 103 and the a-Si layer 104 are formed by a plasma CVD method to a thickness of 0.5 μm and to a thickness of 0.3 to 0.4 μm, respectively.

Then, using a first mask, a resist pattern is formed in an area which later becomes a gate electrode 2 and a gate bus line 1, and the portions of the gate electrode layer 102, gate insulating film 103 and the a-Si layer 104, not covered by the resist pattern, are removed by dry etching, as shown in FIGS. 2 and 6(a).

Then, a first passivation film 105, such as SiNx, is formed by e.g., a plasma CVD method, whilst an underlying layer of metals, such as Ti, Cr or Mo, which later becomes the drain electrode layer 106, and a layered film of Al etc, are formed by e.g., a plasma CVD method, on the entire surface of a transparent insulating substrate 101. Preferably, the film thickness of the first passivation film 105 is approximately 0.2 μm, whilst the film thicknesses of the underlying layer of Ti and Al, as the drain electrode layer 106, are approximately 50 nm and 0.2 μm, respectively.

Figure 3:
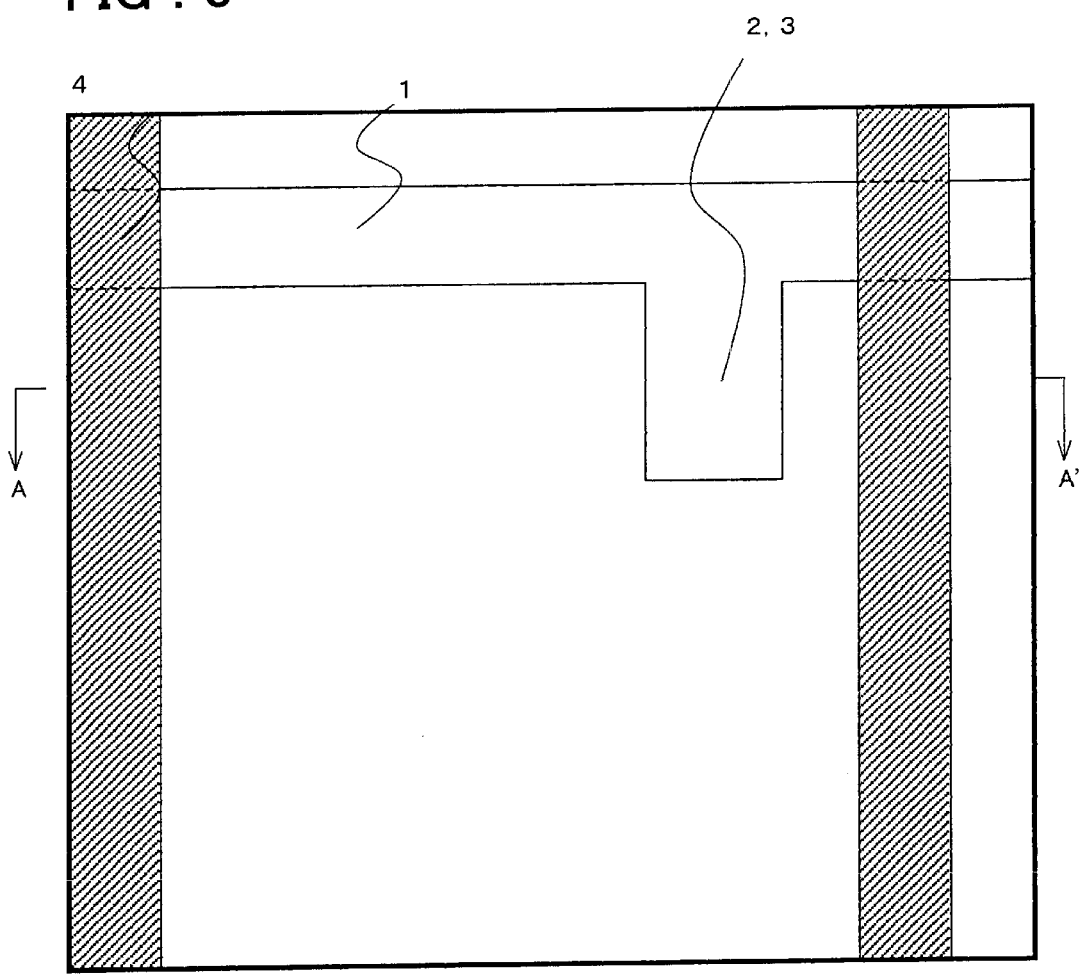
FIG. 3 is a schematic top plan view showing the manufacturing process for an active matrix substrate according to the first embodiment of the present invention.

After the film formation, a resist pattern is formed to overlie a drain bus line 4, using a second-mask, as shown in FIGS. 3 and 6(b), whilst an unneeded metal layer (part) is removed by dry etching, to form a dry buss line 4.

Figure 4:
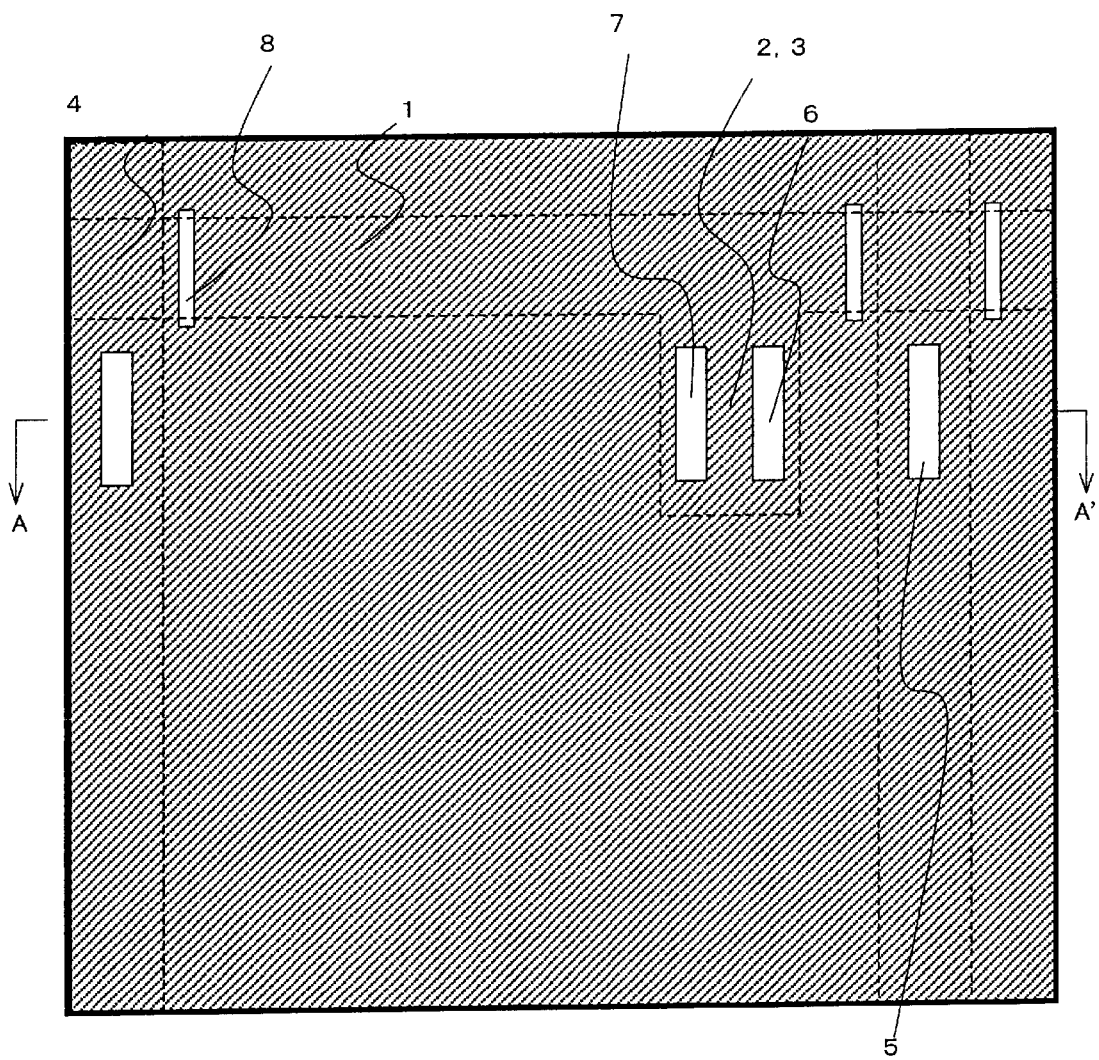
FIG. 4 is a schematic top plan view showing the manufacturing process for an active matrix substrate according to the first embodiment of the present invention.

Then, a second passivation film 107 of, for example, $SiO_2$, is formed by sputtering on the entire surface of the substrate 101 to a film thickness of the order of 0.2 μm. As for the material of the second passivation film 107, such a material is to be selected which has a sufficiently high etching selection ratio with respect to the a-Si layer 104 and a second passivation film 107 in order to enable optimum shaping of a contact hole 106 in the subsequent process. Then, using a third mask, a resist pattern having a source opening 7 and a drain opening 6 in an upper portion of the a-Si layer 104, slits 8 in the upper portion of the gate bus line 1 and the contact hole 5 in the upper portion of the drain bus line 4, are formed, and the exposed portions of the second passivation film 107 and the first passivation film 105 are removed by dry etching, to form the source opening 7, rain opening 8, slits 8 and the contact hole 5, as shown in FIGS. 4 and 6c.

Then, for forming ohmic connection to the a-Si layer 104, he substrate 101 is held in a $PH_3$ plasma atmosphere and phosphorus is diffused into the a-Si layer 104 to form a n$^+$ layer a superficial layer. As the processing conditions, a $PH_3/H_2$ (0.5% $PH_3$) gas may be supplied at 1000 SCCM, at approximately 300° C., using a plasma CVD device, and processing may be carried out for five minutes at a pressure of 200 Pa and an RF power of 0.1 W/cm$^2$.

Then, an ITO film 108, which later becomes a pixel electrode 11, is formed by sputtering on the entire surface of the substrate 101 to a thickness of approximately 50 nm. Using a fourth mask, unneeded part of the ITO film 108 is wet-etched, to interconnect a source electrode 10 and the pixel electrode 11, as well as to interconnect a drain electrode 9 and the drain bus line 4, as shown in FIGS. 5 and 6d. Although the ITO film 108 is used in the present embodiment as the pixel electrode, it is also possible to use ZnO, in place of Sn of ZnO or ITO, in place of using the ITO film 108.

Finally, the a-Si layer 104 and the gate insulating film 103 are removed by dry etching, using the ITO film 108 as a mask, to prepare an active matrix substrate configured as shown in FIG. 6d.

The ITO film 108 is used as an etching mask. In removing the a-Si layer 104 and the gate insulating film 103, the first passivation film 105 and the second passivation film 107 are also (selectively) removed according to a mask pattern. In the slits 8, the exposed first passivation film 105, second passivation film 107, a-Si layer 104 and the gate insulating film 103 are removed to separate the a-Si layer 104 on the TFT basis.

If the present manufacturing method is used, the gate terminals 14, drain terminals 15 and the storage capacitor 18, shown in the circuit diagram of FIG. 1, are of the structure shown in FIGS. 7 to 9. Meanwhile, (a) to (d) of FIGS. 7 to 9 show cross-sections (B–B' of FIG. 2) in the steps of FIGS. 6(a) to (d).

Figure 7A:
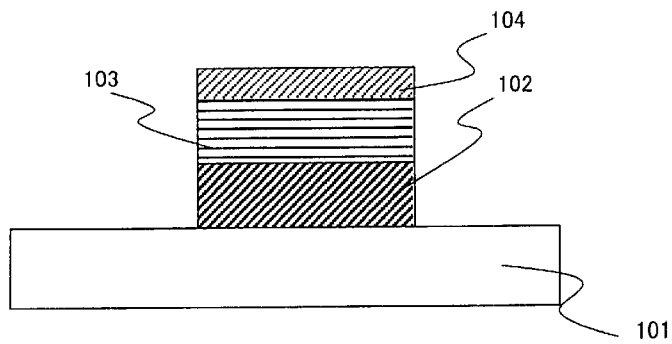
Figure 7B:
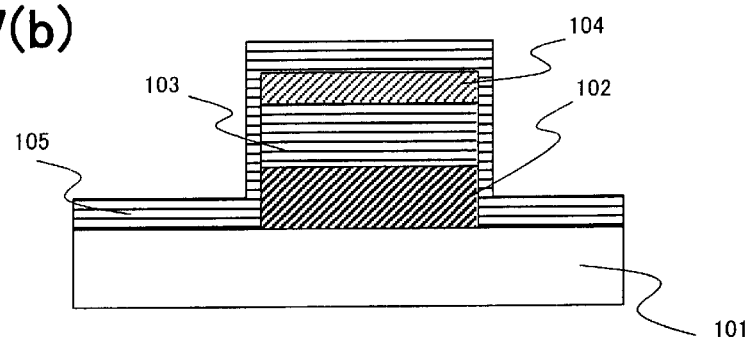
Figure 7C:
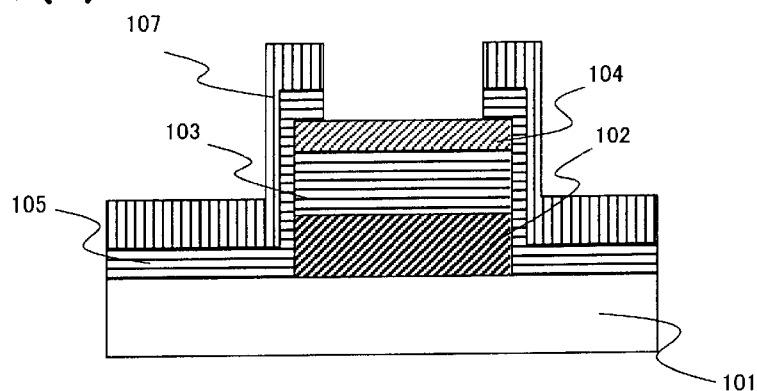
Figure 7D:
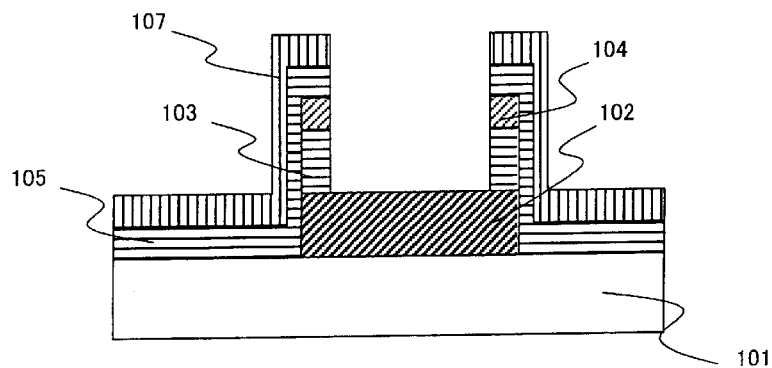

As for the gate terminals 14, the a-Si layer 104 of the layered structure is exposed, as shown in FIG. 7(c), when the surface of the a-Si layer 104 is exposed in the process shown in FIG. 6(c). The ITO film 108 is deposited, such as by sputtering, on the entire surface of the transparent insulating substrate 101. The ITO film 108, formed on the gate terminals 14, is removed by wet etching, using the aforementioned fourth mask. Subsequently when the dry etching is performed, using the ITO film 108, shown in FIG. 6(d), the a-Si layer 104 and the gate insulating film 103 are removed by dry etching, in the gate terminals 14, as shown in FIG. 7(d), to expose the underlying gate electrode layer 102 to complete the gate terminals 14. Meanwhile, since there is no ITO film 108 in the vicinity of the gate terminals 14, during this dry etching, the second passivation film 107 also is reduced in film thickness under the effect of dry etching.

Figure 8A:
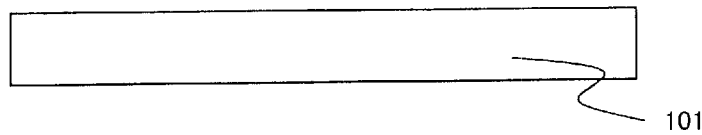
Figure 8B:
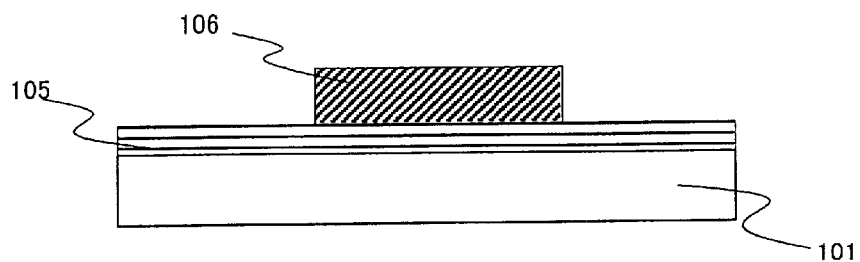
Figure 8C:
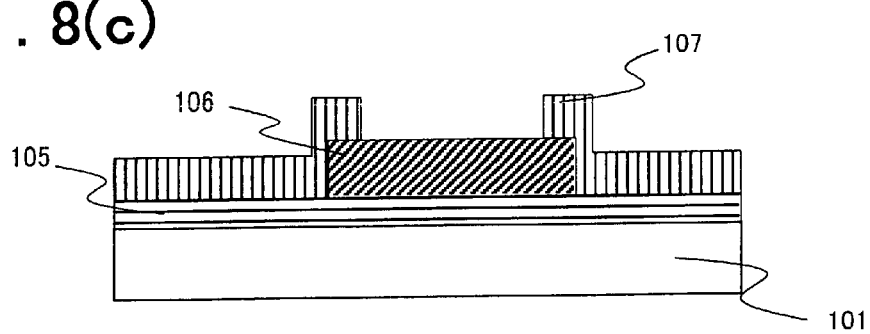
Figure 8D:
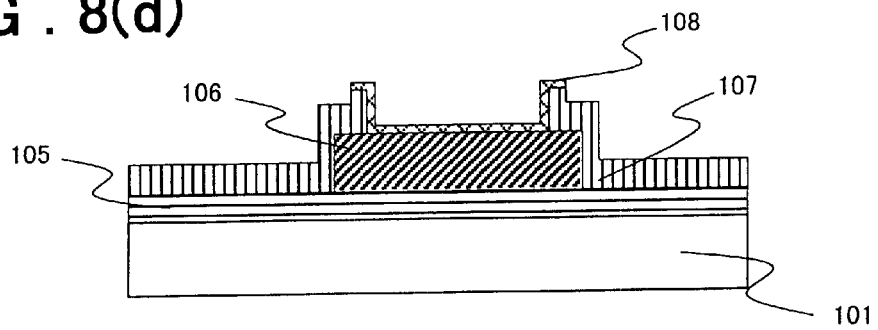

As for the drain terminals 15, when the surface of the a-Si layer 104 of the layered product is exposed, the drain electrode layer 106 is exposed, as shown in FIG. 8(c). The ITO film 108 then is deposited, such as by sputtering, on the entire surface of the transparent insulating substrate 101. With the use of the fourth mask, there is left in the drain terminals 15 the ITO film 108 connected to the drain electrode layer 106 through the opening. When dry etching is then performed, using the ITO film 108 shown in FIG. 6(d) as a mask, the second passivation film 107, where there is formed no ITO film 108 in the peripheral part of the drain terminals 15, is dry etched and thus reduced in film thickness, as shown in FIG. 8(d). This completes the drain terminals 15, as shown in FIG. 8(d).

Figure 9A:
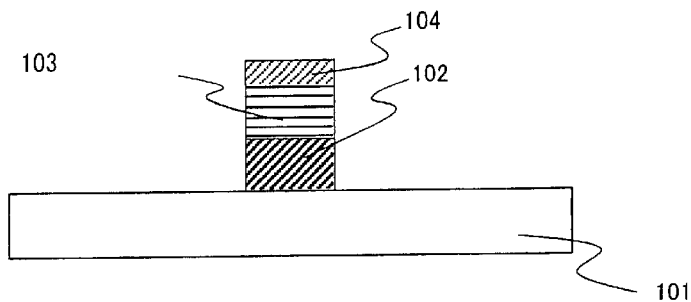
Figure 9B:
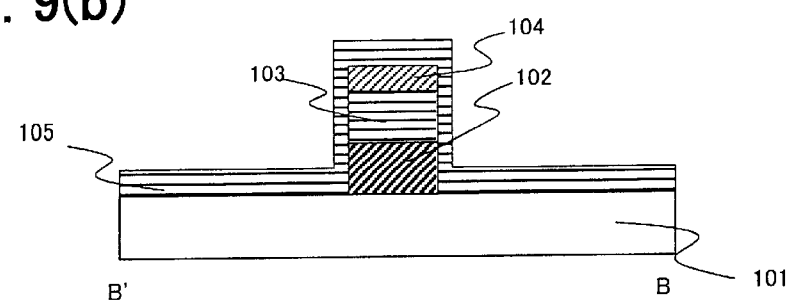
Figure 9C:
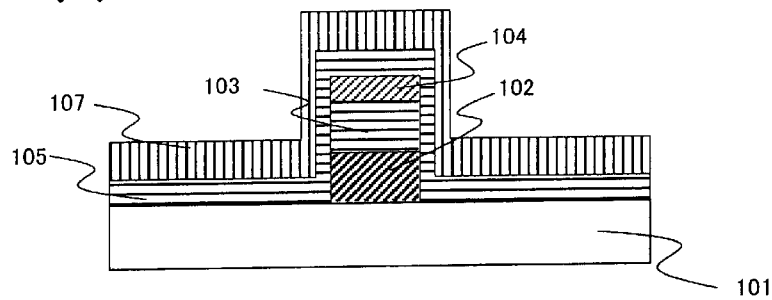
Figure 9D:
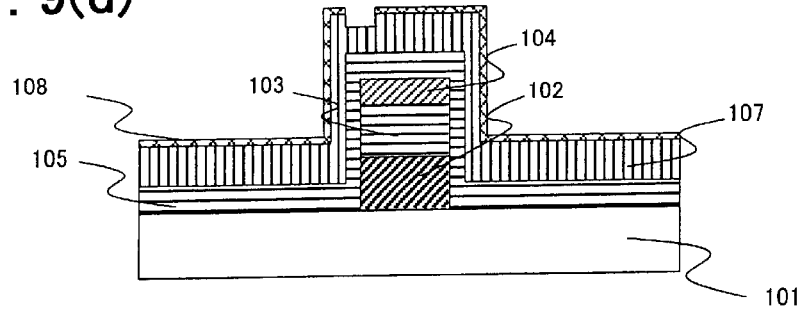

As for the storage capacitor 18, the ITO film 108 is formed, such as by sputtering, on the entire surface of the transparent insulating substrate 101, following the process shown in FIG. 9(c). Using the fourth mask, unneeded portions of the ITO film 108 is removed by wet etching, whereby a pixel electrode 11 is formed for extending at its one end to above the gate electrode layer 102 of the layered product. If dry etching then is performed, using the ITO film 108 shown in FIG. 6(d) as a mask, the second passivation film 107 between the neighboring pixel electrodes 11 is subjected to the effect of dry etching and thereby reduced in film thickness, as shown in FIG. 9(c). In this manner, there is produced in the storage capacitor 18 such a structure in which the first and second passivation films 105, 107 sandwiched between the gate electrode layer 102 and the ITO film 108 operating as a storage capacitance electrode (capacitance electrode layer).

In this manner, <the active matrix substrate> of the present embodiment includes a layered structure (product) of the gate electrode layer 102, gate insulating film 103 and the a-Si layer 104, deposited in a substantially stacked fashion on the transparent insulating substrate 101. And it is produced by forming the first passivation film 105 on the transparent insulating substrate 101 for overlying the layered structure, forming the drain electrode layer 106 on the first passivation film 105, forming the second passivation film 107 on the first passivation film 105 for overlying the drain electrode layer 106, forming the source opening 7 and the drain opening 6 in the first and second passivation films 105, 107 for exposing the a-Si layer 104, forming the source electrode 10 on the second passivation film 107 so as to be electrically connected to the other end of the a-Si layer 104 through the source opening 7, and by forming the pixel electrodes 11 on the second passivation film 107 so that one ends thereof are formed integrally with the source electrode 10. So, there can be realized an active matrix substrate in which the gate electrode 2, drain electrode 9 and the pixel electrode 11 are separated from one another on the layer basis, and in which the surface and sidewall sections of the a-Si layer 104 of the layered structure are covered by the first and second passivation films 105, 107. This prevents the ITO film from contacting the lateral side of the a-Si layer 104 while improving the long-term reliability of the thin film transistor and active matrix substrate into which this thin film transistor is realized. Moreover, if the active matrix substrate is arranged as a liquid crystal display device, it is possible to prevent the a-Si layer from contacting the liquid crystal material.

In addition, in the manufacturing method for the active matrix substrate of the present embodiment, a layered structure (product) of the gate electrode layer 102, gate insulating film 103 and the a-Si layer 104 is formed and is covered by the first passivation film 105, the drain electrode layer 106 is deposited on the first passivation film 105, the second passivation film 107 is deposited to cover the drain electrode layer 106 and the first passivation film 105, the source opening 7 and the drain opening 6 for exposing the a-Si layer 104 are formed in the first and second passivation films 105, 107, the source electrode 10 electrically connected to the opposite end of the a-Si layer 104 through the source opening 7 is provided on the second passivation film 107 and the pixel electrodes 11 having one ends connected integrally to the source electrode 10 are provided on the second passivation film 107.

In the manufacturing method for the active matrix substrate of the present embodiment, there may be formed a channel protection type active matrix substrate in which the gate electrode 2, drain electrode 9 and the pixel electrode 11 are separated on the layer basis by respective insulating films, whilst the surface and the sidewall of the a-Si layer 104 are completely covered by the first passivation film 105 and the second passivation film 107 by merely four masks. So, the production method may be simplified by at least one PR process as compared to the conventional manufacturing process.

If the manufacturing method of the preferred embodiment is used, the structures of a gate terminal 14, a drain terminal 15 and a storage capacitor 18 are as shown in FIGS. 7, 8 and 9, respectively. It is noted that (a) to (d) of FIGS. 7 to 9 show cross-sections in the same process steps as those of FIGS. 6(a) to (d) respectively.

The reason the gate terminal 14, drain terminal 15 and the storage capacitor 18 are configured as shown is that the first passivation film 105, second passivation film 107, the a-Si layer 104 and the gate insulating film 103 have been removed in the process of FIG. 6d, with the ITO film 108 as an etching mask. The gate terminal unit 104 is formed by an exposed portion of the gate electrode layer 102, whilst the drain terminal 15 is comprised of the ITO film 108 layered on the drain electrode layer 106. The storage capacitor 18 is comprised of the first and second passivation films 105, 107 sandwiched between the gate electrode layer 102 and the ITO film 108 operating as a storage capacity electrode. On the other hand, the a-Si layer 104 is separated on the TFT basis by a slit 8 provided in the gate bus line 1. It is noted that a common potential furnishing terminal 19 for furnishing the common potential to a common electrode 13 of the liquid crystal may be manufactured to be of the same structure as the gate terminal 14 or the drain terminal 15.

Embodiment 2

Referring to FIG. 10, a channel protection type active matrix substrate according to a second embodiment of the present invention will be explained with reference to FIG. 10, which is a cross-sectional view along line A–A' in FIGS. 2 to 5, for illustrating the manufacturing process of the active matrix substrate. It is noted that the difference of the present second embodiment and the above-described first embodiment resides in that an organic interlayer film 107a is deposited on the second passivation film 107 operating as a channel protection film to further flatten out the substrate simultaneously. In other respects, for example, in material types, film thicknesses or the manufacturing methods, the second embodiment is similar to the above-described first embodiment.

Figure 10A:
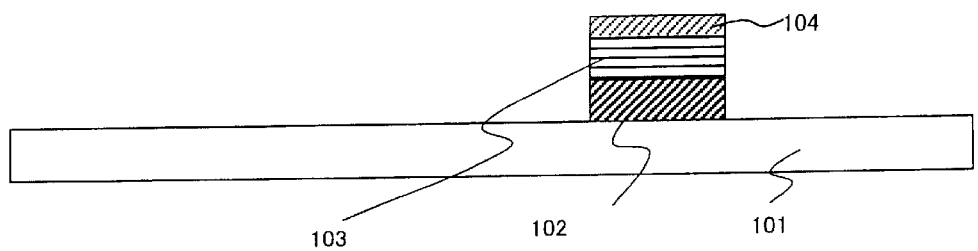

The manufacturing method of the active matrix substrate of the present second embodiment is now explained. First, the gate electrode layer 102, comprised of deposited Ti or Al, the gate insulating film 103 of e.g. SiNx, and the a-Si layer 104, operating as a semiconductor layer, are sequentially deposited on a transparent insulating substrate 101 of, e.g., glass, as in the first embodiment. Then, using a first mask, the gate electrode 2 and the gate bus line 1 are formed, using the first mask, as shown in FIG. 10(a).

It is noted that such formation of the gate bus lines 1 means forming the layered product comprised of the gate electrode layer 102, gate insulating film 103 and the a-Si layer 104, operating as the gate bus lines 1.

Figure 10B:
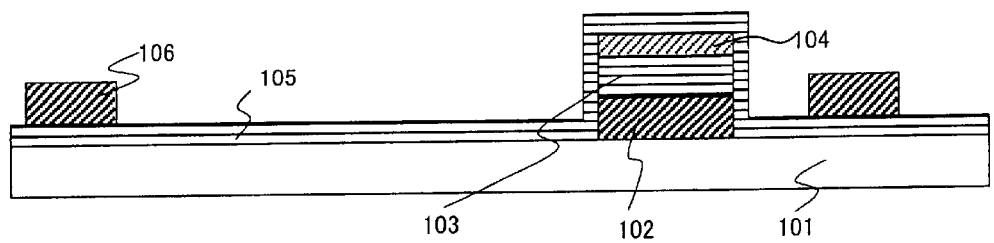

Then, the first passivation film 105 of e.g., SiNx, is formed by the plasma CVD method, and an underlying layer of e.g., Ti, Cr or Mo, operating as a drain electrode layer 106, and a layered film of Al, are formed by e.g., sputtering, on the entire surface of the transparent insulating substrate 101. Then, using a second mask, metal layers other than the drain bus line 4 are removed by e.g., dry etching, as shown in FIG. 10b. The second passivation film 107 of e.g., $SiO_2$ then is formed on the entire substrate surface.

In the first embodiment, the second passivation film 107 is formed to a film thickness of 0.2 $\mu$m as a film thickness necessary for channel protection. The present second embodiment features depositing an organic inter-layer film 107a on the second passivation film 107 to achieve substrate planarization simultaneously.

Figure 10C:
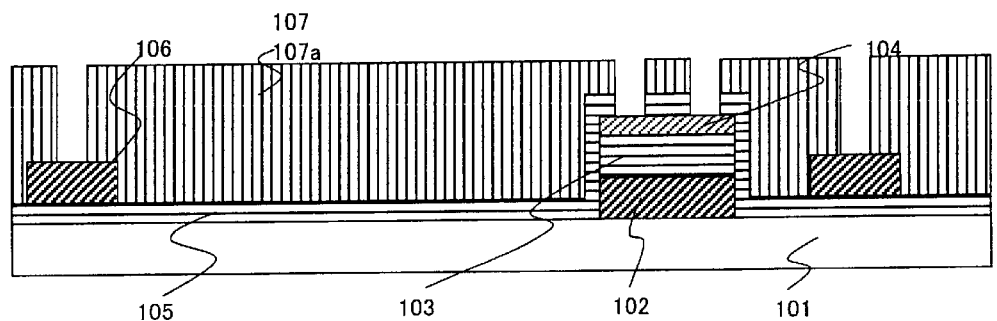

The organic inter-layer film 107a is formed of, for example, acrylic resin, BCB (benzocyclobutene) or polyimide. By depositing this organic material to a thickness of the order of 0.2 to 1.0 $\mu$m, the substrate can be planarized, as shown in FIG. 10(c). By providing this organic inter-layer film 107a, it is possible to evade the problem of the liquid crystal orientation state becoming non-uniform due to TFT step difference.

That is, by providing the organic inter-layer film 107a, it is possible to diminish the TFT step difference to render the state of liquid crystal orientation more uniform.

As other methods for planarization, there are such a method in which film forming conditions, such as film forming rate or temperature, for $SiO_2$ of the second passivation film 107, to form a film of a coarse film quality, and a method in which dual coarse $SiO_2$ films are formed on a dense $SiO_2$ film.

In changing the film forming rate of $SiO_2$, the usual film forming rate of the order of 100 nm/min may be enlarged to the order of 200 nm/min for planarization. By increasing the film forming rate in this manner, it is possible to shorten the film forming time.

If the function as the insulating film is lowered due to coarsened $SiO_2$ film quality, it is possible to deposit a dense SiNx film on the underlying layer at a usual film forming rate to approximately 0.1 μm to increase the film forming rate subsequently to deposit the film by approximately 1 μm to achieve the functions of both channel protection and planarization.

Then, using a third mask, a source opening 7 in the upper portion of the a-Si layer 104, a drain opening 6 are formed, whilst a pre-set contact hole 5 is formed in each of the gate bus line 1 and the drain bus line 4, as shown in FIG. 10(c). For realizing ohmic connection to the a-Si layer 104, phosphorous is diffused in a $PH_3$ plasma atmosphere into the a-Si layer 104 to deposit an $n^+$ layer as its surface layer. The ITO film 108, which later becomes the pixel electrode 11, is then deposited on the entire surface of the substrate 101 and, using a fourth mask, the source electrode 10 is connected to the pixel electrode 11, while the drain electrode 9 is connected to the drain bus line 4, as shown in FIG. 10(d).

Figure 10D:
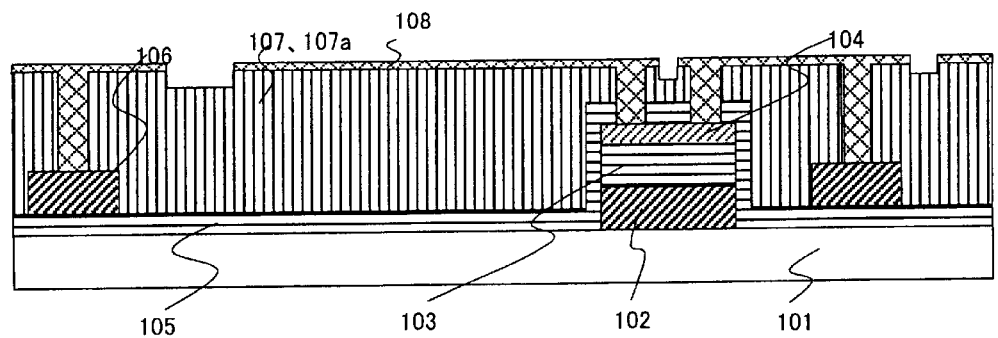

Finally, the a-Si layer 104 and the gate insulating film 103 are removed on dry etching, using the ITO film 108 as a mask, to complete the active matrix substrate configured as shown in FIG. 10(d).

With the manufacturing method of the present embodiment, as described above it is possible to assure protection of the a-Si layer 104 further, and to reduce the step difference of the thin film transistors. By reducing the step difference to planarize the substrate, the substrate separation from the counter substrate can be made uniform to provide for a uniform orientation state of the liquid crystal sandwiched between the substrates.

Moreover, in the active matrix substrate of the present embodiment, since the organic inter-layer film 107a which planarizes the substrate 107 is deposited on the second passivation film 107, the a-Si layer 104 can be protected more reliably than in the first embodiment.

Moreover, in the manufacturing method of the present embodiment, since there can be realized a channel protected type active matrix substrate is provided in which the gate electrode 2, drain electrode 9 and the pixel electrodes 11 are separated on the layer basis solely by the insulating films with four masks and in which the surface and the sidewall sections of the a-Si a layer 104 are completely covered by the first and second passivation films 105, 107 and the organic inter-layer film 107a, the process can be simplified at least one PR as compared to the case of the conventional manufacturing method.

Embodiment 3

Referring to FIGS. 11 to 16, an active matrix substrate according to a third embodiment of the present invention and the manufacturing method therefor are explained. FIGS. 11 to 14 are top plan views showing the manufacturing process for the active matrix substrate and particularly an extracted pixel. FIG. 15 is a cross-sectional view showing the manufacturing process for the active matrix substrate of the third embodiment and particularly showing the cross-section along line C–C' in FIGS. 11 to 14. FIG. 16 is a cross-sectional view, taken along line D–D' in FIG. 11, showing a gate storage unit of an active matrix substrate of the third embodiment.

The present third embodiment differs from the above-described first embodiment in that metal which later becomes the capacitance electrode layer 110 is deposited via a first passivation film 105 at a pre-set position on the gate bus line (see FIG. 12) to increase the capacity of the storage capacitor 18, and is otherwise the same in structure as the above-described first embodiment.

Referring to FIGS. 11 to 15, the manufacturing method for an active matrix substrate of a vertical electrical field (TN) system is explained. First, a gate electrode layer 102, comprised of underlying metal layers of Cr, Ti or Mo, and an Al layer, a gate insulating film 103 of, for example, SiNx, and an a-Si layer 104, as a semiconductor layer, are sequentially deposited on a transparent insulating substrate 101 of e.g. glass. Then, using a first mask, the gate electrode 2 and the gate bus line 1 are formed, as shown in FIGS. 11 and 15(a).

Figure 15A:
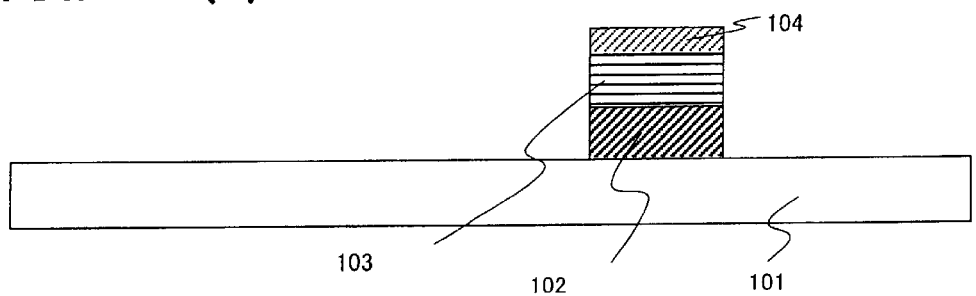
Figure 15B:
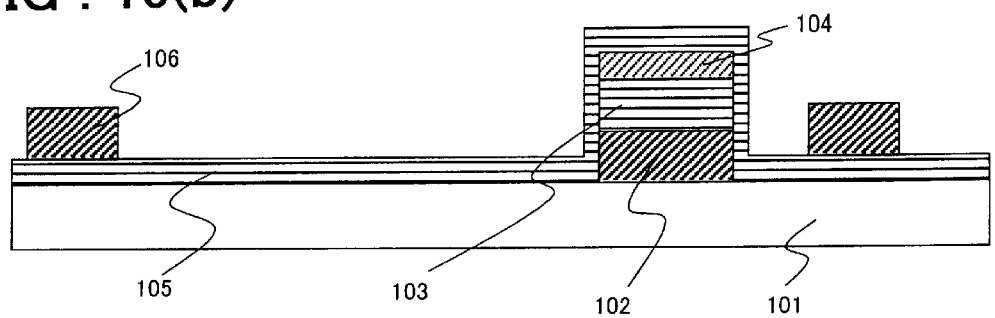

Then, a first passivation film 105 of, for example, SiNx, underlying metal layers of, for example, Ti, Cr or Mo, and a layered film of, for example, Al, which later becomes the drain electrode layer 106, are deposited sequentially on the entire surface of the transparent insulating substrate 101. Then, using a second mask, a drain bus line 4 is formed, as shown in FIGS. 12 and 15(b). The present embodiment features employing this drain electrode layer 106 as a storage capacity electrode of the storage capacitor 18 to improve the capacity.

It is noted that forming the drain bus lines 4 means forming the drain electrode layer 106 operating as the drain bus lines 4. In the present embodiment, the capacitance electrode layer 110 is deposited above the gate bus lines 1 located between the neighboring drain bus lines 4 simultaneously with formation of the drain electrode layer 106. This capacitance electrode layer 110 operates as the storage capacitance electrode of the storage capacitor 18 formed between it and the gate electrode layer 102.

Figure 15C:
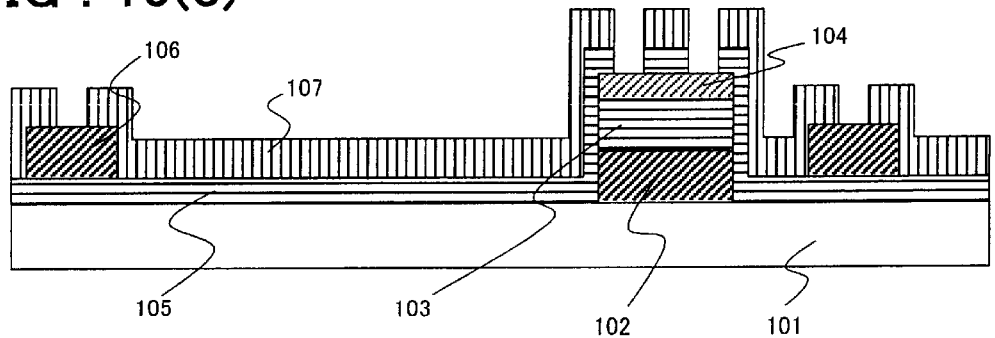

Then, a second passivation film 107 of, for example, $SiO_2$, is formed on the entire surface of the substrate 101 and, using a third mask, the source and drain openings 7, 6 in the upper portions of the a-Si layer 104, slits 8 in the upper portions of the gate bus lines 1, a contact hole 5 in the upper portion of the drain bus line 4 and an opening 121 for storage capacitor in the upper portion of the storage capacity electrode 110, are formed, as shown in FIGS. 13 and 15(c). For achieving ohmic connection to the a-Si layer 104, phosphorous is diffused into the a-Si layer 104 in the $PH_3$ plasma atmosphere to form a $n^+$ layer on the surface of the a-Si layer 104.

Figure 15D:
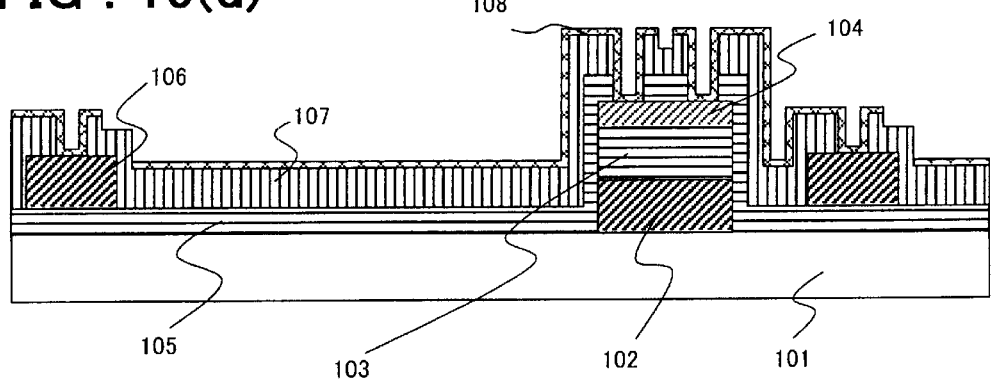
Figure 16A:
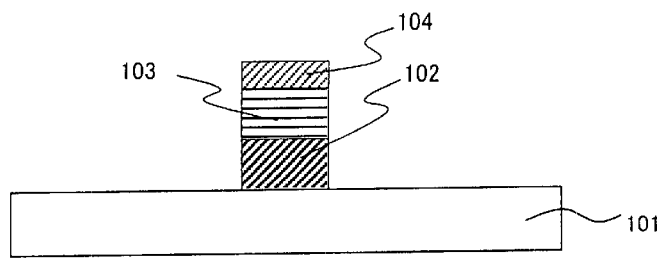
Figure 16B:
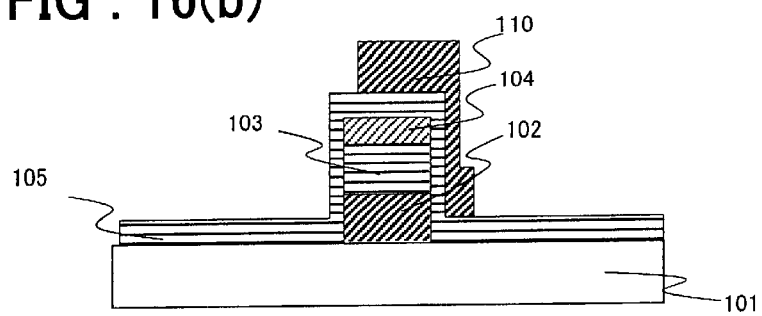
Figure 16C:
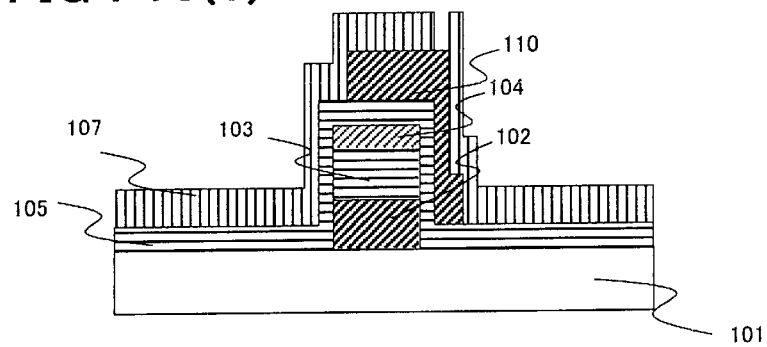
Figure 16D:
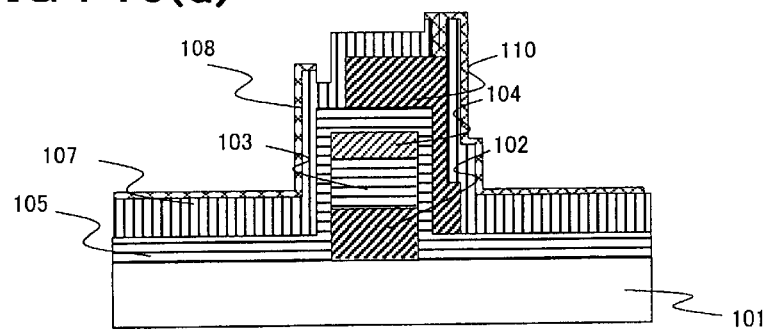

Then, an ITO film 108, which later becomes the pixel electrode 11, is deposited on the entire surface of the substrate 101 and, using a fourth mask, the source electrode 10 is connected to the pixel electrode 11, while the drain electrode 9 is connected to the drain bus line 4 and a connection line to the storage capacity electrode is formed, as shown in FIGS. 14 and 15(d). Using the ITO film 108 as a mask, the a-Si layer 104 and the gate insulating film 103 are etched off to complete the active matrix substrate configured as shown in FIG. 15(d).

The capacitance electrode layer 110 and the pixel electrodes 11 are interconnected via an, opening for storage capacitor 12. The a-Si layer 104 and the gate insulating film 103 are etched off in the present embodiment at the time of etching to separate the a-Si layer 104 on the layer basis.

The storage capacitor 18 prepared by the method of the present embodiment is configured as shown in FIG. 16. The reason this is achieved is that the drain electrode layer 106 is left in the area of the storage capacitor 18 in the process of FIG. 15(b). Since only the first passivation film 105 is sandwiched between the gate electrode layer 102 and the storage capacity electrode 110, the storage capacity may be increased as compared to that of the above-described first embodiment.

It is noted that the step of FIG. 15(b) is the process of forming the drain electrode layer 106, and that, in the present embodiment, the distance between opposing electrodes can be shorter than that in the first embodiment.

In the above-described manufacturing method for the active matrix substrate of the present embodiment, the gate electrode layer 102, drain electrode layer 106 and the pixel electrode 11 are separated from layer to layer solely by four masks to realize a channel protection type active matrix substrate in which the ITO film 108 is mounted as an uppermost layer, thus simplifying the manufacturing process at least by one PR as compared to the conventional manufacturing process.

Moreover, the capacitance electrode layer 110 is formed simultaneously with the step of forming the drain electrode layer 106, whilst the opening for storage capacity 12 interconnecting the capacitance electrode layer 110 and the pixel electrodes 11 is formed simultaneously with the step of forming the source opening 7 and the drain opening 6, the storage capacitance of the storage capacitor 18 can be larger than in the first embodiment, subject to change in the mask pattern, without increasing the number of masks.

Moreover, the film thickness of the first or second passivation film may be increased, the film forming conditions for $SiO_2$ may be suitably changed, or films of different film quality may be layered together for substrate planarization.

The organic inter-layer film may also be effective to improve planarization.

Embodiment 4

Referring to FIGS. 17 to 22, a channel protection type active matrix substrate of the transverse electronic field system according to a fourth embodiment of the present invention, and a manufacturing method therefor, are explained. FIG. 17 is a circuit diagram of an active matrix substrate for the liquid crystal display device of the TN system according to the fourth embodiment of the present invention. FIGS. 18 to 21 are top plan views showing the manufacturing process for an active matrix substrate and particularly showing an extracted sole pixel. FIG. 22 is a cross-sectional view for illustrating the manufacturing process for the active matrix substrate and specifically is a cross-sectional view taken along line E–E' in each of FIGS. 18 to 21.

The present embodiment differs from the above-described first embodiment in that, in the present embodiment, the manufacturing method of the present invention is applied to an active matrix substrate of the lateral electrical field system in which the liquid crystal orientation is controlled by the electrical field between the comb-shaped common electrode and the pixel electrode. The basic manufacturing method of the present embodiment is otherwise the same as that of the above-described first embodiment.

Referring to FIGS. 18 to 22, the manufacturing method for the active matrix substrate of the lateral electrical field system is explained. First, a gate electrode layer 102, comprised of a layered structure of an underlying metal layer of Cr, Ti or Mo, and Al, a gate insulating film 103 of e.g., SiNx, and an a-Si layer 104 which becomes a semiconductor layer, are sequentially deposited on a transparent insulating substrate 101 of, for example, glass. Then, using a first mask, a resist pattern is formed in an area which later becomes the gate electrode, gate bus line 1 and the common electrode 13, and the portions of the gate electrode layer 102, gate insulating film 103 and the a-Si layer 104, not covered with the resist pattern, are removed on dry etching, as shown in FIGS. 18 and 22(a).

Then, plural gate bus lines 1 and the comb-shaped common electrode 13 arranged between these gate bus lines 1 are formed. Part of the gate bus lines 1 operates as the gate electrode 2.

Figure 22A:
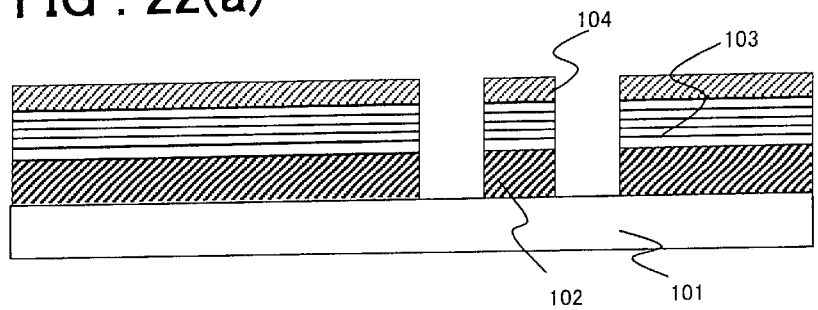
Figure 22B:
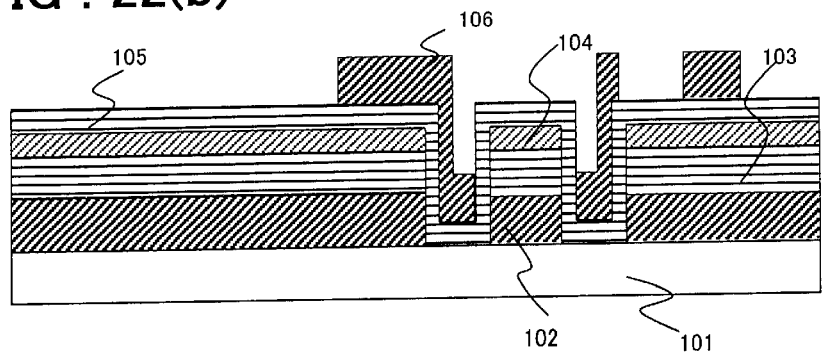

The first passivation film 105 of, for example, SiNx, is then formed by, for example, the plasma CVD method, on the entire surface of the transparent insulating substrate 101, while the underlying metal layers of Ti, Cr or Mo, which later become the drain electrode layer 106, and the layered film of, for example, Al, are formed e.g., by sputtering thereon. Then, using a second mask, the drain bus line 4 and the pixel electrode 1 hare formed, as shown in FIGS. 19 and 22(b).

It is noted that the drain bus lines 4 are extended in a direction intersecting the gate bus lines 1 and are branched on the first passivation film 105 between the gate bus lines 1 and the common electrode 13. The pixel electrodes 11 are arranged between the plural drain bus lines 4 and are comb-shaped.

Figure 22C:
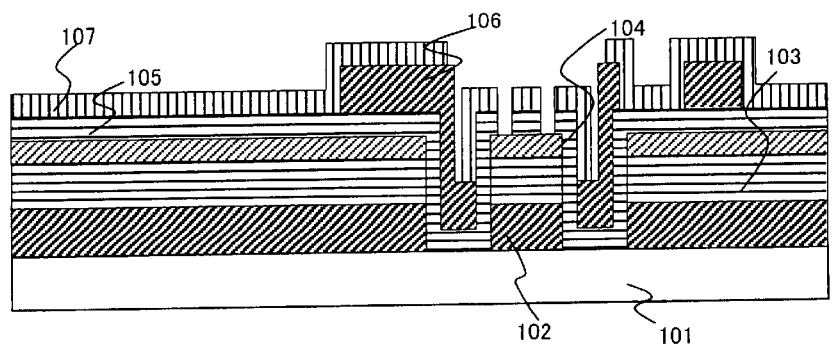

A second passivation film 107 of, for example, $SiO_2$, then is formed on the entire substrate surface. Then, using a third mask, a source opening 7 in the upper portion of the a-Si layer 104, a drain electrode layer 6, slits 8 on the gate bus lines 1 and a contact hole in an upper portion of each of the drain bus line 4 and the pixel electrode 11, are formed as shown in FIGS. 20 and 22(c).

Figure 22D:
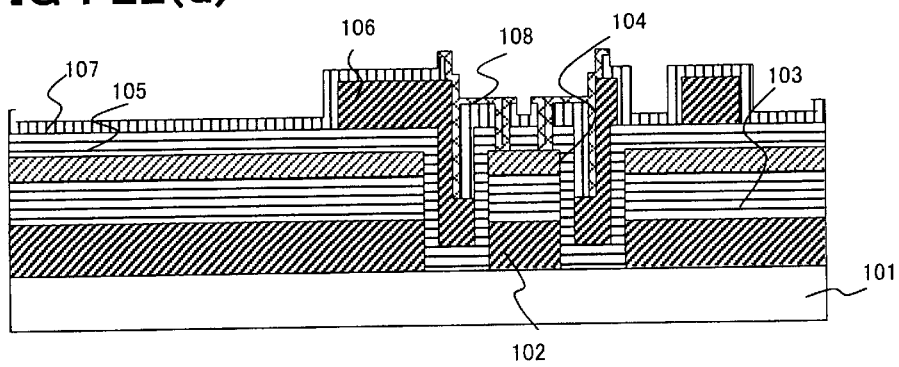

For achieving ohmic connection to the a-Si layer 104, phosphorous is diffused into the a-Si layer 104 in the $PH_3$ plasma atmosphere to form a $n^+$ layer on the surface of the a-Si layer 104. Then, an ITO film 108, which later becomes the pixel electrode 11, is deposited on the entire surface of the substrate 101. Using a fourth mask, pre-set interconnection is formed, as shown in FIG. 21. Finally, the a-Si layer 104 and the gate insulating film 103 are removed on dry etching, using the ITO film 108 as a mask, to complete the active matrix substrate configured as shown in FIG. 22(d).

It is noted that the pre-set interconnection interconnects the a-Si layer 104 and the pixel electrodes 11 through the source opening 7 and the contact hole 5, while interconnecting the a-Si layer 104 and the drain bus lines 4 through the drain opening 6 and the contact hole 5.

In the present embodiment, the a-Si layer 104 and the gate insulating film 103 are again etched off at the time of etching to separate the a-Si layer 104 from one TFT to another.

In the present embodiment, the active matrix substrate used in the liquid crystal display device of the TN system may be manufactured by no more than four masks so that the process can be simpler at least by one PR than with the conventional manufacturing method.

Moreover, by increasing the film thickness of the first and second passivation films, by suitably changing the film forming conditions form $SiO_2$, or by layering films of different film quality, as in the above-described second embodiment, it is possible to realize substrate planarization.

It is noted that there is an additional capacity 18 which is formed by an overlapping layer configuration at marked area 19 (FIG. 19) between the common electrode 13 and the pixel electrode 11. The capacity 18 is not shown in FIG. 17, which can be ideally realized by a purely intermeshing comb-shaped arrangement of both the electrodes 13 and 11 without overlapping.

Embodiment 5

A channel protection type active matrix substrate of the TN system, according to a fifth embodiment of the present invention, and the manufacturing method therefor, are explained by referring to FIGS. 23 to 34. FIG. 23 is a communication diagram of the active matrix substrate according to the fifth embodiment of the present invention and FIGS. 24 to 27 are upper plan views schematically showing the manufacturing process of the active matrix substrate according to the fifth embodiment of the present invention and particularly showing its sole pixel. FIGS. 28 and 29 are cross-sectional views schematically showing the manufacturing process for explaining the method for forming the gate bus lines and the gate electrodes employing stepped photoresists used in the present embodiment, with the cross-section being taken along line H–H' in FIG. 24. FIG. 30 is a cross-sectional process diagram showing the manufacturing process of the active matrix substrate according to the fifth embodiment of the present invention, with the cross-section being taken along line F–F' in FIG. 27. FIGS. 31 to 33 are cross-sectional process diagrams showing the manufacturing process for the gate terminal, drain terminal gate storage unit (taken along line G–G' of FIG. 24) of the active matrix substrate of the fifth embodiment of the present invention. FIG. 34 is a cross-sectional view schematically showing the structure of the gate drain connection of the active matrix substrate of the fifth embodiment of the present invention.

The present fifth embodiment differs from the above-described first embodiment in that the gate bus lines 1 differ in cross-section in the vicinity of the gate electrode 2 branched from the gate bus lines 1, in that the manufacturing method is used for providing the different cross-sectional shape, and in that, in the active matrix substrate of the present embodiment, a protective element 22 is provided in the gate terminals 14 and in the drain terminals 15. The present embodiment is the same as the above-described first embodiment in other respects, such as in structure, material, film thickness or the manufacturing method.

The active matrix substrate of the present embodiment has a structure similar to that of FIG. 1 showing a circuit diagram of the first embodiment. In addition, the active matrix substrate includes a protective bus line (common bus line) 23 formed parallel to the gate bus lines 1 and the drain bus lines 4 in the vicinity of the transparent insulating substrate 101, a protective element 22, realized between the protective bus line 23 on one hand and the gate terminals 14 and the drain terminals 15 on the other hand, and a protective terminal unit (common potential supplying terminal) 24 for imparting the potential to the protective element 22, as shown in the communication diagram of FIG. 23. The protective element 22 is comprised of a pair of diode-connected transistors connected in the forward and reverse directions across the respective gate terminals 14 and the drain terminals 15 on one hand and the protective bus line 23 on the other hand. The transistor of the protective element 22 is formed simultaneously in the manufacturing process of the transistors 16 of the display area.

Specifically, the active matrix substrate of the present embodiment includes a layered structure, made up of a gate electrode layer 102, a gate insulating film 103 and an a-Si layer 104, formed in a substantially overlapping fashion on a transparent insulating substrate 101, a first passivation film 105, formed on the transparent insulating substrate 101 for overlying the layered product, a drain electrode layer 106, formed on the first passivation film 105 in a direction crossing the layered product, a second passivation film 107 formed on the first passivation film 105 for overlying the drain electrode layer 106, a source opening 7 and a drain opening 6, formed in the first and second passivation films 105, 107 for exposing the a-Si layer 104, a contact hole 5 formed in the second passivation film 107 for exposing the drain electrode layer 106, a drain electrode 9, formed by an ITO film, deposited on the second passivation film 107 for electrically connecting one end of the a-Si layer 104 to the drain electrode layer 106 through the drain opening 6 and the contact hole 5, a source electrode 10 formed by an ITO film formed on the second passivation film 107 for electrically connecting the other end of the a-Si layer 104 through the source opening 7, and a pixel electrode 11 formed by an ITO film 108 formed on the second passivation film 107, having its one end connected to the source electrode 10 and its other end extending to the gate of the neighboring pixel.

The layered structure, made up of a gate electrode layer 102, a gate insulating film 103 and an a-Si layer 104, formed in a substantially stacked fashion, correspond to the gate bus lines 1 and to the gate electrode 2. The drain electrode layer 106 corresponds to the drain bus lines 4.

The active matrix substrate of the present embodiment is not provided with the slits used in the first to fourth embodiments.

Referring to FIGS. 24 to 33, a manufacturing method for an active matrix substrate of the present embodiment is explained. First, a gate electrode layer 102, obtained on layering underlying metals, such as Cr, Ti or Mo, and Al, on the transparent insulating substrate 101, such as glass, a gate insulating film 103 of e.g., SiNx (silicon nitride film) and an a-Si layer 104, which later serves as a semiconductor laser, are sequentially deposited on a transparent insulating substrate 101 of e.g., glass.

In the present embodiment, a photoresist film 111 having a stepped cross-sectional shape then is formed, using a first mask, as shown in FIG. 28(a). The photoresist film 111 is formed on the a-Si layer 104 so as to have a stepped cross-section, with the upper portion of the gate electrode layer 102 operating as the gate bus lines 1, being thin in thickness, and with the upper portion of the gate electrode layer 102, operating as the gate electrode 2, branched from the gate bus lines 1, being thicker in thickness, with the gate electrode layer 102 being stepped in cross-section. The photoresist film 111, having the stepped cross-section, can be formed by the half-tone light exposure method.

In the half-tone light exposure method, a half-tone light exposure mask, for example, is used. This half-tone light exposure mask has an opaque portion, a portion permitting transmission of a certain volume or percentage (e.g., half) of light and a portion completely permitting light transmission. Since the resist portion directly below the opaque portion of the mask is not exposed to light, there is formed a thicker portion of the photoresist film 111 shown in FIG. 28(a). Since the resist portion lying below the mask portion permitting transmission of a certain volume of light has a portion of its film thickness so that a thin portion of the photoresist film 111 shown in FIG. 28(a) is formed. The resist portion lying below the mask portion completely permitting light transmission is exposed to light for the entire film thickness so that there is formed a portion devoid of the photoresist film 111, as shown in FIG. 28(a). So, with the half-tone light exposure method, there is formed a photoresist film 111 having different film thicknesses, that is having a stepped cross-sectional shape.

Figure 30A:
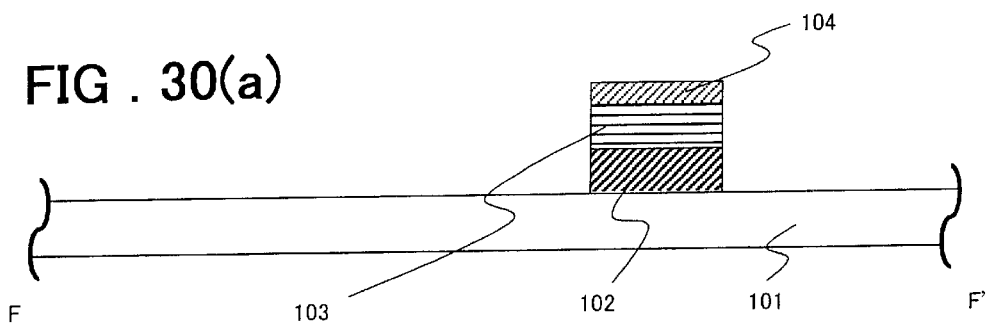

The gate electrode layer 102, gate insulating film 103 and the a-Si layer 104 of the area not covered with the photoresist film 111 are then removed by dry etching. This transparent insulating substrate 101 is processed with plasma $O_2$ to reduce the film thickness of the photoresist film 111 to remove the portion of the thin photoresist film 111 above the gate electrode layer 102 operating as the gate bus lines 1 to expose the a-Si layer 104 as shown in FIG. 28(c). The a-Si layer 104 and the gate insulating film 103 are then removed by dry etching, using the remanent photo resist film 111 as a mask, as shown in FIG. 29(a). The gate insulating film 103 and the a-Si layer 104 are left on the gate electrode layer 102 operating as the gate electrode 2. In this portion, the layered structure is realized. The photoresist film 111 then is removed, as shown in FIGS. 29(b), 24 and 30(a).

The first passivation film 105 of, for example, SiNx, is deposited on the entire surface of the transparent insulating substrate 101, whilst a layered film comprised of underlying metal such as Ti, Cr or Mo, which later serves as the drain electrode layer 106, and Al, is formed thereon by e.g., the sputtering method. The first passivation film 105 is formed on the transparent insulating substrate 101 for covering the gate electrode layer 102 in the gate bus lines 1 and for covering the layered product of the a-Si layer 104, gate insulating film 103 and the gate electrode layer 102 in the gate electrode 2.

Figure 30B:
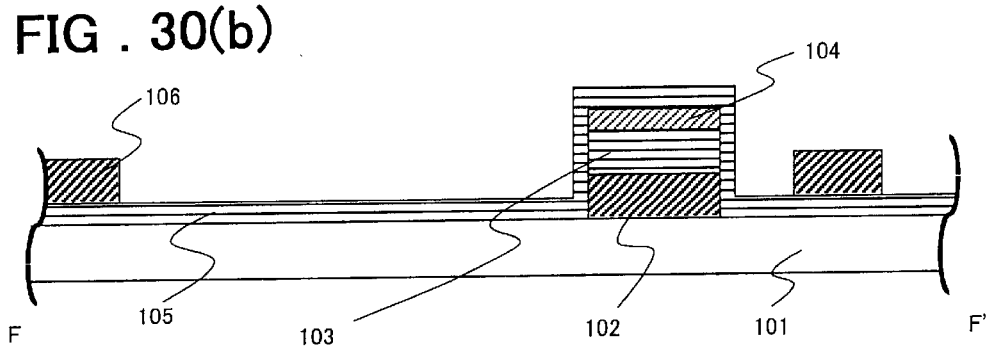

After the film formation, a resist pattern is formed for overlying the drain bus lines 4, using a second mask as shown in FIGS. 25 and 30(b). Then, an unneeded metal layer is removed by dry etching to form the drain electrode layer 106 operating as the drain bus lines 4.

Figure 30C:
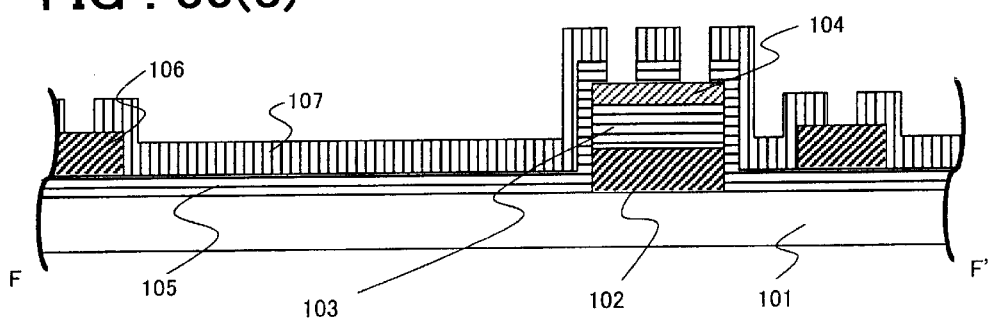

The second passivation film 107 of e.g., $SiO_2$ then is formed on the entire surface of the transparent insulating substrate 101. Then, using the third mask, a resist pattern for forming the source opening 7 and the drain opening 6 in an upper portion of the a-Si layer 104 and the contact hole 5 in an upper portion of the drain bus lines 4 is formed, using a third mask, as shown in FIGS. 26 and 30(c). The second passivation film 107 and the first passivation film 105 are removed by dry etching to realize the source opening 7, drain opening 6 and the pre-set contact hole 5. Then, for producing the ohmic connection to the a-Si layer 104, the transparent insulating substrate 101 is held in the $PH_3$ plasma atmosphere to diffuse phosphorus into the a-Si layer 104 to form a $n^+$ layer as an upper surface layer.

Figure 30D:
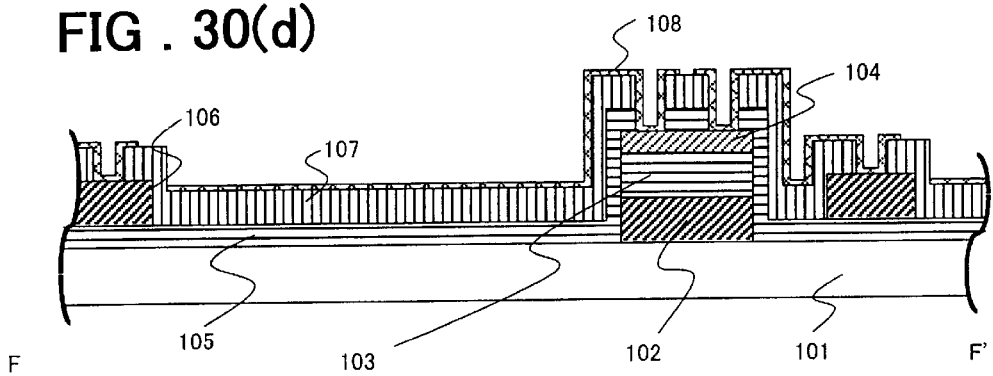

The ITO film 108, which serves as the pixel electrodes 11, is then formed on the entire surface of the transparent insulating substrate 101. Using a fourth mask, unneeded film ITO film 108 is wet-etched, to interconnect a source electrode 10 and the pixel electrode 11, as well as to interconnect a drain electrode 9 and the drain bus line 4, as shown in FIGS. 27 and 30d. So, the active matrix substrate of the structure shown in FIG. 30(d) is produced.

If the manufacturing method of the preferred embodiment is used, the structures of a gate terminal 14, a drain terminal 15 and a storage capacitor 18 are as shown in FIGS. 31, 32 and 33, respectively. It is noted that (a) to (d) of FIGS. 31 to 33 show cross-sections in the same process steps as those of FIGS. 30(a) to (d), respectively.

Figure 31A:
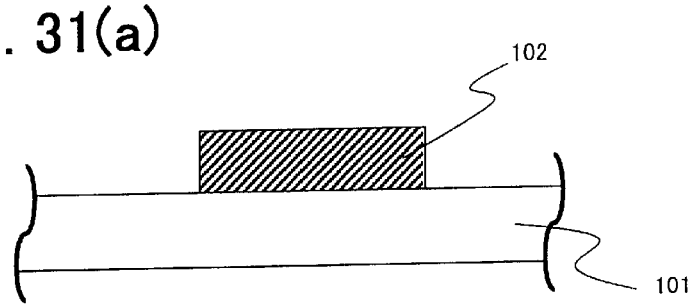
Figure 31B:
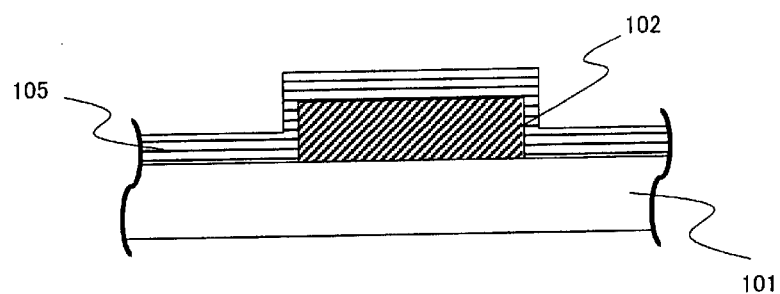
Figure 31C:
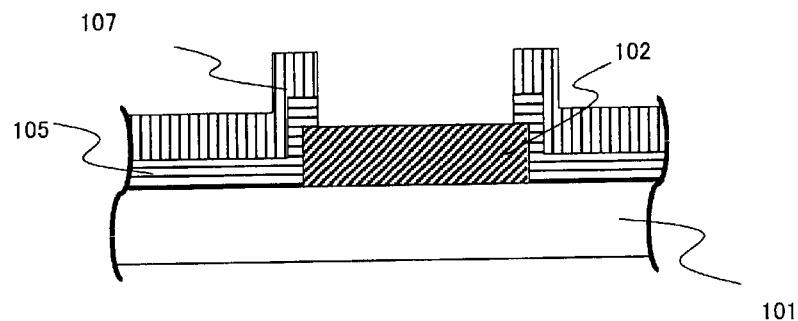
Figure 31D:
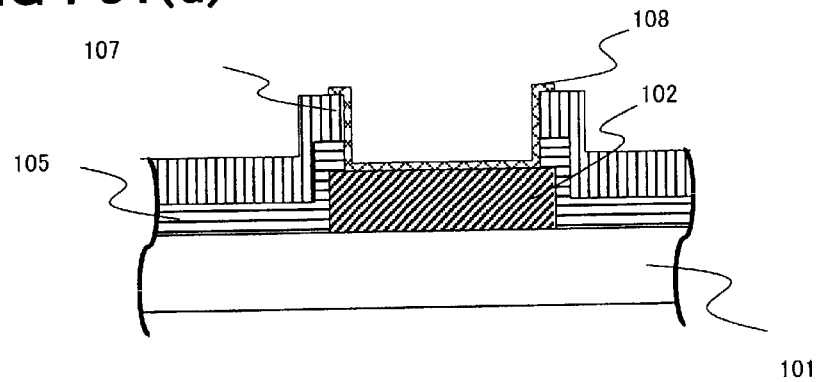

In the gate terminals 14, the first and second passivation films 105, 107 are etched during the process shown in FIG. 30(c), so that, when the surface of the a-Si layer 104 of the layered product is exposed, the gate electrode layer 102 is exposed, as shown in FIG. 31(c). The ITO film 108 then is deposited, such as by sputtering, on the entire surface of the transparent insulating substrate 101. The aforementioned fourth mask is used so that the ITO film 108 connected to the gate electrode layer 102 via the opening is left in the gate terminals 14. This completes the drain terminals 15 shown in FIG. 31(d).

Figure 32A:
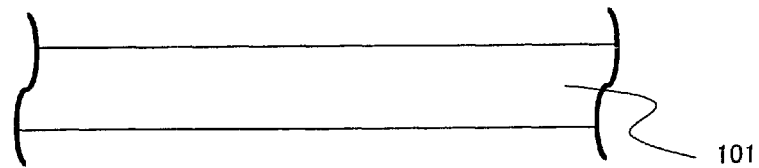
Figure 32B:
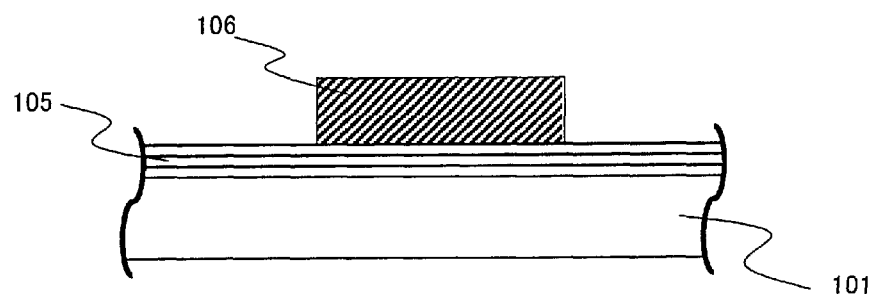
Figure 32C:
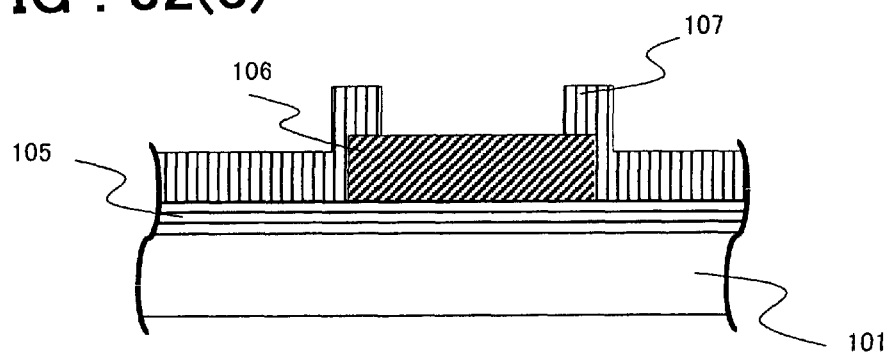
Figure 32D:
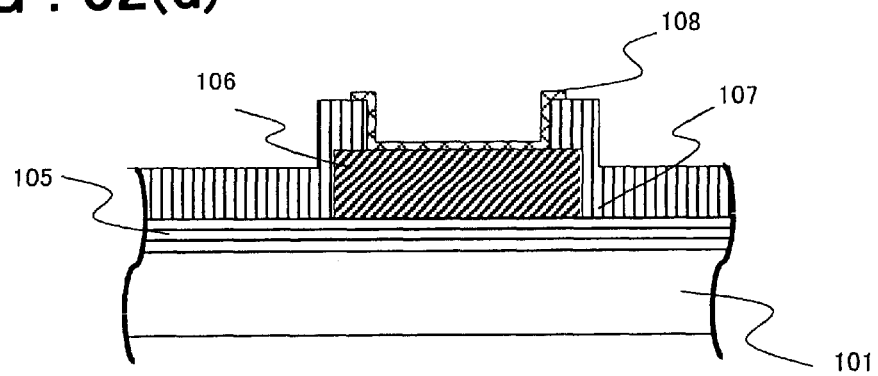

Moreover, in the drain terminals 15, the first and second passivation films 105, 107 are etched by the process shown in FIG. 30(c), so that, when the surface of the a-Si layer 104 of the layered product is exposed, the drain electrode layer 106 is exposed with the second passivation film 107 etched off, as shown in FIG. 32(c). The ITO film 108 then is deposited on the entire surface of the transparent insulating substrate 101, such as by sputtering. The aforementioned fourth mask is used so that the ITO film 108 connected to the drain electrode layer 106 via the opening is left in the drain terminals 15. This completes the drain terminals 15 shown in FIG. 32(d).

Figure 33A:
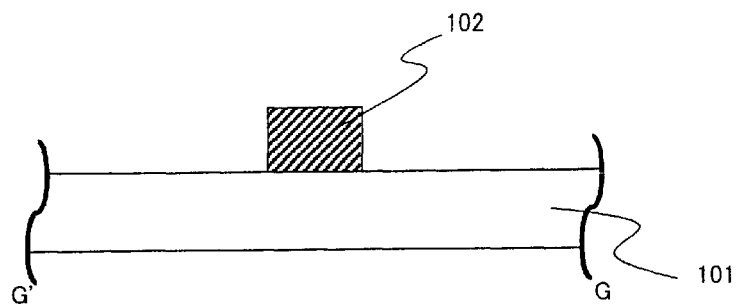
Figure 33B:
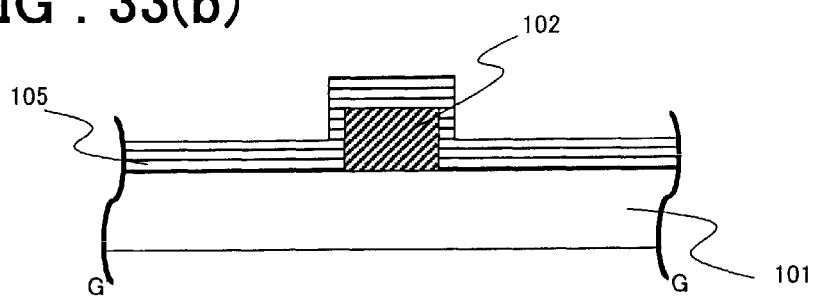
Figure 33C:
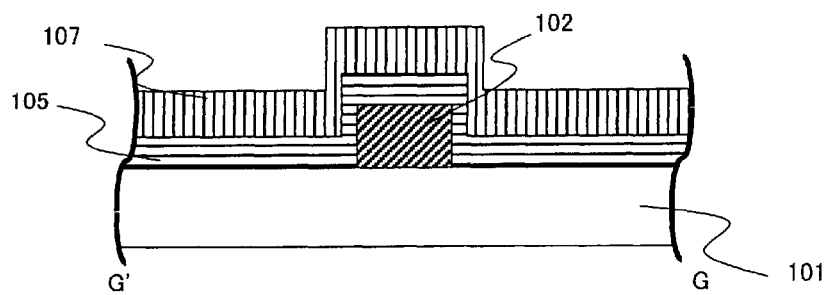
Figure 33D:
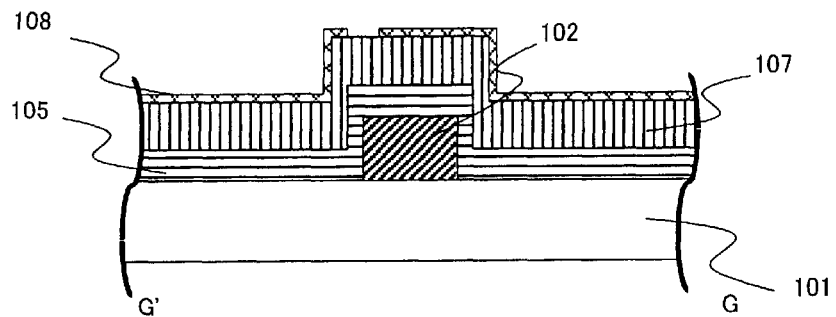

After the process shown in FIG. 33(c), the ITO film 108 is deposited on the entire surface of the transparent insulating substrate 101 in the storage capacitor 18 and unneeded portions of the ITO film 108 are wet-etched, using the fourth mask, to form the pixel electrodes 11 having one ends extending above the gate bus lines 1. This realizes a structure in the storage capacitor 18 in which the first and second passivation films 105, 107 are sandwiched between the gate electrode layer 102 and the ITO film 108 operating as a storage capacitance electrode. So, in the storage capacitor 18 of the present embodiment, in which there exist no a-Si layer nor gate insulating layer, in distinction from the first embodiment shown in FIG. 9(d), the pixel electrodes 11 are made to face the gate electrode layer 102 with a narrows spacing in-between.

If the manufacturing method of the present embodiment is used, the structure of the contact portions A to C, shown in the circuit diagram of FIG. 23, is as shown in FIG. 34. The protective bus lines 23, formed in parallel with the gate bus lines 1, are deposited on the transparent insulating substrate 101 simultaneously with and as the same layer as the gate bus lines 1, that is simultaneously with and as the same layer as the gate electrode layer 102, such that the protective bus lines 23 formed parallel to the drain bus lines 4 are formed simultaneously as and in the same layer as the drain bus lines 4, that is as the drain electrode layer 106. These protective bus lines 23 are connected in common at a circuit contact point A and connected to protective bus lines 23. Since these protective bus lines 23 are formed in respective different layers, there is provided a configuration for interconnecting the protective bus lines 23. The protective bus line 23, formed parallel to the gate bus lines 1, is covered by the first and second passivation films 105. 107 except the openings, whilst the protective bus line 23, formed parallel to the drain bus lines 4, is covered by the second pass i vat ion film 107, except the openings. These protective bus lines 23 are interconnected via these openings by the ITO film 108 deposited on the second passivation film 107. For the circuit contacts B and C, there is employed an interconnecting structure by the ITO film 108. That is, such a configuration is used at wiring nodes B and C. Thus the connection portions in the active matrix substrate used for interconnecting the wiring of the same layer as the gate electrode layer 102 and the wiring of the same layer as the drain electrode layer 106 is made via the ITO film 108 as is shown in FIG. 34.

Thus, with the present embodiment of the active matrix substrate, as in the previous embodiments, there may be provided such an active matrix substrate in which the gate electrode 2, drain electrode 9 and the pixel electrodes 11 are separated from one another by insulating films and in which the surface and the sidewall sections of the a-Si layer 104 of the layered product are covered by the first and second passivation films 105, 107. So, the ITO film 108 may be prevented from contacting the lateral surface of the conventional a-Si layer to improve long-term reliability of the thin-film transistor and the active matrix substrate into which is built this thin-film transistor.

Moreover, in the present embodiment, the gate electrode layer 102 operating as the gate bus lines 1 is covered by the first and second passivation films 105, 107, whilst there is provided no a-Si layer nor the gate insulating film, which are provided in the first to the fourth embodiments. So, the storage capacitance of the storage capacitor 18 may be increased by formation on the second passivation film 107 with an extension over the gate bus lines 1.

In addition, with the present embodiment of the manufacturing method for the active matrix substrate, as in the first embodiment, such a channel protection type active matrix substrate may be provided in which the gate electrode 2, drain electrode 9 and the pixel electrodes 11 are separated from layer to layer by insulating films, by merely four masks, and in which the surface and the sidewall sections of the a-Si layer 104 of the layered product are covered by the first and second passivation films 105, 107. In this manner, the process may be simplified by at least one PR in the present manufacturing method as compared to the conventional manufacturing method. That is, the same number of masks as that in the first embodiment suffices by having the stepped photoresist film 111 realized by the first mask.

In addition, in the present embodiment, the ITO film 108 may be realized by the same process not only on the drain terminals 15 but also on the gate terminals 14. So, different wiring layers may be connected by the ITO film 108, as shown in FIG. 34. This simultaneously achieves connection of the protective element 22 to the respective gate terminals 14 and respective drain terminals 15.

Embodiment 6

Referring to FIGS. 35 to 40, the active matrix substrate according to the sixth embodiment of the present invention and the manufacturing method therefor are explained. FIGS. 35 to 38 are schematic top plan views for illustrating the manufacturing process for the active matrix substrate according to the sixth embodiment of the present invention and particularly showing a sole pixel. FIG. 39 is a schematic cross-sectional view for illustrating the manufacturing process for the active matrix substrate according to the sixth embodiment of the present invention and particularly showing the cross-section along line I–I' of FIGS. 35 to 38. FIG. 40 is a schematic cross-sectional view for illustrating the manufacturing process for the storage capacitor according to the sixth embodiment of the present invention, taken along line J–J' of FIG. 35.

The present embodiment differs from the previous fifth embodiment in that, in the present embodiment, metal which later becomes the capacitance electrode layer 110 is layered via the first passivation film 105 at a pre-set location on the gate bus lines as in the above-described third embodiment to increase the capacitance of the storage capacitor 18. In other respects, the present embodiment is similar to the above-described fifth embodiment.

Referring to FIGS. 35 to 40, the manufacturing method for the active matrix substrate of the TN system is explained.

First, a gate electrode layer 102, comprised of underlying metals such as Cr, Ti or Mo, and Al, layered together, a gate insulating film 103 of e.g., SiNx and an a-Si layer 104 which later becomes a semiconductor layer, are sequentially deposited on the transparent insulating substrate 101, such as of glass.

Then, as in the manufacturing process shown in FIGS. 28 and 29 pertaining to the fifth embodiment, the gate bus lines 1 and the gate electrode 2, branched from the gate bus lines 1, are realized, using the first mask. It is noted that both the a-Si layer 104 and the gate insulating film 103 are removed from the gate electrode layer 102 operating as the gate bus lines 1. whereas the a-Si layer 104 and the gate insulating film 103 are left on the gate electrode layer 102 operating as the gate electrode 2 so that the layered structure is here realized.

Figure 39A:
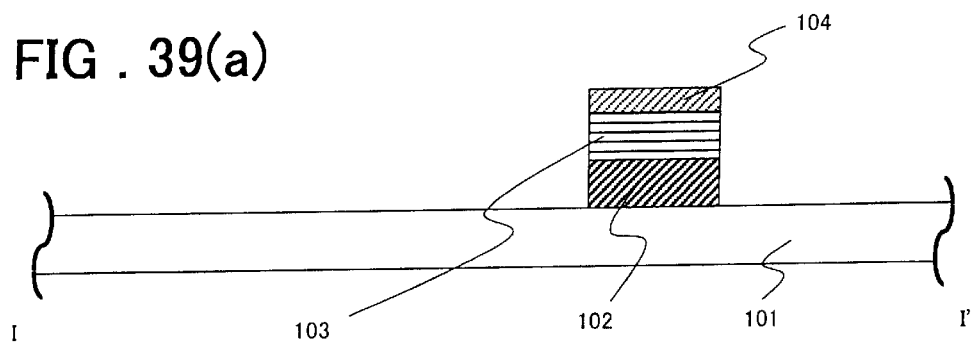
Figure 39B:
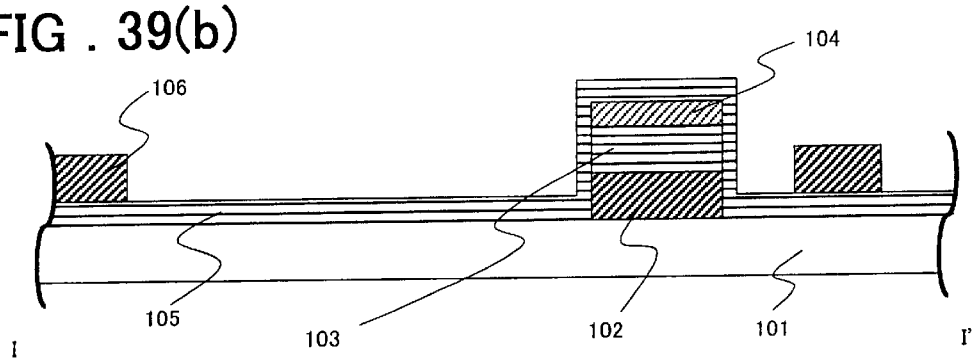

Then, on the entire surface of the transparent insulating substrate 101, the first passivation film 105 of e.g., SiNx, and a layered film of underlying metal, such as Ti, Cr or Mo, and Al, which later becomes the drain electrode layer 106, are deposited sequentially. Then, using a second mask, the drain electrode layer 106, operating as the drain bus lines 4, is deposited, as shown in FIGS. 36 and 39(b). In the present embodiment, as in the third embodiment the capacitance electrode layer 110 is deposited above the gate bus line 1 located between the neighboring drain bus lines 4 when the drain electrode layer 106 is deposited. This capacitance electrode layer 110 operates as the storage capacitance electrode of the storage capacitor 18 realized between it and the gate electrode layer 102. This capacitance electrode layer 110 is effective to improve the capacity.

Figure 39C:
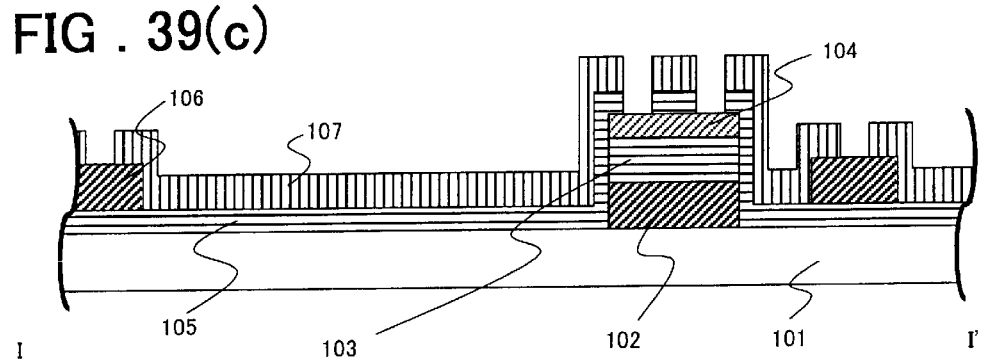

The second passivation film 107, such as of SiO2, then is deposited on the entire surface of the transparent insulating substrate 101 and, using a third mask, the source opening 7 and the drain opening 6 in the upper part of the a-Si layer 104, the contact hole 5 in the upper part of the a-Si layer 104, and the opening for storage capacitance 12 in the upper portion of the capacitance electrode layer 110, are realized, as shown in FIGS. 37 and 39(c). For producing an ohmic connection to the a-Si layer 104, phosphorus is diffused into the a-Si layer 104 in the $PH_3$ plasma atmosphere to produce a $n^+$ layer on the surface of the a-Si layer 104.

Figure 39D:
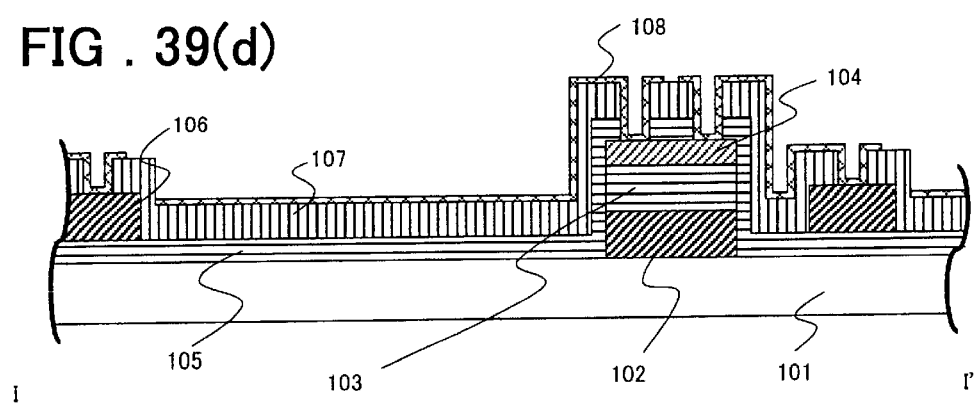
Figure 40A:
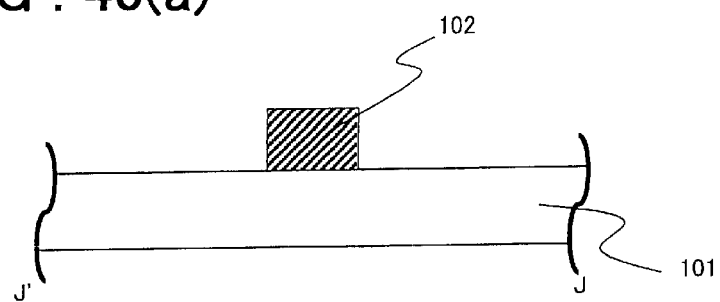
Figure 40B:
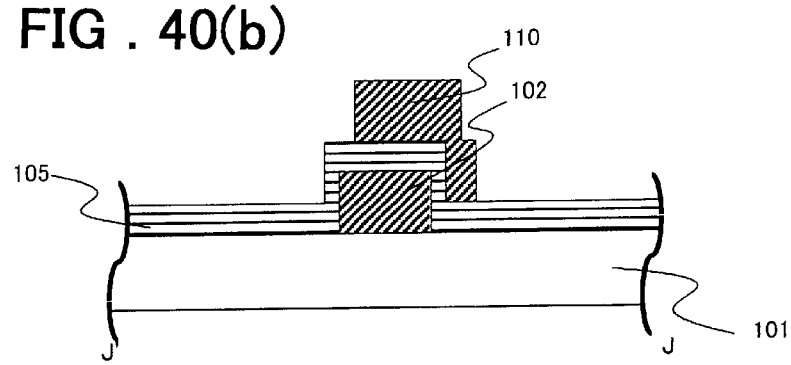
Figure 40C:
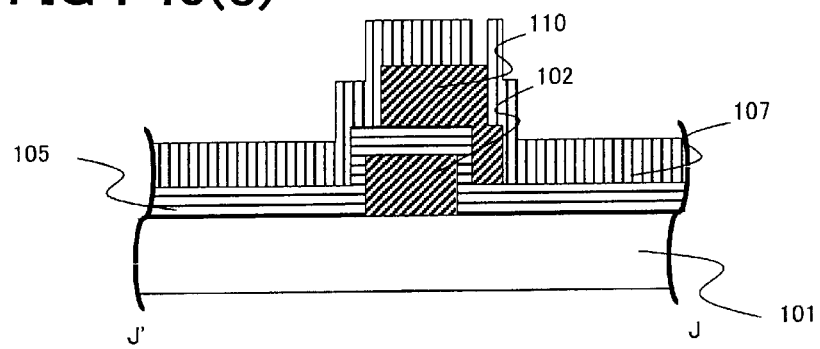
Figure 40D:
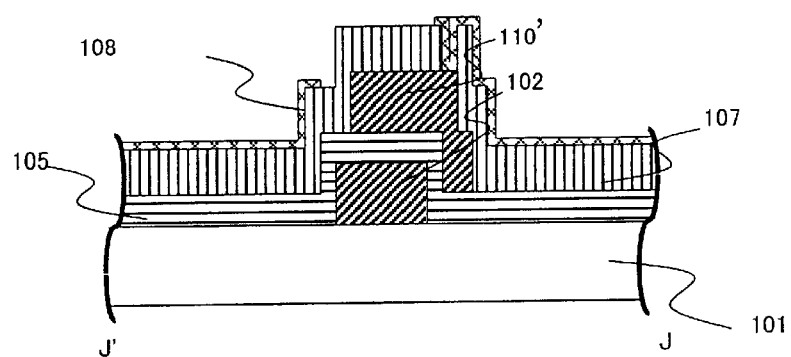

The ITO film 108, which serves as the pixel electrodes 11, is deposited on the entire surface of the transparent insulating substrate 101 and, using a fourth mask, the source electrode 10, pixel electrodes 11, drain electrode 9 and the drain bus lines 4 are interconnected, at the same time as the capacitance electrode layer 110 and the pixel electrodes 11 are interconnected through the opening for storage capacitance 12, as shown in FIGS. 38 and 39(d). This realizes the active matrix substrate configured as shown in FIG. 39(d).

The storage capacitor 18, prepared by the method of the present embodiment, is of a structure shown in FIG. 40. First, the a-Si layer 104 and the gate insulating film 103 on the gate electrode layer 102 operating as the gate bus lines 1 are removed in the process of forming the gate bus lines 1 and the gate electrode 2 of FIG. 39(a). The first passivation film 105 then is deposited on the gate electrode layer 102 and, in the process of forming the drain electrode layer 106 of FIG. 39(b), the capacitance electrode layer 110 is left in an area of the storage capacitor 18. In this manner, such a structure is achieved in which only the first passivation film 105 is sandwiched between the gate electrode layer 102 and the capacitance electrode layer 110, without the interposition of the a-Si layer 104, gate insulating film 103 or the second passivation film 107, with a result that the distance between opposing electrodes can be shorter than in the fifth embodiment, with the storage capacitance being larger than that of the above-described fifth embodiment. In the present embodiment, the stored capacity may be still larger than that of the first embodiment.

Thus, with the present embodiment of the manufacturing method for the active matrix substrate, as in the previous embodiments, the gate electrode layer 102, drain electrode layer 106 and the pixel electrodes 11 are separated, from layer to layer, by only four masks, thus realizing a channel protection type active matrix substrate having the ITO film 108 as the topmost layer, thus simplifying the manufacturing process at least by one PR as compared to the conventional process. Moreover, since the capacitance electrode layer 110 is formed simultaneously in the production process of the drain electrode layer 106, whilst the opening for storage capacitance 12 interconnecting the capacitance electrode layer 110 and the pixel electrodes 11 is formed simultaneously in the same production step as the source opening 7 and the drain opening 6, the storage capacitance in the storage capacitor 18 can be larger than that in the fifth embodiment merely by changing the mask pattern without increasing the number of masks.

Moreover, in the present embodiment, as in the fifth embodiment, the ITO film 108 can be formed by the same step not only in the drain terminals 15 but also in the gate terminals 14. That is, the gate terminals 14 can be realized as in the manufacturing process shown in FIG. 31, whilst the drain terminals 15 can be realized as in the manufacturing process shown in FIG. 32. This enables interconnection of different wiring layers to the ITO film 108 and hence the interconnection of the protective element 22 to the respective gate terminals 14 and drain terminals 15.

It is also possible to increase the film thickness of the first or second passivation film, to provide an organic inter-layer film, to change the film forming conditions of $SiO_2$ or to use a layered structure of plural films of different film qualities.

Embodiment 7

Referring to FIGS. 41 to 55, an active matrix substrate according to a seventh embodiment of the present invention and a manufacturing method therefor, are hereinafter explained. FIGS. 41 to 46 are top plan views schematically showing the manufacturing process for the active matrix substrate according to the seventh embodiment of the present invention and particularly showing a sole pixel. FIGS. 47 and 48 are cross-sectional views for illustrating the manufacturing process of the active matrix substrate according to the seventh embodiment of the present invention and specifically showing the cross-section taken along line K–K' in FIGS. 41 to 46. FIGS. 49 and 50 are cross-sectional views schematically showing the manufacturing process for the gate terminal unit, whilst FIGS. 51 and 52 are cross-sectional views schematically showing the manufacturing process for the drain terminal unit nd FIGS. 53, 54 are cross-sectional views schematically showing the manufacturing process for the gate storage capacitor unit, taken along line L–L' of FIG. 41. FIG. 55 is a cross-sectional view schematically showing the structure of the gate-drain interconnection of the active matrix substrate according to the seventh embodiment of the present invention.

In the active matrix substrate of the present embodiment, a color filter layer and a black matrix are provided further. In the active matrix substrate of the first to seventh embodiments, the color filter layer for realizing the color liquid crystal display device is provided on an opposite side substrate adapted for holding the liquid crystal with the substrate, despite the difference as to the TN and input signal systems. In the present embodiment, the present invention is applied to an active matrix substrate of the so-called color filter on TFT (COT).

Referring to FIGS. 41 to 48, the manufacturing method for the active matrix substrate of the TN system having the COT stricture is explained. On the transparent insulating substrate 101 e.g., of glass, the gate electrode layer 102, obtained on layering underlying metal, such as Cr, Ti or Mo, and Al, gate insulating film 103 of e.g., SiNx and the a-Si layer 104 which serves as a semiconductor layer, are deposited sequentially.

By the manufacturing process shown in FIGS. 28 and 29, as in the fifth embodiment, the gate bus line 1 and the gate electrode 2 branched from the gate bus lines 1 are formed by the manufacturing process shown in FIGS. 28 and 29, using the first mask, as shown in FIGS. 41 to 47(a). The a-Si layer 104 and the gate insulating film 103 are then removed from the gate electrode layer 102 operating as the gate bus lines 1. The gate insulating film 103 and the a-Si layer 104 are left on the gate electrode layer 102 operating as the gate electrode 2. In this portion, the layered product is realized.

Figure 47A:
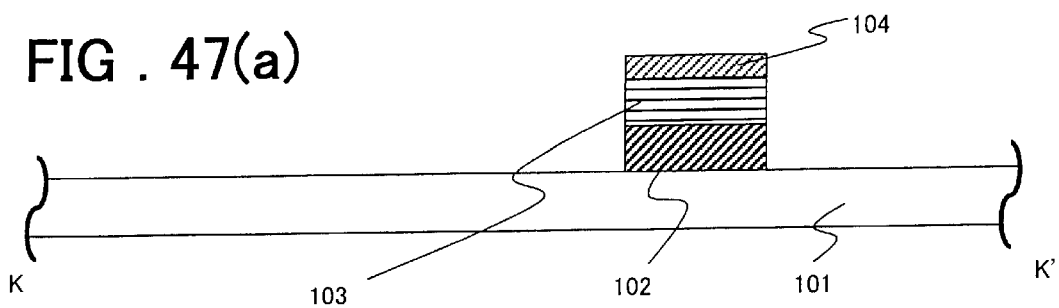
Figure 47B:
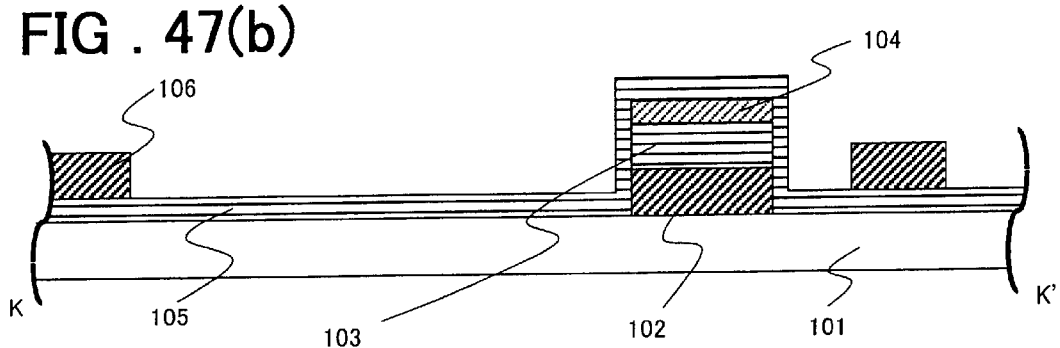
Figure 47C:
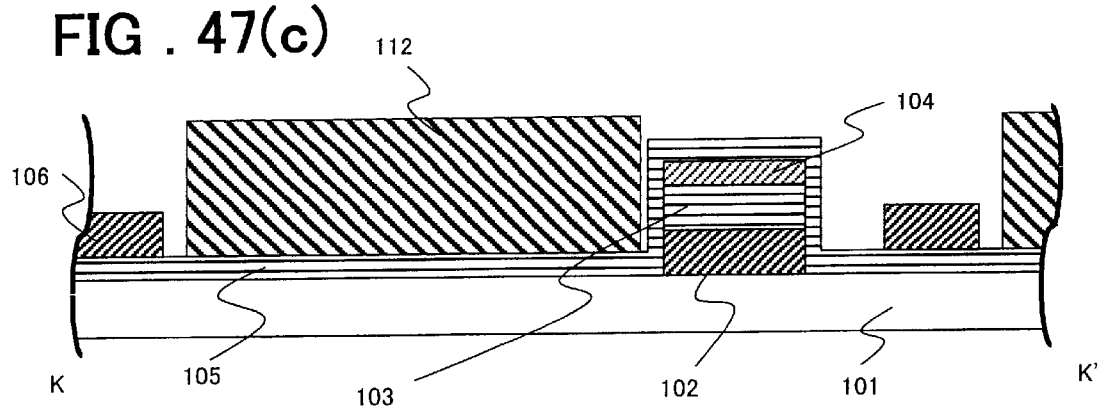
Figure 47D:
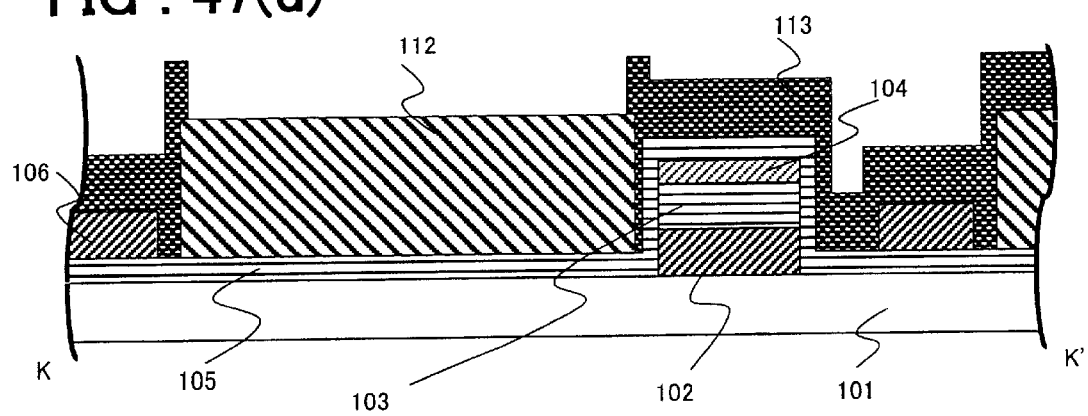

The first passivation film 105 of, for example, SiNx, and a layered film of underlying metal, such as Ti, Cr or Mo, and Al, operating as the drain electrode layer 106, are sequentially deposited on the entire surface of the transparent insulating substrate 101 Then, using the second mask, the drain electrode layer 106 operating as the drain bus lines 4, is formed, as shown in FIGS. 42 and 47(b).

Then, color filter layers 112 are formed in pixel areas surrounded by neighboring gate bus lines 1 and neighboring drain bus lines 4.

A red layer 20R, a green layer 20G and a blue layer 20B are then formed in this order. Subsequently, a black matrix is formed. Four masks are used for forming color layers.

Then, a planarizing film 114 is formed for covering the color layer 112 and the black matrix 113 on the entire surface of the transparent insulating substrate 110. This planarizing film 114, may be formed of an organic material, for example, an acrylic resin, BCB (benzocyclobutene) or polyimide. These organic materials may be deposited to planarize the substrate, as shown in FIG. 48(a).

Then, using a third mask, the source opening 7 and the drain opening 6 in the upper portion of the a-Si layer 104, the contact hole 5 in the upper port ion of the drain bus lines 4 are formed, as shown in FIGS. 45 and 48(a). The source opening 7 and the drain opening 6 are formed for passing through a black matrix 113 and a passivation film 105. The contact hole 5 in the drain bus line 4 is formed through a planarizing film 114 and the passivation film 105. For producing an ohmic connection to the a-Si layer 104, phosphorus is diffused into the a-Si layer 104 in the $PH_3$ plasma atmosphere to produce a $n^+$ layer on the surface of the a-Si layer 104.

The ITO film 108, which serves as the pixel electrodes 11, is deposited on the entire surface of the transparent insulating substrate 101 and, using a fourth mask, the source electrode 10, pixel electrode 11, drain electrode 9 and the drain bus line 4 are interconnected, at the same time as the capacitance electrode layer 110 and the pixel electrodes 11 are interconnected, as shown in FIGS. 46 and 48(d). This realizes the active matrix substrate of the COT structure shown in FIG. 39(b).

If the method of the present embodiment is used for manufacture, the gate terminals 14, drain terminals 15 and the storage capacitor 18 are of a structure as shown in FIGS. 49, 50, 51, 52, 53 and 54. It is noted that FIGS. 49, 51 and 53(a) to (d) show cross-sections in the same process step as those in FIGS. 47(a) to (d), whereas FIGS. 50, 52 and 54(a) to (d) show cross-sections in the same process step as those in FIGS. 48(a) and (b)

In the gate terminals 14, the planarizing film 114 and the first passivation film 105 are etched at the step shown in FIG. 50(a) to expose the gate electrode layer 102. The ITO film 108 is then deposited, such as by sputtering, on the entire surface of the transparent insulating substrate 101. Using the above-mentioned fourth mask, the ITO film 108, connected to the a-Si layer 104, is left in the gate terminals 14 through its opening. This completes the gate terminals 14 shown in FIG. 50(b).

As for the drain terminals 15, the planarizing film 114 is etched at the step shown in FIG. 52(a) to expose the drain electrode layer 102. The ITO film 108 is then deposited, such as by sputtering, on the entire surface of the transparent insulating substrate 101. Using the above-mentioned fourth mask, the ITO film 108, connected to the a-Si layer 104, is left in the drain terminals 15 through its opening. This completes the drain terminals 15 shown in FIG. 52(b).

The storage capacitor 18 produced by the method of the present embodiment is of a structure shown in FIGS. 53 and 54. First, in the process of producing the gate bus lines 1 and the gate electrode 2 of FIG. 53(a), the a-Si layer 104 and the gate insulating film 103 on the gate electrode layer 102 operating as the gate bus lines 1 are removed. The black matrix 113 is formed in the step of forming the black matrix 113 of FIG. 53d after depositing the first passivation film 105 on the gate electrode layer 102, forming the color layer 112 on the first passivation film 105, and removing the color layer 112 on the gate electrode layer 102. The planarizing film 114 then is formed, as shown in FIG. 54(a) and the pixel electrodes 11 by the ITO film 108 are formed, as shown in FIG. 54(b). Thus, in the storage capacitor 18, the pixel electrodes 11 and the gate bus lines 1 face one another on both sides of the planarizing film 114, black matrix 113 and the first passivation film 105 to constitute a storage capacitance.

Thus, with the manufacturing method for the active matrix substrate of the present embodiment, the gate electrode layer 102, drain electrode layer 106 and the pixel electrodes 11 are separated from layer to layer by merely four masks, as in the previous embodiments, to realize a channel protection type active matrix substrate having the ITO film 108 as the topmost layer to simplify the manufacturing process by at least one PR as compared to the conventional manufacturing method. Moreover, the storage capacitance of the storage capacitor 18 can be larger than that in the fifth embodiment by simply changing the mask pattern without increasing the number of masks.

Moreover, in the present embodiment, as in the fifth embodiment, the ITO film 108 can be formed not only in the drain terminals 15 but also in the gate terminals 14 by the same process. That is, the gate terminals 14 can be realized as in the manufacturing process shown in FIG. 31, as in the fifth embodiment (see FIGS. 49 and 50), whilst the drain terminals 15 can be realized as in the manufacturing process shown in FIG. 32 (see FIGS. 51 and 52). This realizes connection of the different interconnection layers at the ITO film 108, as shown in FIG. 34.

Moreover, the film thickness of the first and second passivation films may be increased, an organic inter-layer film may be formed, the film-forming condition may be changed or the films of different film qua I ties may be layered to effectuate planarization, as in the second embodiment described above.

Embodiment 8

An active matrix substrate according to a seventh embodiment of the present invention, and a manufacturing method therefor, are now explained. The present embodiment differs from the above-described seventh embodiment in that metal as a capacitance electrode layer is deposited through a passivation film at a pre-set location on the gate bus line as in the sixth embodiment to increase the capacitance of the storage capacitor (see FIGS. 36 and 40 for reference sake). In other respects, the present embodiment is similar to the above-described seventh embodiment (see FIGS. 53 and 54 for reference sake).

In the present embodiment, as in the third and sixth embodiments, a capacitance electrode layer is formed simultaneously with the formation of the drain electrode layer operating as the drain bus line (see FIGS. 36 and 40 for reference sake). This capacitance electrode layer operates as a storage capacitance electrode of the storage capacitor realized between it and the gate electrode layer.

Then, the black matrix and the planarizing film then are formed on the substrate in the same manner as in the seventh embodiment (see FIGS. 53 and 54 for reference sake). An opening for storage capacitance 12 is formed when forming the source opening and the drain opening in an upper portion of the a-Si layer and the contact hole in an upper portion of the drain bus line, using the third mask (see FIG. 37 for reference sake).

An ITO film, which later serves as the pixel electrodes, is deposited on the entire substrate surface and, using a fourth mask, the source electrode is connected to the pixel electrode, the drain electrode is connected to the drain bus line and the capacitance electrode layer is connected to the pixel electrode via the opening for storage capacitance. This realizes an active matrix substrate of the present embodiment.

In the storage capacitor prepared in accordance with the present embodiment, the a-Si layer and the gate insulating film on the gate electrode layer operating as the gate bus line are removed in the process of producing the gate bus line and the gate electrode. The capacitance electrode layer is left in an area of the storage capacitor during the process of depositing passivation film on the gate electrode layer to form the drain electrode layer. This realizes a structure in which only the passivation film 105 is sandwiched between the gate electrode layer and the capacitance electrode layer, without interposition of the a-Si layer and the gate insulating film, thus shortening the distance between the opposing pair-electrodes as compared to that in the seventh embodiment to realize a storage capacitance larger than in the seventh embodiment.

According to the present embodiment of the manufacturing method of the active matrix substrate, there may be provided a channel protected type active matrix substrate in which the gate electrode layer, drain electrode layer and the pixel electrodes are separated on the layer basis with merely four masks and in which the ITO film is arranged as the topmost layer, as in the above-described embodiments, thus simplifying the manufacturing method by at least one PR as compared to the conventional manufacturing method. Moreover, since the capacitance electrode layer is formed simultaneously with the drain electrode layer by the same step, and the opening for storage capacitance interconnecting the capacitance electrode layer and the pixel electrodes is formed simultaneously as the source opening 7 and the drain opening by the same step, the storage capacitance in the storage capacitor can be increased as compared with that in the fifth embodiment merely by changing the mask pattern without increasing the number of the masks used.

In the present embodiment, as in the fifth embodiment, an ITO film may be formed not only in the drain terminal 15 but also in the gate terminals by the same step. That is, the gate terminals can be produced by the manufacturing process shown in FIG. 31, whilst the drain terminal can be produced by the manufacturing process shown in FIG. 32, as in the fifth embodiment. This enables different wiring layers to be connected at the ITO film, as shown in FIG. 34, while simultaneously realizing the connection of the protective element to the gate terminals 14 and to the drain terminals 15.

Embodiment 9

Referring to FIGS. 56 to 61, the channel protection type active matrix substrate according to the ninth embodiment of the present invention, and the manufacturing method therefor, are hereinafter explained. FIG. 56 is a circuit diagram of an active matrix substrate for a liquid crystal display device according to a ninth embodiment of the present invention. FIGS. 57 to 60 are top plan views schematically showing the manufacturing process of the active matrix substrate according to the ninth embodiment of the present invention and particularly showing one pixel. FIG. 61 is a schematic process diagram schematically showing the manufacturing process of the active matrix substrate according to the ninth embodiment of the present invention taken along line M–M' of FIGS. 57 to 60.

The present embodiment differs from the above-described fifth embodiment in that the manufacturing method in the present embodiment is applied to a lateral electrical field system active matrix substrate configured for controlling the liquid crystal orientation by the electrical field across the comb-shaped common electrode and the pixel electrode. The manufacturing method of the present embodiment is basically similar to the aforementioned fifth embodiment.

The active matrix substrate of the present embodiment includes, in addition to the configuration similar to that of FIG. 11 showing the circuit diagram for the fourth embodiment, a protective bus line (common bus line) 23 arranged parallel to the gate bus lines 1 and the drain bus lines 4, and a protective element 22 arranged between the protective bus line 23 on one hand and the gate terminals 14 and the drain terminals 15 on the other hand, as shown in the circuit diagram of FIG. 56. The protective element 22 is made up of a pair of transistors, connected in a diode configuration in the forward and reverse directions across the gate terminals 14 and the drain terminals on one hand and the protective bus line 23 on the other hand. The transistors of the protective element 22 are formed simultaneously when producing the transistor 16.of the display area.

Referring to FIGS. 57 to 61, the manufacturing method for the active matrix substrate of the transverse electrical field system is explained. First, a gate electrode layer 102, obtained on layering underlying metals, such as Cr, Ti or Mo, and Al, a gate insulating film 103 of e.g., SiNx and the a-Si layer 104 as a semiconductor layer, are sequentially deposited on the transparent insulating substrate 101 formed e.g., of glass.

In the present embodiment, a photoresist film of a stepped cross-sectional shape is formed, using a first mask. The photoresist film 111 is formed on the a-Si layer 104 so as to have a stepped cross-section, with the upper portion of the gate electrode layer 102 operating as the gate bus lines 1, being thin in thickness, with the upper portion of the gate electrode layer 102, operating as the gate electrode 2, being thicker in thickness, with the gate electrode layer 102 being stepped in cross-section, and with the upper portion of the gate electrode layer 102 operating as the comb-shaped common electrode 13 being thinner in thickness. The photoresist film 111, having the stepped cross-section, can be formed by the half-tone light exposure method, as in the fifth embodiment.

Figure 61A:
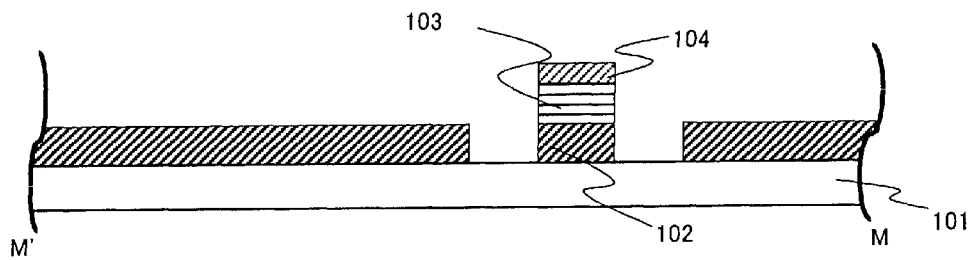

The areas of the gate electrode layer 102, gate insulating film 103 and the a-Si layer 104, not covered with the photoresist film, are removed by dry etching. The transparent insulating substrate 101 is processed with 102 plasma to reduce the film thickness of the photoresist film to remove thin photoresist film overlying the area of the gate electrode layer 102 operating as the gate bus lines 1 and the area of the gate electrode layer 102 operating as the common electrode 13 to expose the a-Si layer 104. Using the remanent photoresist film as a mask, the a-Si layer 104 and the gate insulating film 103 are removed by dry etching to produce the plural gate bus lines 1 and the comb-shaped common electrode 13 arranged between the plural gate bus lines 1. At this time, the gate insulating film 103 and the a-Si layer 104 are left on the gate electrode layer 102 operating as the gate electrode 2. Here, the layered structure is produced. The photoresist film then is removed, as shown in FIGS. 57 and 61(a).

Figure 61B:
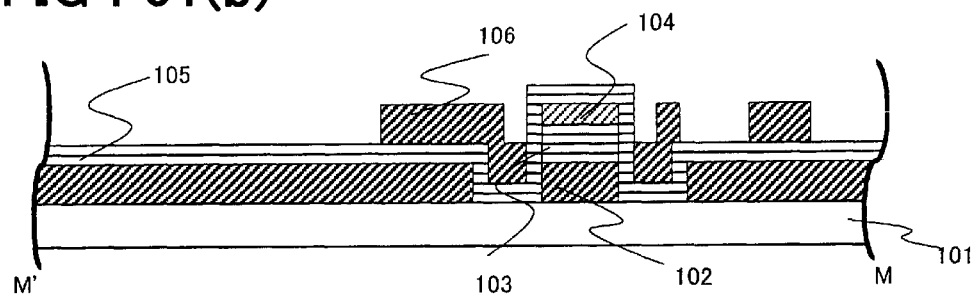

Then, on the entire surface of the transparent insulating substrate 101, the gate bus lines 1, comb-shaped common electrode 13 and the first passivation film 105 of, for example, SiNx, covering the layered structure, are formed by e.g., the plasma CVD method, whilst a layered film of underlying metals, such as Ti, Cr and Mo, and Al, which later servers as the drain electrode layer 106, is formed by e.g., sputtering. Then, as shown in FIGS. 58 and 61(b), the drain bus lines 4 and the pixel electrodes 11 are formed, using the second mask. The drain bus lines 4 are extended in a direction intersecting the gate bus lines 1 and are branched on the first passivation film 105 between the gate bus lines 1 and the common electrode 13 so as to extend to the vicinity of the gate electrode 2. The pixel electrodes 11 are comb-shaped and arranged between the plural drain bus lines 4.

Figure 61C:
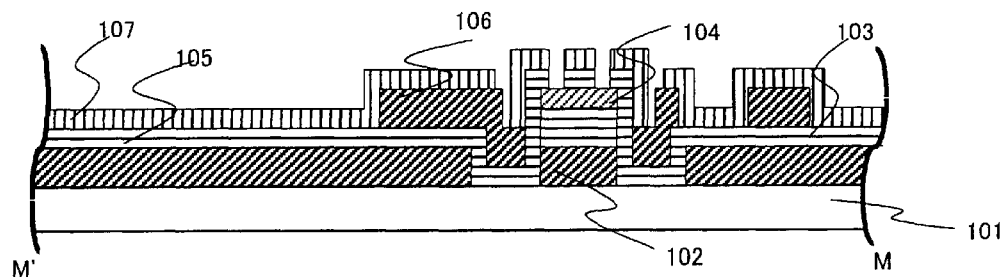
Figure 61D:
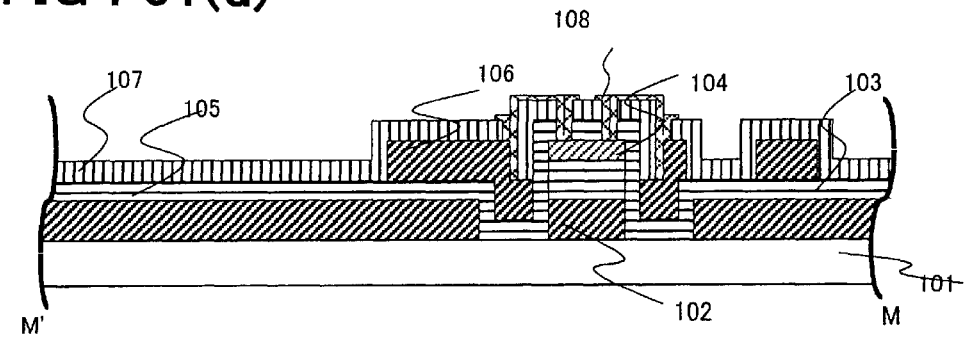
Figure 62A:
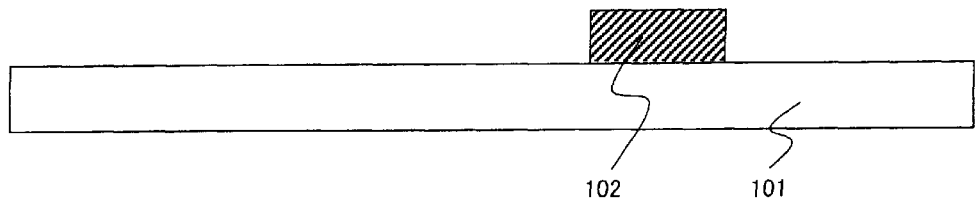
Figure 62B:
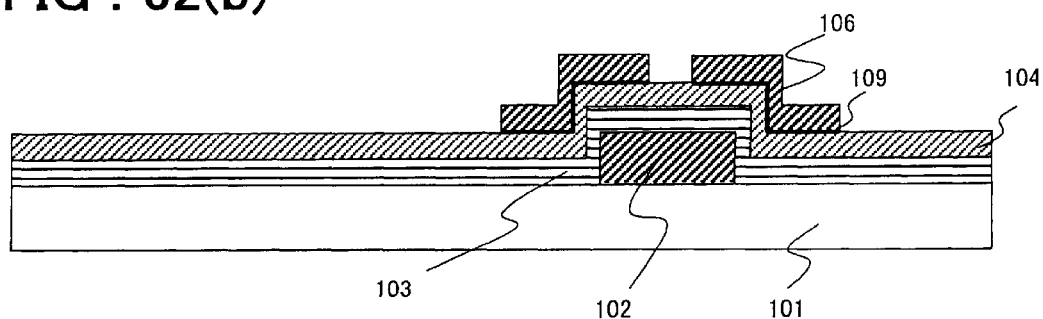
Figure 62C:
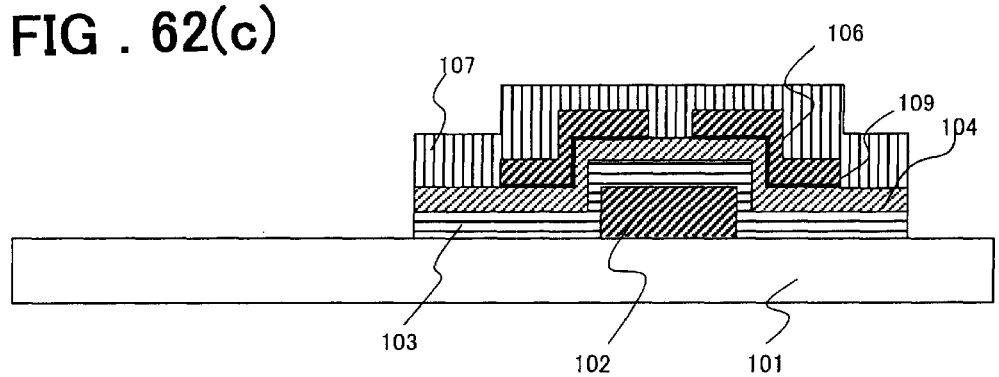
Figure 62D:
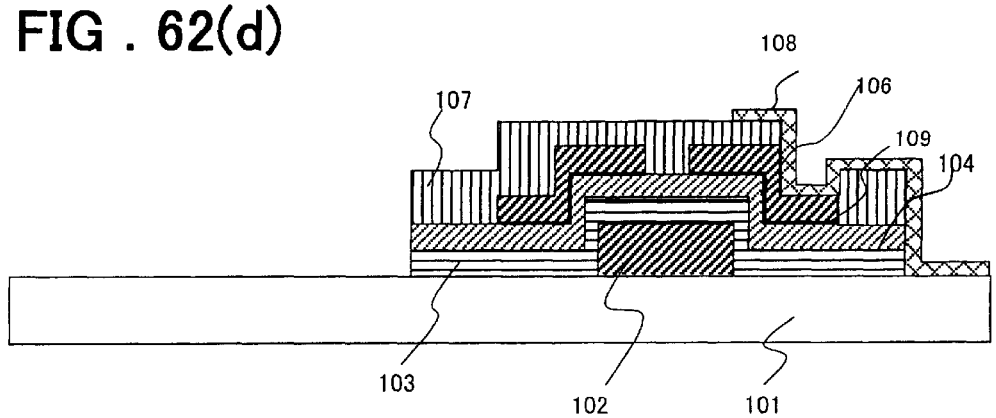

A second passivation film 107 of e.g., SiO$_2$, is formed on the entire substrate surface. Then, using a third mask, the source opening 7 and the drain opening 6 in an upper portion of the a-Si layer 104 and a contact hole 5 in upper portions the drain bus lines 4 and the pixel electrodes 11 are formed, as shown in FIGS 59 and 61(c).

For producing an ohmic connect ion to the a-Si layer 104, phosphorus is diffused into the a-Si layer 104 to produce a n layer on the surface of the a-Si layer 104, as in the previous embodiment. An ITO film 108 is deposited on the entire surface of the transparent insulating substrate 101 and, as shown in FIG. 60, the a-Si layer 104 and the pixel electrodes 11 are interconnected through the source opening 7 and the contact hole 5, using a fourth mask, as shown in FIG. 60, to complete a pre-set wiring connection interconnecting the a-Si layer 104 and the drain bus lines 4 through the d6 and the contact hole 5. This realizes an active matrix substrate of a structure shown in FIG. 61(d).

If the method of the present embodiment is used, the circuit contacts (nodes) A, B and C shown in the circuit diagram of FIG. 56 are of a structure shown in FIG. 34, as explained in connection with the fifth embodiment. The circuit contacts A, B and C are interconnected by the ITO film 108 formed on the second passivation film 107. So, in the present embodiment, the portions of the active matrix substrate interconnecting the wiring of the same layer as the gate electrode layer 102 and the wiring of the same layer as the drain electrode layer 106 are interconnected by the ITO film 108 shown in FIG. 34.

So, in the manufacturing method of the present embodiment, the active matrix substrate used in the liquid crystal display device of the transverse electrical field system can be produced by only four masks, thus simplifying the process by at least one PR (photoresist masking) as compared to the conventional manufacturing method.

Moreover, in the present embodiment, the ITO film 108 can be formed by the same process not only the drain terminals 15 but also the gate terminals 14 as in the fifth and sixth embodiments. That is, the gate terminals 14 can be formed by the manufacturing process shown in FIG. 31, whilst the drain terminals 15 can be formed by the manufacturing process shown in FIG. 32, as in the above-described fifth and sixth embodiments. This enables different wiring layers to be connected at the ITO film, as shown in FIG. 34, while simultaneously realizing the connection of the protective element to the gate terminals 14 and to the drain terminals 15.

In addition, with the active matrix substrate of the present embodiment, the gate bus lines 1 and the common electrode 13 are covered by the first passivation film 105, whilst the a-Si layer 104 and the gate insulating film 103 are removed. So, the first passivation film 105 is improved in planarity in the vicinity of the common electrode 13 as compared to that in the fourth embodiment. The comb-shaped common electrode 13, formed on the first passivation film 105, thus improved in planarity, is improved further in long-term reliability. Since the entire surface of the active matrix substrate can be improved in planarity as compared to that in the fifth embodiment, it is possible to improve controllability of the orientation of the liquid crystal.

It is also possible to improve the film thickness of the first and second passivation films, to change the film-forming condition of $SiO_2$ or to laminate plural films of different film qualities to realize the planarity.

Although the embodiments and preferred embodiments of the present invention have been explained in the foregoing, the present invention is not limited to these embodiments and can be modified without departing its scope. For example, although an ITO film is used as a transparent pixel electrode in the above-described embodiments, ZnO, that is a compound employing SnO in place of Sn in ITO, may also be used.

The meritorious effects of the present invent ion are summarized as follows.

With the active matrix substrate of the present invention, in which the gate electrode, drain electrode and the pixel electrodes are separated from one another. On the other hand, the layer basis by insulating films, and the surface as well as lateral sides of the a-Si layer of the layered structure are covered by the first and second passivation films, as described above, the ITO film may be prevented from contacting the lateral side of the a-Si layer, in a manner different from the conventional system, thus improving the long-term reliability of the thin film transistor and the active matrix substrate in which is built the thin film transistor. Moreover, if the active matrix substrate is realized as a liquid crystal display device, the liquid crystal material can be prevented from contacting the conventional a-Si layer.

With the manufacturing method according to the present invention, as described above, it is possible to prepare a channel protection type active matrix substrate in which the gate electrode, drain electrode and the pixel electrode are isolated from layer to layer by insulating films by solely four masks and in which the a-Si layer is completely covered by a channel protection film, while it is also possible to realize low production cost of the active matrix substrate.

The reason is that the gate electrode layer, gate insulating film and the a-Si layer are formed in succession and etched collectively using the same mask, while the a-Si layer and the gate insulating film are etched using the pixel electrode film as a mask to enable the number of process steps to be decreased as well as to enable the a-Si layer to be covered completely by the first and second passivation films.

In the manufacturing method according to the present invention, an inorganic inter-layer film, such as $SiO_2$, and an organic inter-layer film of, for example, an acrylic resin, are layered together to form a second passivation film to diminish the TFT step difference to render uniform the state of orientation of the liquid crystal sandwiched between the substrates. Moreover, not only the active matrix substrate of the vertical electrical field system but also the active matrix substrate of the transverse electrical field system can be produced in accordance with the manufacturing method according to the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An active matrix substrate comprising:
   (a) a gate electrode layer, a gate insulating layer and an amorphous silicon semiconductor layer deposited in a substantially stacked fashion on a transparent insulating substrate, viewed from a direction normal to said transparent insulating substrate, to form a layered structure including a gate electrode, a gate wiring and a thin-film transistor area;
   (b) a drain wiring formed on a first passivation film disposed on said substrate so as to cover said layered structure;
   (c) a second passivation film formed as a layer overlying said drain wiring and said first passivation film;
   (d) source/drain openings passing through said first passivation film and said second passivation film to reach said amorphous silicon semiconductor layer;
   (e) an opening passing through said second passivation film to reach said drain wiring; and
   (f) a wiring layer formed by a pixel electrode film disposed on said second passivation film, said wiring layer extending through said opening and openings for connection.

2. A vertical electrical field type active matrix substrate comprising:
   (a) a gate electrode layer, a gate insulating layer and an amorphous silicon semiconductor layer deposited in a substantially stacked fashion on a transparent insulating substrate, viewed from a direction normal to said transparent insulating substrate, to form a layered structure, including a gate electrode, a gate wiring and a thin-film transistor area;

(b) a drain wiring disposed on a first passivation film covering said layered structure; and (c) a second passivation film formed as a layer overlying said drain wiring and said first passivation film, (d) source/drain openings passing through said first passivation film and said second passivation film to reach said amorphous silicon semiconductor layer;

(e) an opening passing through said second passivation film to reach said drain wiring;

wherein (f) a wiring layer extending through said drain opening to said drain wiring and a pixel electrode connected to said source opening are formed by a pixel electrode film disposed on said second passivation film;

and wherein (g) said pixel electrode includes a storage capacitance unit comprised of the first and second passivation films sandwiched between the pixel electrode and an electrode layer formed as a co-layer as said gate electrode.

3. A vertical electrical field type active matrix substrate comprising:

(a) a gate electrode layer, a gate insulating layer and an amorphous silicon semiconductor layer deposited in a substantially stacked fashion on a transparent insulating substrate, viewed from a direction normal to said transparent insulating substrate, to form a layered structure, including a gate electrode, a gate wiring and a thin-film transistor area;

(b) a drain wiring formed on a first passivation film disposed on said substrate so as to cover said layered structure;

(c) a second passivation film formed as a layer overlying said drain wiring and said first passivation film;

(d) source/drain openings passing through said first passivation film and said second passivation film to reach said amorphous silicon semiconductor layer; and (e) an opening passing through said second passivation film to reach said drain wiring;

wherein (f) a wiring layer extending through said drain opening to said drain wiring and a pixel electrode connected to said source opening are formed by a pixel electrode film disposed on said second passivation film;

and wherein (g) said pixel electrode includes a storage capacitance unit comprised of the first passivation film sandwiched between said amorphous silicon semiconductor layer connected to said pixel electrode and an electrode layer formed as a co-layer as said gate electrode.

4. The active matrix substrate as defined in claim 1 wherein said second passivation film has a substantially flattened surfaces, and wherein said pixel electrode film is formed on said flattened surface.

5. The active matrix substrate as defined in claim 2 wherein said second passivation film has a substantially flattened surface, and wherein said pixel electrode film is formed on said flattened surface.

6. The active matrix substrate as defined in claim 3 wherein said second passivation film has a substantially flattened surface, and wherein said pixel electrode film is formed on said flattened surface.

7. The active matrix substrate as defined in claim 2 wherein said electrode layer is connected to said pixel electrode film through an opening provided in said first and/or second passivation films.

8. The active matrix substrate as defined in claim 3 wherein said electrode layer is connected to said pixel electrode film through an opening provided in said first and/or second passivation films.

9. The active matrix substrate as defined in claim 1 wherein said second passivation film is formed of a material having a high etching selectivity with respect to said amorphous silicon semiconductor layer and to said gate insulating film.

10. The active matrix substrate as defined in claim 2 wherein said second passivation film is formed of a material having a high etching selectivity with respect to said amorphous silicon semiconductor layer and to said gate insulating film.

11. The active matrix substrate as defined in claim 3 wherein said second passivation film is formed of a material having a high etching selectivity with respect to said amorphous silicon semiconductor layer and to said gate insulating film.

12. The active matrix substrate as defined in claim 9 wherein said second passivation film is one of a silicon oxide film and a layered product of a silicon oxide film and an organic inter-layer film.

13. The active matrix substrate as defined in claim 1 wherein said pixel electrode film comprises a transparent electrode film; and wherein an end of said pixel electrode is extended to above said gate wiring.

14. The active matrix substrate as defined in claim 1 wherein a $n^+$ layer doped with phosphorus is formed on a surface layer of an amorphous silicon semiconductor layer exposed by said opening, and wherein said drain wiring or said pixel electrode is connected via said $n^+$ layer to said amorphous silicon semiconductor layer.

15. The active matrix substrate as defined in claim 2 wherein a $n^+$ layer doped with phosphorus is formed on a surface layer of an amorphous silicon semiconductor layer exposed by said opening, and wherein said drain wiring or said pixel electrode is connected via said $n^+$ layer to said amorphous silicon semiconductor layer.

16. The active matrix substrate as defined in claim 3 wherein a $n^+$ layer doped with phosphorus is formed on a surface layer of an amorphous silicon semiconductor layer exposed by said opening, and wherein said drain wiring or said pixel electrode is connected via said $n^+$ layer to said amorphous silicon semiconductor layer.

17. The method for producing an active matrix substrate as defined in claim 13 wherein in step (a), said gate electrode is formed separate from said gate wiring, said common electrode being comb-shaped;

said pixel electrode being formed to comb shape in said step (b).

18. A liquid crystal display device comprising the active matrix substrate as defined in claim 1.

19. A liquid crystal display device comprising the active matrix substrate as defined in claim 2.

20. A liquid crystal display device comprising the active matrix substrate as defined in claim 3.

* * * * *